US010772249B2

(12) United States Patent
Jacobsson et al.

(10) Patent No.: US 10,772,249 B2
(45) Date of Patent: Sep. 8, 2020

(54) METHOD, SYSTEM AND DEVICE FOR PROVIDING AND CHANGING INFORMATION RELATED TO AN SMT JOB

(71) Applicant: Mycronic AB, Taby (SE)

(72) Inventors: Nils Jacobsson, Taby (SE); Roger Jonasson, Taby (SE)

(73) Assignee: Mycronic AB, Taby (SE)

( * ) Notice: Subject to any disclaimer, the term of this patent is extended or adjusted under 35 U.S.C. 154(b) by 860 days.

(21) Appl. No.: 15/074,056

(22) Filed: Mar. 18, 2016

(65) Prior Publication Data
US 2017/0027091 A1    Jan. 26, 2017

Related U.S. Application Data

(60) Provisional application No. 62/134,871, filed on Mar. 18, 2015.

(51) Int. Cl.
*H05K 13/04*      (2006.01)
*H05K 13/08*      (2006.01)
*H05K 13/02*      (2006.01)

(52) U.S. Cl.
CPC ....... *H05K 13/0417* (2013.01); *H05K 13/021* (2013.01); *H05K 13/086* (2018.08)

(58) Field of Classification Search
CPC ........... H05K 13/0417; H05K 13/0419; H05K 13/021; H05K 13/0204; H05K 13/08; H05K 13/086; Y10T 29/53174
USPC .......................................... 29/729, 701, 739
See application file for complete search history.

(56) References Cited

U.S. PATENT DOCUMENTS

| | | | | |
|---|---|---|---|---|
| 5,494,168 A | * | 2/1996 | Hart | B65D 73/02 206/714 |
| 5,515,600 A | * | 5/1996 | Iwasaki | H05K 13/084 29/740 |
| 5,822,210 A | * | 10/1998 | Kobayashi | H01L 22/20 700/121 |
| 6,631,870 B2 | | 10/2003 | Bergstrom | |
| 6,694,606 B1 | * | 2/2004 | Ohashi | H05K 13/0417 29/740 |
| 6,779,726 B1 | * | 8/2004 | Easton | H05K 13/0084 235/462.01 |
| 6,918,730 B2 | * | 7/2005 | Kawai | H05K 13/0417 414/183 |

(Continued)

FOREIGN PATENT DOCUMENTS

| | | |
|---|---|---|
| EP | 1147697 A1 | 10/2001 |
| EP | 1381265 A1 | 1/2004 |
| WO | WO-03024181 A1 | 3/2003 |

*Primary Examiner* — Peter Dungba Vo
*Assistant Examiner* — Kaying Kue
(74) *Attorney, Agent, or Firm* — Harness, Dickey & Pierce, P.L.C.

(57) ABSTRACT

A method and a system for providing operator information in an Surface Mount Technology (SMT) system comprising an SMT information database, a SMT pick and place machine and an identity tag scanner, the method comprising: receiving a bin in said SMT pick and place machine, wherein said bin is adapted to comprise vertically oriented bin load units, wherein said bin load unit has an pallet identity tag attached to the bin load units upwards facing surface; starting SMT production on said SMT pick and place machine; scanning individual identity tags attached to bin load units comprising component tape reels to obtain bin load units IDs.

18 Claims, 30 Drawing Sheets

(56) References Cited

U.S. PATENT DOCUMENTS

| | | | | |
|---|---|---|---|---|
| 2001/0040117 A1* | 11/2001 | Easton | ............... | H05K 13/0084 |
| | | | | 206/714 |
| 2003/0046808 A1* | 3/2003 | Eskang | .............. | H05K 13/0417 |
| | | | | 29/650 |
| 2003/0219330 A1* | 11/2003 | Lyndaker | ........... | H05K 13/0417 |
| | | | | 414/411 |
| 2013/0314885 A1* | 11/2013 | Ji | ........................... | H05K 3/305 |
| | | | | 361/760 |
| 2018/0130011 A1* | 5/2018 | Jacobsson | ............ | G06Q 10/087 |

* cited by examiner

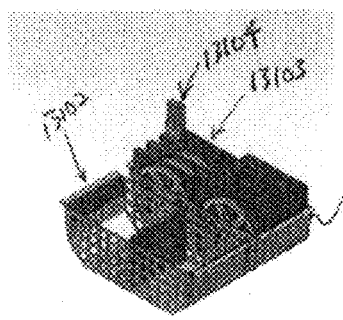
1310
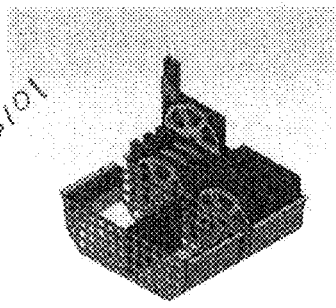
1320
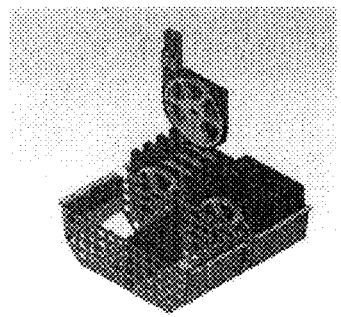
1330
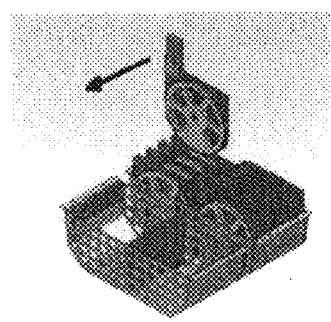
1340
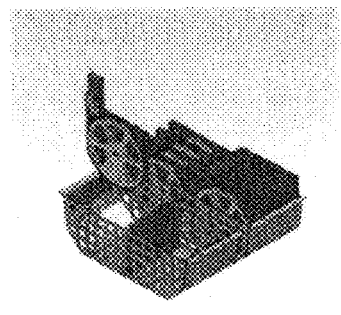
1350
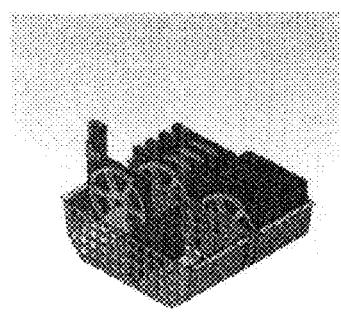
1360
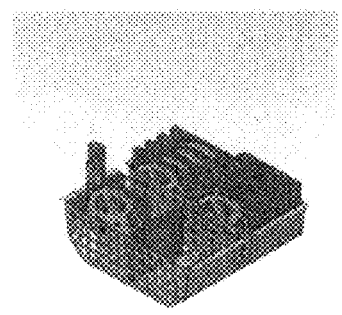
1370
FIG. 13

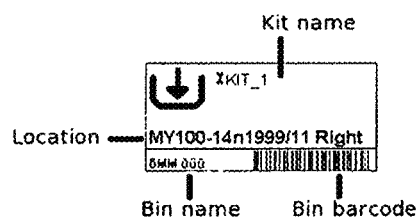
FIG. 26A                     FIG. 26B
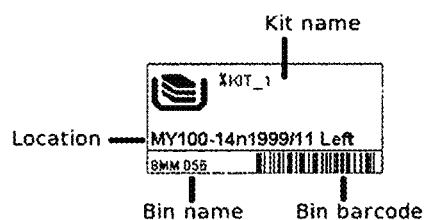
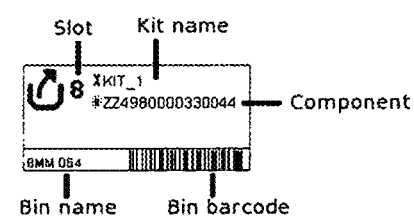
FIG. 26C                     FIG. 26D
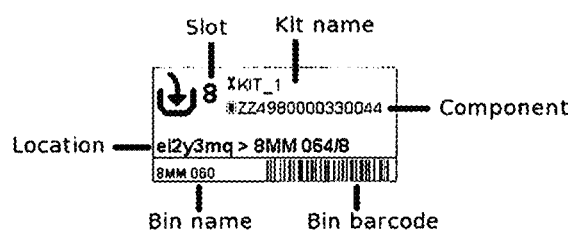
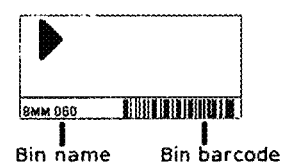
FIG. 26E                     FIG. 26F

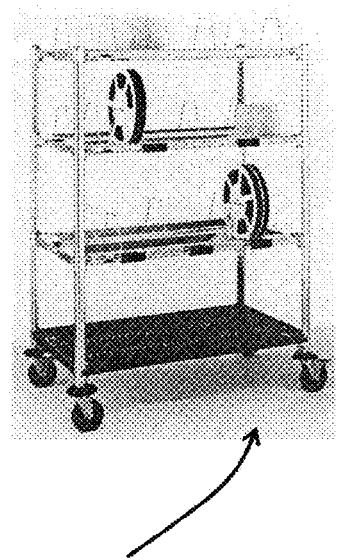
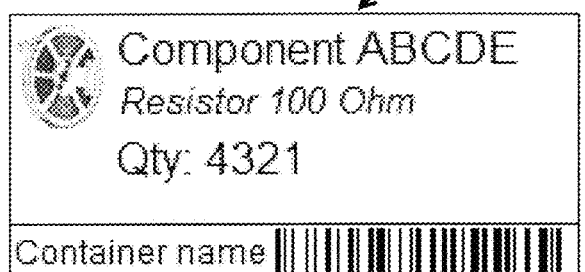
FIG. 27
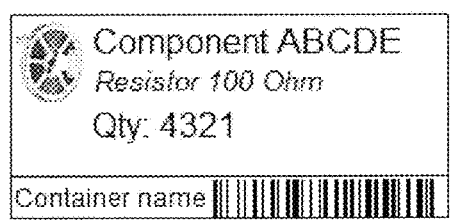
FIG. 28A
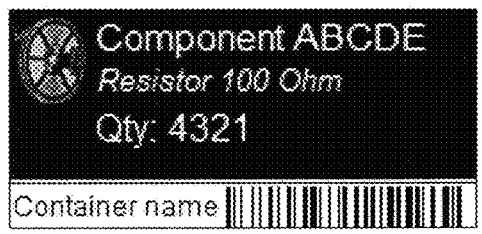
FIG. 28B
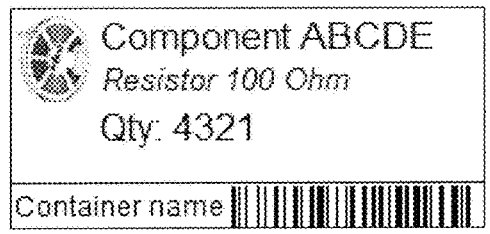
FIG. 28C
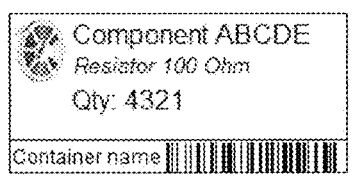
FIG. 28D
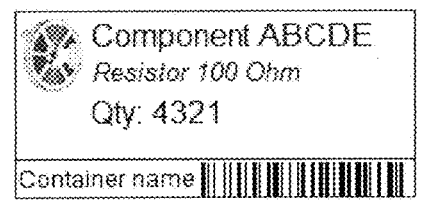
FIG. 28E

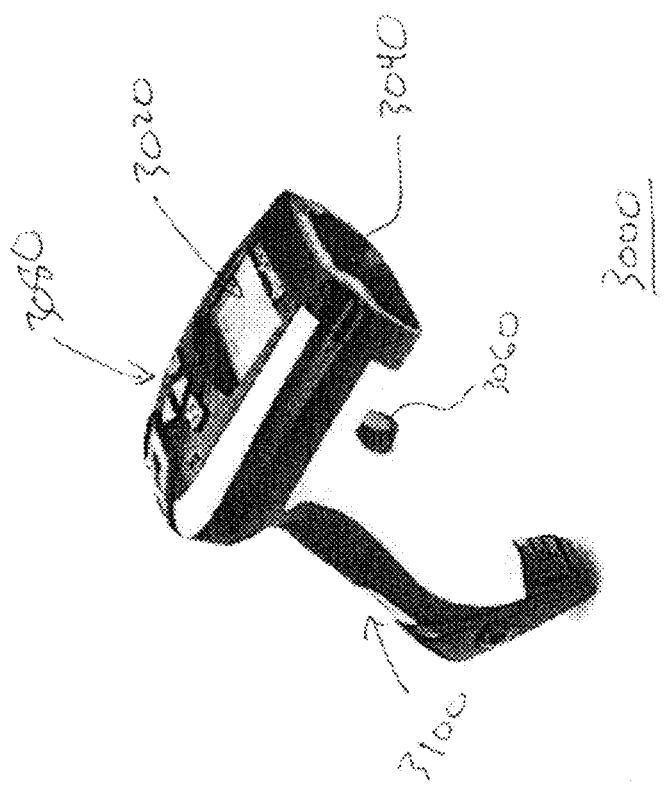

METHOD, SYSTEM AND DEVICE FOR PROVIDING AND CHANGING INFORMATION RELATED TO AN SMT JOB

PRIORITY STATEMENT

This non-provisional U.S. patent application claims priority under 35 U.S.C. § 119(e) to provisional application No. 62/134,871, filed Mar. 18, 2015, the entire contents of which are incorporated herein by reference.

TECHNICAL FIELD

The technology disclosed relates to handling of components in an SMT system and the receiving and providing of information related to a Surface Mount Technology (SMT) job. In particular, the technology disclosed relates to a display (e.g., an alphanumerical display) associated with a carrier for carrying component tapes held by a component tape reel and the sending of instructions related to an SMT job as well as the changing of display data related to an SMT job.

BACKGROUND

Surface Mount Technology is now the preferred method of automated production of electronic printed circuit boards. Machines for pick-and-place mounting of components on a substrate, such as a Printed Circuit Board (PCB), or a substrate for a System in Package (SiP) component are subject to different, often contradictory demands, such as mounting speed, mounting precision, size, prize, etc. The expression "pick and place" is understood by the person skilled in the art as describing the very mounting operation where a mounting head is moved to a component feeder area, where the mounting head picks one or more components from one or more of the component feeders, and then is moved to a mounting area where the mounting head places the component or components on the substrate.

Supplies of a certain type of component (e.g., a certain specified type of capacitor, resistor, diode, IC, etc.) are supplied on trays carrying one type of component or on sticks or, as has become most common today, on tapes in reels with a series of pockets of appropriate depth in the tape, holding one component in each pocket. The reels have varying widths between about 8 mm and about 44 mm. A row of reels, each reel representing a different type of component, are placed in a bin which in turn is placed in a magazine and feed components into the pick-and-place machine as the nozzle arms rapidly pick components out of their pockets and place them on the board. Component manufacturers deliver the components in standard reels of pocket-tape with a thin cover tape closing the pockets. This pocket cover tape must be removed by some method before the component can be picked out of its pocket.

Tape guides or feeders are used to feed the tape into the pick-and-place machine as the components are picked out of the pockets. One such tape guide or feeder is described in EP 1 381 265 B1, incorporated herein by reference. This type of component tape guide or feeder has no built-in tape advancing mechanism. Rather, the tape guide or feeder is mounted for use in the pick-and-place machine so that a feeding mechanism, e.g. a feeding wheel in the pick-and-place machine protrudes through the tape guide or feeder into contact with the pre-threaded tape. Another type of component tape guide has a built-in tape advancing mechanism. The tape guide or feeder is mounted for use in the pick-and-place machine so that an in-feeder built-in feeding mechanism or tape advancing mechanism advances the tape, e.g. a feeding wheel in the feeder into contact with the pre-threaded tape.

Each tape guide or feeder has a specific identity in relation to the pick-and-place machine and in whatever sequential position the reel with its pre-threaded tape guide or feeder is placed in the machine, the mounting machine robotics will properly find and pick-up the proper components from the tape pockets. A method of associating the identity of the tape guide or feeder used to the specifics of the components in the tape threaded into the guide or feeder is described in EP 1 147 697 B1, incorporated herein by reference.

Generally, within the field of manufacture and assembly of circuit boards, electronic components are fed to a component mounting machine for mechanically and/or electrically mounting the components onto a circuit board. These surface mounted components are often delivered spaced apart along the length of a component tape. Generally, two different types of component tapes are used. The first type consists of a lower carrier tape, preferably plastic, provided with component holding compartments, which are enclosed by a separable, thin, plastic upper cover, or cover tape or protective tape.

The second type consists of a cardboard body provided with through holes. The body is provided with separable, thin, plastic, top and bottom cover tapes, thus forming component compartments with the through holes. For ease of description, the term cover tape will hereinafter After having positioned the electronic components in their corresponding compartments, the cover tape is attached to the carrier tape, and the component tape is wound on a component tape holder, which within the art generally consists of a component tape reel. The attachment of the cover tape to the carrier tape can, for instance, be performed by providing either or both of the cover tape and the carrier tape with adhesive areas, or by fusing the cover tape to the carrier tape. Then, the component holder is transferred to a component mounting machine, which feeds a component to a certain predetermined picking position where it can be picked, or collected, by a pick-up head.

According to a method conventionally used within the art, the loading of a component tape in a component mounting machine involves the following steps: Placing the component tape reel into the reel holder of a component mounting machine, or into a tape magazine of a component mounting machine; introducing the free end of the component tape into a feeding mechanism, provided in the machine or in the magazine, such that feeding pins engage corresponding holes provided in the component tape; separating, by hand, the end of the cover tape from the end of the carrier tape for a distance sufficient for the cover tape to be engaged with a cover tape handling device, generally a bobbin onto which the cover tape can be wound; and lowering a locking mechanism over the carrier tape for holding the carrier tape against the feeding mechanism.

Another method that also has been suggested involves, briefly, the steps of loading a component tape of a component tape reel into a tape guide, placing the component tape reel into the reel holder of a component mounting machine or into a magazine, and mounting the tape guide into the machine and/or the magazine.

In both these methods, the magazine or the portion of the component mounting machine into which a component tape to be used in a mounting process is loaded must be idle during the loading process. If a large number of component tapes are to be loaded, the idle time may be significant.

Bins, as an example of a carrier in the technology disclosed, are in conventional systems used to house a row of reels in a magazine as the pick-and-place machine picks components out of the pockets of the pocket-tape. A bin has a predefined number of slots adapted to receive component tape reels. One such bin is shown in WO03024181 A1, incorporated herein by reference.

An object of the technology disclosed is to provide a more efficient and less error-prone method and system for handling changeovers and replenishment work associated with a Surface Mount Technology (SMT) job.

SUMMARY

The technology disclosed relates to improved handling of components in an SMT system. In particular, technology disclosed is to provide a more efficient and less error-prone method, system and device for handling changeovers and replenishment work associated with a Surface Mount Technology (SMT) job.

Certain aspects of the technology disclosed relate to a method, system and device for changing information related to an SMT job on a display.

According to certain aspects of the technology disclosed, the at least one display, which is attached to or associated with a carrier (e.g., a bin) allows operators to receive and/or change information on said display (e.g., the operator may receive just-in-time information about electronic components and material) anywhere on the shop floor (e.g., by means of a wireless communication link). The SMT system may thereby guide the operator through an entire loading, kitting or changeover process by presenting instructions on displays (e.g., electronic labels). As a result, operators can work more efficiently and instantly locate missing components and material (e.g., by sending a signal directly to the display).

In other aspects of the technology disclosed, the display associated with the carrier is further configured to receive instructions from the operator by the action of pushing a pressure-sensitive button (on or associated with the display, e.g., by being logically, wirelessly or electronically connected to the display) and/or scanning a barcode (on or associated with the display, e.g., by being logically, wirelessly or electronically connected to the display). The operator may thereby provide the SMT system (e.g., via a Wireless communication link) with updated information through a loading, kitting or changeover process by sending instructions using the interface of the displays (electronic labels). As a result, operators can work more efficiently and in a less error-prone manner and be guided by the SMT information database (and his own and other operators' actions providing the SMT database and/or a separate IR/WLAN-based system with updated information) through the entire loading, kitting or changeover process by sending instructions to the displays and/or uplink (e.g., via a communication network) to the SMT information database.

Yet another aspect of the technology disclosed is to receive instructions (e.g., triggering further actions associated with an ongoing and/or upcoming SMT job and/or the SMT information database) from an operator regarding an ongoing and/or upcoming SMT jobs. The carrier of the technology disclosed (e.g., a bin or trolley having a plurality of predefined number of slots adapted to receive component tape reels) may then be used as a means for receiving instructions, or input data, from an operator and/or the SMT information database regarding an ongoing and/or upcoming SMT jobs.

Another object of the technology disclosed is to provide improved feedback to an operator and/or the SMT information database regarding an ongoing and/or upcoming SMT jobs. The carrier of the technology disclosed, (e.g., a bin or trolley having a plurality of predefined number of slots adapted to receive component tape reels) may then be used as a means for providing improved feedback to an operator and the SMT information database regarding an ongoing and/or upcoming SMT jobs while the pick and place machine is performing an SMT job and without interrupting production.

The technology disclosed offers a solution, wherein said bins are adapted to each comprise vertically oriented pallets and a display (e.g., facing the operator) and where input data relating to an SMT job is received and display data based on the received input data is presented on said display.

Optional aspects of the technology disclosed include that the tapes may be pre-threaded into the proper tape guides or feeder and that each component tape reel is, or is associated, by coding, suitably bar coding, with its tape guide or feeder, which in the continued processing will be for the pick and place machine the reel with the proper components. Association may be performed between Bin ID, Pallet ID, component tape reel ID and tape guide ID/SMT component feeder ID by storing the IDs in a data structure in an SMT information database.

Other optional aspects of the technology disclosed include that the component tape reel and the pre-threaded tape guide will be coded together in the SMT information database and stored as a bin load unit in an automated SMD storage warehouse, either as a packet unit, comprised in a pallet and/or comprised in a bin or trolley. The bin or trolley may be retrieved from the automated SMD storage warehouse and placed into a magazine of the pick-and-place machine.

In certain other optional aspects of the technology disclosed, a set of pallets is provided, wherein each pallet comprises a component tape reel with and optionally a pre-threaded tape guide, are fitted into a pallet bin and stored in an automated SMD storage warehouse. The pallet bin may be retrieved from the automated SMD storage warehouse and placed into a magazine of the pick-and-place machine. Previously, the correct set of individual tape reels and feeders or pallets comprising tape reels and feeders as a unit, coded together, had to be selected by the operator, who is setting up an SMT job, and inserted into its proper component feeding position in the magazine of the machine. In the case with individual tape reels and feeders, the correct tape guide (of some 20 different guides) had to be selected by the operator, who is setting up an SMT job. In addition, the barcode of the delivered reel and the identity of the tape guide will have to be linked. Then the operator will have to thread in the component tape properly, before inserting the tape guide into its proper component feeding position in the machine. All of these time-consuming and possibly error-prone steps are eliminated by the system and method according to optional aspects of the technology disclosed, whereby pre-fitted bins, or trolleys (e.g., pallet bins comprising a suitable set of pallets comprising components for scheduled SMT jobs) are retrieved from the automated SMD storage warehouse. The pre-threading and associating component tape reel is by coding, suitably bar coding, with its tape guide or association in an SMT information database and placement into pallets is done by trained storage personnel, which may load the entire SMD Tower with up to thousands of reels of component tapes with paired feeders as individual pallets or as a part of a set of pallets in a pallet bin.

In one or more optional aspects of the technology disclosed, a method is proposed for providing operator information in an Surface Mount Technology (SMT) system comprising an SMT information database, a SMT pick and place machine where SMT production has been started and an identity tag scanner, wherein SMT production at least comprises feeding components from a bin load unit to the SMT pick and place machine, the method comprising: receiving a bin in said SMT pick and place machine, wherein said bin or trolley is comprising an display (e.g., an alphanumerical display) and is adapted to comprise vertically oriented bin load units, wherein said bin load unit has an bin load unit identity tag attached to the bin load unit upwards facing surface; and scanning individual identity tags attached to pallets comprising component tape reels to obtain pallet IDs, thereby also changing the information on said display.

In one or more optional aspects of the technology disclosed, a method is proposed for providing operator information in an Surface Mount Technology (SMT) system comprising an SMT information database, a SMT pick and place machine and an identity tag scanner, the method comprising: receiving a bin, or trolley, in said SMT pick and place machine, wherein said bin or trolley is comprising a display (e.g., an alphanumerical display) and is adapted to comprise vertically oriented pallets, wherein said pallet has an pallet identity tag attached to the pallets upwards facing surface; starting SMT production on said SMT pick and place machine; and scanning individual identity tags attached to pallets comprising component tape reels to obtain pallet IDs, thereby also changing the information on said display.

In certain aspects of the technology disclosed, a method is proposed for providing operator information in an Surface Mount Technology (SMT) system comprising an SMT information database and a SMT pick and place machine where SMT production have been started, wherein started SMT production at least comprises feeding components from a bin load unit to the SMT pick and place machine, the method comprising: receiving a bin or trolley in said SMT pick and place machine, wherein said bin or trolley comprises a display (e.g., an alphanumerical display); receiving display data relating to an SMT job via a network (e.g., a communications network); and presenting said display data on said display.

In one or more aspects of the technology disclosed, a method is proposed for providing operator information in a Surface Mount Technology (SMT) system comprising an SMT information database and a SMT pick and place machine, the method comprising: receiving a bin or trolley in said SMT pick and place machine, wherein said bin or trolley comprises a display; starting SMT production on said SMT pick and place machine; receiving input data relating to an SMT job pushed down from a separate system via a network such (e.g., a communications network); and presenting display data on said display based on said received input data.

In one or more aspects of the technology disclosed, said bin or trolley comprises a display for displaying data relating to an SMT job and is further holding a plurality of pallets placed in individual compartments of the bin/trolley, each of the paletts is adapted to hold or carry a component tape reel.

In one or more aspects of the technology disclosed, said bin or trolley comprises an alphanumerical display controller unit and a display for displaying data relating to an SMT job and is further holding a plurality of component tape reels placed in individual compartments of the bin/trolley, wherein said plurality of component tape reel are not attached or contained in a palette.

In one or more aspects of the technology disclosed, said bin or trolley comprises an alphanumerical display controller unit and a display for displaying data relating to an SMT job and is further holding a plurality of component tape reels placed in individual compartments of the bin/trolley, wherein said bin or trolley does not comprise any pallets.

In one or more aspects of the technology disclosed, said display data relates to an SMT job retrieved from said SMT information database.

In one or more aspects of the technology disclosed, said bin has a bin identity tag in the form of a barcode attached to the bins forward facing surface such that the surface is facing an operator.

In one or more aspects of the technology disclosed, said network or communications network is an infrared (IR) network.

In one or more aspects of the technology disclosed, the method further comprises sending said display data information to an IR based system.

In one or more aspects of the technology disclosed, said display data comprises a selection of SMT job ID, predetermined component feeder position in the SMT pick and place machine, component type and remaining number of components on a component tape reel comprised in said bin or trolley.

In one or more aspects of the technology disclosed, a Surface Mount Technology (SMT) system is proposed for providing operator information, the SMT system comprising: an SMT information database; a SMT pick and place machine; and an identity tag scanner. Said system is adapted to receive a bin or trolley in said SMT pick and place machine, wherein said bin or trolley is adapted to comprise vertically oriented pallets, and wherein said pallet has an pallet identity tag attached to the pallets upwards facing surface.

In one or more aspects of the technology disclosed, there is described a bin or trolley in a Surface Mount Technology (SMT) system for providing operator information in a Surface Mount Technology (SMT) system comprising a SMT information database and a SMT pick and place machine, wherein said bin is adapted to be received in a SMT pick and place machine operating in a started SMT production, the bin or trolley comprising a display configured to: receive input data relating to an SMT job pushed down from a separate system via a network (e.g., a communications network); and present display data on said display based on said input data, wherein said display data guides the operator through at least one of a changeover process, a replenishment process or a kitting process.

In one or more aspects of the technology disclosed, there is described a bin or trolley in a Surface Mount Technology (SMT) system for providing operator information in a Surface Mount Technology (SMT) system comprising an SMT information database and a SMT pick and place machine, wherein said bin is adapted to be received in a SMT pick and place machine operating in a started SMT production, the bin or trolley comprising: a display configured to: receive input data related to an SMT job via a communications network; and present display data on said display based on said received input data, wherein said display data on said is sequentially updated based on received input data, and wherein said input data is pushed down from the SMT information database in order to guide the operator through a SMT job related process selected from one of: loading components in preparation for an SMT job to be performed by a pick and place machine, a changeover process, a replenishment process or a kitting process.

In one or more aspects of the technology disclosed, there is described a bin or trolley in a Surface Mount Technology (SMT) system for providing operator information in a Surface Mount Technology (SMT) system comprising an SMT information database and a SMT pick and place machine, wherein said bin is adapted to be received in a SMT pick and place machine operating in a started SMT production, the bin or trolley comprising a display configured to: receive input data related to an SMT job from a network such as e.g. a communications network; and present display data on said display based on said received input data, wherein said display data on said is sequentially updated based on received input data, and wherein said input data is pushed down from a separate communications network (e.g., an infrared network or wireless local area network (WLAN) separate from the network associated with SMT information database) in order to guide the operator through a SMT job related process selected from one of: loading components in preparation for an SMT job to be performed by a pick and place machine, a changeover process, a replenishment process or a kitting process.

The technology disclosed relates to methods, systems and devices for handling of components in an SMT system, and changing and/or providing display data information regarding an SMT job to an SMT system operator, thereby providing reduced probability of inserting non-required components in an SMT pick and place machine and improved preparations of refill of components in a SMT pick and place machine. Further, the technology disclosed relates to methods, systems and devices for changing display data on a display and providing information related to an ongoing or upcoming SMT job from an operator to an SMT information database, thereby providing reduced probability of inserting non-required components in an SMT pick and place machine and improved preparations of refill of components in a SMT pick and place machine during changeovers and replenishment work.

BRIEF DESCRIPTION OF DRAWINGS

These and other aspects of the invention will be described in the following description of the invention, given merely as one non-restricting example, with reference to the attached drawings, of which:

FIG. 13 shows schematically how bin loading units may be redistributed between two or more stored bins in the automated Surface Mount Device (SMD) warehouse (e.g., by being brought to a designated intermediate redistribution area where bin load units might be redistributed).

FIGS. 26A through 26F illustrate various ESL tags according to example embodiments.

FIG. 27 illustrates a component shelf along with an ESL tag arranged thereon.

FIGS. 28A through 28D illustrate examples of four e-labels.

FIG. 30A is a perspective view of a barcode scanner according to an example embodiment.

FIGS. 30B through 30D illustrate example displays output on the display of the barcode reader.

DETAILED DESCRIPTION

Figure 1:
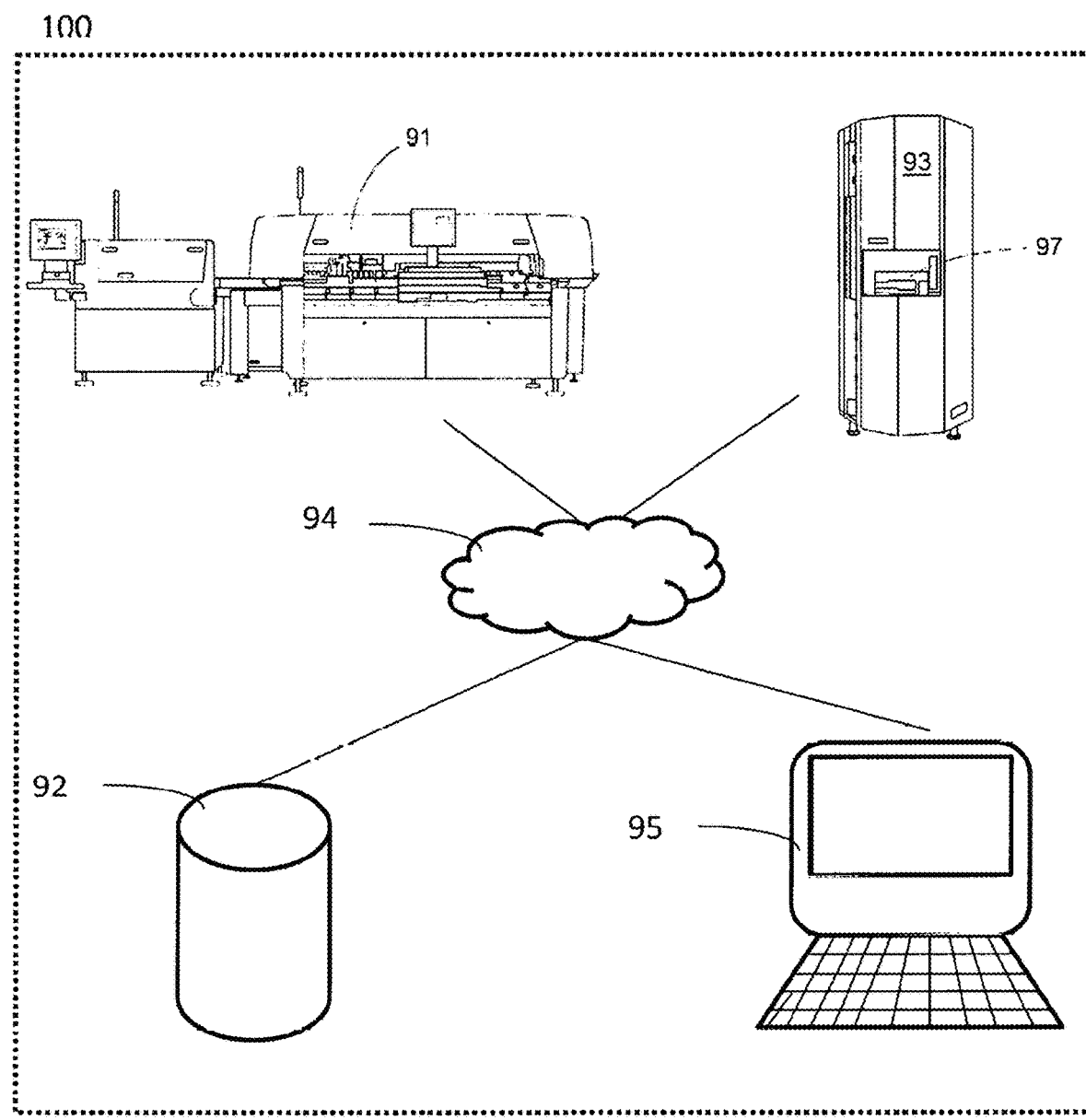
FIG. 1 shows schematically a system for SMT (Surface Mount Technology) semi-automated mounting of electronic components on printed circuit boards.

The invention relates to Surface Mount Technology (SMT) systems and SMT methods in the field of Surface Mount Technology are now the preferred method of automated production of electronic printed circuit boards. Such a system may typically comprise an SMT information database, an SMT pick and place machine, an automated Surface Mount Device (SMD) warehouse and optionally an SMT job planning computing device, wherein all the nodes mentioned above are communicatively coupled (e.g., in a communications network).

SMT pick and place machines for pick-and-place mounting of components on a substrate, such as a Printed Circuit Board (PCB), or a substrate for a System in Package (SiP) component are subject to different, often contradictory demands, such as mounting speed, mounting precision, size, prize, etc. The expression "pick and place" is understood by the person skilled in the art as describing the very mounting operation where a mounting head in said SMT pick and place machine is moved to a component feeder area, where the mounting head picks one or more components from one or more of the component feeders located at predetermined component feeder positions at the pick and place machine, and then is moved to a mounting area where the mounting head places the component or components on the substrate. The total task of placing all required components to a predetermined number of substrates is referred to as producing an SMT job. The SMT job typically comprises SMT job data descriptive of all required components, the position of each component on a substrate required to produce SMT production units, such as electronic printed circuit boards, and the planned relative order the SMT job should be produced in (e.g., third in order to be produced out of five planned SMT jobs).

A typical workflow in a SMT system, as the one described above, is that a planning user plans an SMT job to be executed, stores said SMT job in an SMT information database, an SMT operator (i.e., a human being or alternatively a robot) retrieves required components from said automated Surface Mount Device (SMD) warehouse, transfers required components (e.g., placed on component tape reels) to the pick and place machine and loads predetermined component feeder positions at the pick and place machine (e.g., magazines or trolleys) of said SMT pick and place machine and start SMT production of SMT production units (i.e., substrates with SMT components placed thereupon).

The technology disclosed relates to a method, a system and an arrangement for handling component tapes in connection with mounting components onto circuit boards in a component mounting machine, which utilizes a carrier in form of a bin for carrying component tapes. Each component tape is held by a component tape reel. The component mounting machine utilizes component magazines or a trolley from which components, carried by the component tape, are supplied for use in a mounting process of the component mounting machine. The component tape of each component tape reel is loaded into a tape guide or component feeder for guiding the component tape in the component mounting machine, and the component tape reels are arranged in the bin, which thereafter is placed in the magazine. The tape guides, or component feeders, are then mounted in the magazine such that the component tape loaded therein may interact with feeding devices provided in the magazine. Accordingly, the magazine is loaded with components and prepared for the ensuing mounting process.

To operate the SMT system, the operator is responsible for monitoring the production of the SMT production units, retrieving components from the SMD warehouse and inserting components in positions in the SMT pick and place machine. Today these tasks are performed by manual methods such as printouts. There is a need to provide the operator with dynamic information (e.g., into which position a retrieved component should be inserted in the SMT pick and place machine or which components that are about to run out when the SMT pick and place machine is in production of SMT production units). With improved information obtained by the operator, the risk of erroneous insertion in the SMT pick and place machine can be reduced and the time required to stop the production to replace a component tape reel can be reduced.

According to certain aspects of the inventive concept disclosed, the carriers (in form of a bin or basket for carrying the components held by a component tape reel) are provided with at least one alphanumerical display (e.g., an electronic label) configured to change information that said alphanumerical display is showing in order to provide the operator of the component mounting machine with dynamic information (e.g., into which position a retrieved component should be inserted in the SMT pick and place machine or which components are about to run out when the SMT pick and place machine is in production of SMT production units). With improved obtained by the operator, the risk of erroneous insertion in the SMT pick and place machine can be reduced and the time required to stop the production to replace a component tape reel can be reduced.

Certain aspects of the technology disclosed describes a carrier (e.g., a bin/basket, magazine or trolley) for carrying components held by component tape reels in a Surface Mount Technology (SMT) system and for providing operator information in a Surface Mount Technology (SMT) system including an SMT information database and a SMT pick and place machine, wherein the bin is adapted to be received in a SMT pick and place machine operating in a started SMT production, the bin comprising an alphanumerical display controller unit and an alphanumerical display. The alphanumerical display controller unit is configured to: receive display data relating to an SMT job pushed down from the SMT information database (e.g., via a separate system in form of a communications network); and present said display data on said alphanumerical display. The alphanumerical display controller unit of said alphanumerical display is further configured to receive instructions from an operator (of the SMT pick and place machine) in order to change the display data on said alphanumerical display.

Certain aspects of the technology disclosed describes a bin (e.g., a carrier in form of a basket for carrying components held by component tape reels) in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, the bin comprising a display controller unit and a display (e.g., an alphanumerical display). The display controller unit is configured to: receive display data relating to an SMT job pushed down from the SMT information database (e.g., via a separate system in the form of a communications network); and present said display data on said display. The display controller unit of said display is further configured to receive instructions from an operator (of the SMT pick and place machine) by means of at least one of the action of pushing a pressure-sensitive button provided on said bin (e.g., associated with or on said display) and/or the scanning of a barcode on said bin (e.g., associated with or on said display) in order to change the display data on said display.

Certain aspects of the technology disclosed describes a bin (e.g., a carrier in form of a basket for carrying components held by component tape reels) in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, the bin comprising a display. The display is configured to: receive input data relating to an SMT job pushed down from the SMT information database (e.g., via a communications network); and present display data on said display based on said received input data. Said display is further configured to: receive external instructions (e.g., from an external actuator/robot or the operator operating the SMT pick and place machine) in order to one of provide uplink information to an SMT information database, trigger actions related to an ongoing or upcoming SMT job and/or change the display data on said display. Said alphanumerical display on said bin is provided with a barcode that is configured to be scanned by a barcode scanner to thereby receive light from said barcode scanner, said light received from said barcode scanner providing information to said display to one of provide uplink Information to an SMT information database (e.g., via a separate wireless communication network), trigger actions related to an SMT job and/or change the display data. Said display controller unit is configured to provide uplink information to an SMT information database, trigger actions related to an ongoing or upcoming SMT job and/or change said display data based on the information received from said barcode scanner.

Certain aspects of the technology disclosed describes a bin (e.g., a carrier in form of a basket for carrying components held by component tape reels) in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, the bin comprising a display. The display is configured to: receive input data relating to an SMT job pushed down from the SMT information database via a communications network; and present display data on said display based on said received input data, wherein said display is further configured to receive external instructions (e.g., from an external actuator/robot or the operator operating the SMT pick and place machine) in order to one of provide uplink information to an SMT information database, trigger actions related to an SMT job and/or change the display data on said alphanumerical display. Said bin (e.g., said alphanumerical display on said bin) is provided with at least one pressure-sensitive button that is configured to be pushed by an external actuator/robot or the operator (responsible for the SMT pick and place machine) to thereby receive instructions from the pushing of said at least one pressure-sensitive button. Said display controller unit is configured to provide uplink information to an SMT information database (e.g., via a separate wireless communication network), trigger actions related to an SMT job and/or change said display data based on the received instructions from the pushing of said at least one pressure-sensitive button.

Certain aspects of the technology disclosed describe a carrier (e.g., a trolley, tape magazine, bin or a basket for carrying components held by component tape reels) in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, and the carrier is associated with or comprises a display. The display is configured to: receive input data relating to an SMT job pushed down from the SMT information database, or a separate system and communications network; and present display data on said display based on said received input data. Said carrier or display is further configured with means for receiving instructions from an operator in order to provide the SMT database with updated information.

Certain aspects of the technology disclosed describe a carrier (e.g., a trolley, tape magazine, bin or a basket for carrying components held by component tape reels) in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, and the carrier is associated with or comprises a display. The display is configured to: receive input data relating to an SMT job pushed down from the SMT information database, or a separate system and communications network; and present display data on said display based on said received input data. Said carrier or display is further configured with means for receiving instructions from an operator in order to provide the SMT database with updated information. Said received input data is used to update display data on said display, thereby guiding the operator through a SMT job related process such as a loading process, change over process, replenishment work or kitting process.

The loading of predetermined component feeder positions at the pick and place machine (e.g., by means of connecting magazines or trolleys to said SMT pick and place machine) with individual component tape reels may be time consuming and introduce risks of erroneous loading of the magazines.

The technology disclosed addresses the problem of incorrect material delivery to the SMT pick and place machine and downtime of the SMT pick and place machine during a changeover process and/or a replenishment process when transferring components tape reels loaded into bins from the kitting area and/or the automated Surface Mount Device (SMD) warehouse to the SMT pick and place machine as well as reducing the time when returning component tape reels loaded into bins from the SMT pick and place machine to the automated Surface Mount Device (SMD) warehouse. A further advantage of the technology disclosed is to reduce the risk of erroneous loading of the SMT pick and place machine as a preconfigured bin comprising components tape reels, adapted to the upcoming SMT job, is placed in the SMT pick and place machine.

Definitions or Clarifications

Surface-mount technology (SMT) is in this document to be understood as technology for assembling and mounting SMT production units, for example, by placing SMT components on a substrate, such as a Printed Circuit Board (PCB), a substrate for a System in Package (SiP), etc.

SMT production is in this document to be understood as producing or assembling SMT production units, for example, by placing SMT components contained in bin load units on a substrate, wherein SMT production involves at least feeding components from bin load units, such as component tape reels, to an SMT pick and place machine.

SMT system in this document may typically comprise an SMT information database, an SMT pick and place machine, an automated Surface Mount Device (SMD) warehouse and optionally an SMT job planning computing device (e.g., in FIG. 1), wherein the nodes mentioned above are communicatively coupled (e.g., in a wired or wireless communications network).

Communications network may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX), optical communication, infrared communication and ultrasonic communication, etc., but is not limited thereto.

SMT components or surface-mount devices (SMD) is in this document to be understood as units to be placed on a substrate by the SMT system, in particular components adapted to be assembled or mounted by a SMT system. This may comprise electronic components or any other component used by the SMT system to produce an SMT production unit. The SMT components are usually delivered to a SMT pick and place machine in either paper/plastic/metallic pocket-tape, with a thin cover tape closing the pockets, wound on reels, in plastic tubes or in static-free trays whereby the SMT pick and place machine places the SMT components on said substrate to produce an SMT production unit. Non-limiting examples of SMT components are capacitors, resistors, diodes or integrated circuits (IC).

SMT component placement systems or SMT pick-and-place machines are in this document to be understood as robotic machines, which are used to place SMT components onto a substrate. The SMT components, carried by tapes wound up on component tape reels, are placed in predetermined component feeding positions (e.g., magazines) in the pick and place machine. Pick and place machines are used for high speed, high precision placing of broad range of SMT components.

SMT component feeder or tape guide is in this document to be understood as a device that is configured to feed or advance the component tape in the form of a pocket tape from the component tape reel, and remove a thin cover tape closing the pockets. The feeder might utilize internal or external drive to feed the pocket tape. The pick and place machine actuators (e.g., robotic arms) adapted with nozzles rapidly pick components out of their pockets in the pocket tape and place them on the substrate. Information such as substrate positions and types of SMT components, previous to initiation of the assembly and mounting by the pick and place machine, is generated, planned or determined by a planning user on a SMT job planning computing device, together with the number of SMT production units to be produced, and stored as information in a SMT information database in the form of an SMT job. Multiple SMT jobs might be planned and ordered in a SMT job list, also referred to as upcoming SMT jobs, stored in said SMT information database.

SMT feeder or tape and reel feed mechanism is in this document to be understood as an arrangement through which the component tape is threaded. The SMT component feeder is attached to or mounted on the pick and place machine and is adapted to feed or advance the pocket tape from the component tape reel and to remove a thin cover tape closing the pockets. The SMT component feeder may have a tape advancing mechanism or utilize a tape advancing mechanism of the pick and place machine or the magazine (e.g., a feeding wheel or a protrusion utilizing an internal or external drive such as a linear motor) in the pick-and-place machine or magazine protrudes through the tape guide into contact with the pre-threaded tape. The SMT feeder might be adapted to comprise an SMT feeder ID that might be stored and associated to other identities in said SMT information database (e.g., associated to a component tape reel ID). The technology disclosed in this document also enables that the SMT feeder may be adapted to comprise an SMT feeder ID that might be stored and associated with identities of other types of units such as bin IDs or pallet IDs of said SMT system, and where the bin IDs or pallet IDs may also be stored as IDs in an SMT information database.

SMT job planning computing device is in this document to be understood as a computing device comprising a processor, a memory, a user input/output interface and a communication interface adapted to receive user input as data, present data to said user, store data to memory, retrieve data from memory and send data to an external unit (e.g., the SMT information database). The SMT job planning computing device may be configured and used to plan and optimize one or a plurality of upcoming SMT jobs (e.g., the order of upcoming SMT jobs), the order of loading of SMT feeders into the pick and place machine, etc.

SMT information database is in this document to be understood as a node adapted to receive information data via an external communication interface, such as a communication network, to store said data in memory, to receive a request for information, to retrieve data from memory based on said request and to send data via said external communication interface to a requesting node. Examples of information stored in the database may be SMT component location on a substrate, the type of SMT component, the number of produced substrates with placed SMT components, SMT job ID, identities of component tape reels, pallets and bins and association information (e.g., linking a component tape reel ID to a feeder ID, a component tape reel ID to a pallet ID, a component tape reel ID to a bin ID, etc.). The SMT information database might, in an aspect of the technology disclosed be implemented, as a relational database, a dBASE database, an object oriented database, NewSQL database or NoSQL database such as an XML database, etc.

Automated surface mount device (SMD) warehouse is in this document to be understood as an automatic robotic storage unit comprising a user input/output device, an external communication interface, a processor, and an actuator. The input/output device is adapted to receive user indications as user indication data and to send the user indication data to a processor. The input/output device is further adapted to receive user indication data from a processor and present the data to a user (e.g., by the use of indication means such as light emitting diodes or displays). The external communication interface is adapted to receive data as a signal from a processor and to send said data as a signal to external units, such as the SMT information database. The external communication interface is further adapted to receive data as a signal from external units, such as the SMT information database, and to send said data to said processor. The memory is adapted to receive data as a signal from a processor and to store said data. The memory is further adapted to retrieve data and to send said data as a signal to said processor. The processor is adapted to receive input data, wherein said input data may be received from an operator or retrieved as information from the SMT information database, and to control the actuator.

In the technology disclosed, the actuator (e.g., a mechanical hand or robot arm) is adapted to be controlled by the processor to receive a bin at an input port of said automated Surface Mount Device (SMD) warehouse, to store said bin at a position within said automated Surface Mount Device (SMD) warehouse and to store said position and alternatively a bin ID, a pallet ID, a component tape reel ID or an SMT feeder ID in memory. The processor is further adapted to control the actuator to retrieve a bin at a position within said automated Surface Mount Device (SMD) warehouse, based on said input data and a position within said automated Surface Mount Device (SMD) warehouse retrieved from memory, and to present said retrieved bin at an output port of said automated Surface Mount Device (SMD) warehouse. An embodiment of the automated SMD warehouse will be discussed in more detail later with regard to FIG. 2.

In the technology disclosed, the automated Surface Mount Device (SMD) warehouse or storage unit may further be configured to automatically redistribute bin loading units within a bin or between two or more stored bins, for example, for replenishment purposes when the automated Surface Mount Device (SMD) warehouse concurrently is occupied with storing or retrieving bins or for optimization of upcoming SMT jobs or storage space in the Surface Mount Device (SMD) warehouse during idle periods when the automated Surface Mount Device (SMD) warehouse is not occupied with storing or retrieving bins. The automatic redistribution may be performed according to certain conditions applied to input data received from an operator or retrieved from said SMT information database, such as component requirements of upcoming SMT jobs. The automatic redistribution may also be performed based on frequency of component use or maximum storage capacity. As an example, a bin or multiple bins might be loaded with component tape reels required for producing the next SMT job.

In the technology disclosed, a plurality of automated Surface Mount Device (SMD) warehouses may be configured to form an integrated automated Surface Mount Device (SMD) warehouse cluster, wherein bin load units may be redistributed between a first and a second automated Surface Mount Device (SMD) warehouse via a first opening in the first automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be passed from said first Surface Mount Device (SMD) warehouse and said second Surface Mount Device (SMD) warehouse.

In the technology disclosed, the automated Surface Mount Device (SMD) warehouse or storage unit may be further configured to store bins with a small physical volume adapted to hold two bin load units as described in more detail below with regard to FIG. 7.

In the technology disclosed, the automated Surface Mount Device (SMD) warehouse or storage unit may further be configured to store bins with a large physical volume, wherein the bins are configured with wheels to form a trolley (e.g., adapted to hold multiple bin load units), wherein the bin load units comprise component tape reels and SMT feeders mounted so that the bin load units can be positioned in a SMT pick and place machine for immediate operation and feed components directly into the SMT pick and place machine.

Pallet is in this document to be understood as an accumulator device for electronic components comprised on a component tape reel and adapted with an attachment arrangements allowing storage in a carrier such as a bin, a position in an automated Surface Mount Device (SMD) warehouse and position in an SMT pick and place machine, as would be understood by a person skilled in the art.

Carrier is in this document to be understood as a bin, basket, magazine or trolley adapted to comprise component tape reels and optionally tape guides, component feeders, pallets or any component handled by an SMT pick and place machine in one or more compartments and adapted to be coupled to an SMT pick and place machine, as would be understood by a person skilled in the art. In the technology disclosed, the carrier comprises an alphanumerical display controller unit and an alphanumerical display. The alphanumerical display controller unit can optionally recognize and register component tape reels placed in the carrier (e.g., by scanning barcodes or RFID tags attached to the component tape reels). The scanning may be performed manually by a handheld barcode tag/RFID tag scanner or by a barcode tag/RFID tag scanner integrated in the bin. Alternatively the alphanumerical display controller unit is configured to communicate data (e.g., identities of recognize and register component tape reels) via the communications network to the SMT information database (e.g., such that information on the content of the bin is available in the SMT information database). Alternatively, the carrier is a bin or magazine further configured with wheels to form a trolley such that the trolley can be retrieved manually or automatically from an automated Surface Mount Device (SMD) warehouse and positioned in an SMT pick and place machine for immediate operation. Alternatively, the carrier is configured to facilitate block-handling of component tape holders, such that components can be fed directly into the SMT pick and place machine when the component tape holders are placed in the bin, for example, by configuring the bin to hold SMT component feeders placed in the bin and individually positioned in Separate compartments, or sections or cells in said bin, one for each component tape holder to feed components directly into the SMT pick and place machine. Alternatively, the carrier is provided with a plurality of separate compartments, sections or cells adapted to each comprise a taper guide or SMT component feeder with a pre-threaded component tape reel and wherein the alphanumerical display controller is configured to receive data via the communications network from the SMT information database, wherein the data comprises bin load unit related data such as pickup offset and component tape pitch. The carrier is provided with a number of separate positions for storing component tape holders (e.g., component tape reels) where each position is associated with a feeder position when the carrier is connected to the pick-and-place machine during production. Preferably, these positions are defined by separate compartments, or sections or cells, one for each component tape holder, the compartments preferably being separated by intermediate walls, or the like. Thus, each component tape holder is effectively kept in place and the component tape holders carried by the same carrier will not interfere with one another.

Display is in this document to be understood as an electronic display (e.g., an alphanumerical display or electronic label) that may be associated with, or attached directly to, a carrier. In certain aspects of the technology disclosed, the displays allow operators to receive and change information and display data (e.g., just-in-time information about material) anywhere on the shop floor, thanks to a factory-wide wireless communication link. Controlled by material handling software and/or the SMT information database, the system may guide the operator through the entire kitting and changeover process by presenting instructions on the alphanumerical displays (electronic labels). As a result, operators can work more efficiently and instantly locate missing material by sending a signal directly to the alphanumerical display. In other aspects of the technology disclosed, the display is further configured to receive instructions from the operator by the action of the operator of pushing a pressure-sensitive button (on or associated with the display) and/or scanning a barcode (on or associated with the display).

Systems

FIG. 1 schematically illustrates an embodiment of a SMT system 100.

Referring to FIG. 1, the SMT system 100 comprises an SMT information database 92, an SMT pick and place machine 91, an automated Surface Mount Device (SMD) warehouse 93 and optionally an SMT job planning computing device 95, wherein all the nodes mentioned above are communicatively coupled in a communications network 94. The communications network may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX) and ultrasonic communication, infrared networks etc., but is not limited thereto.

Figure 2:
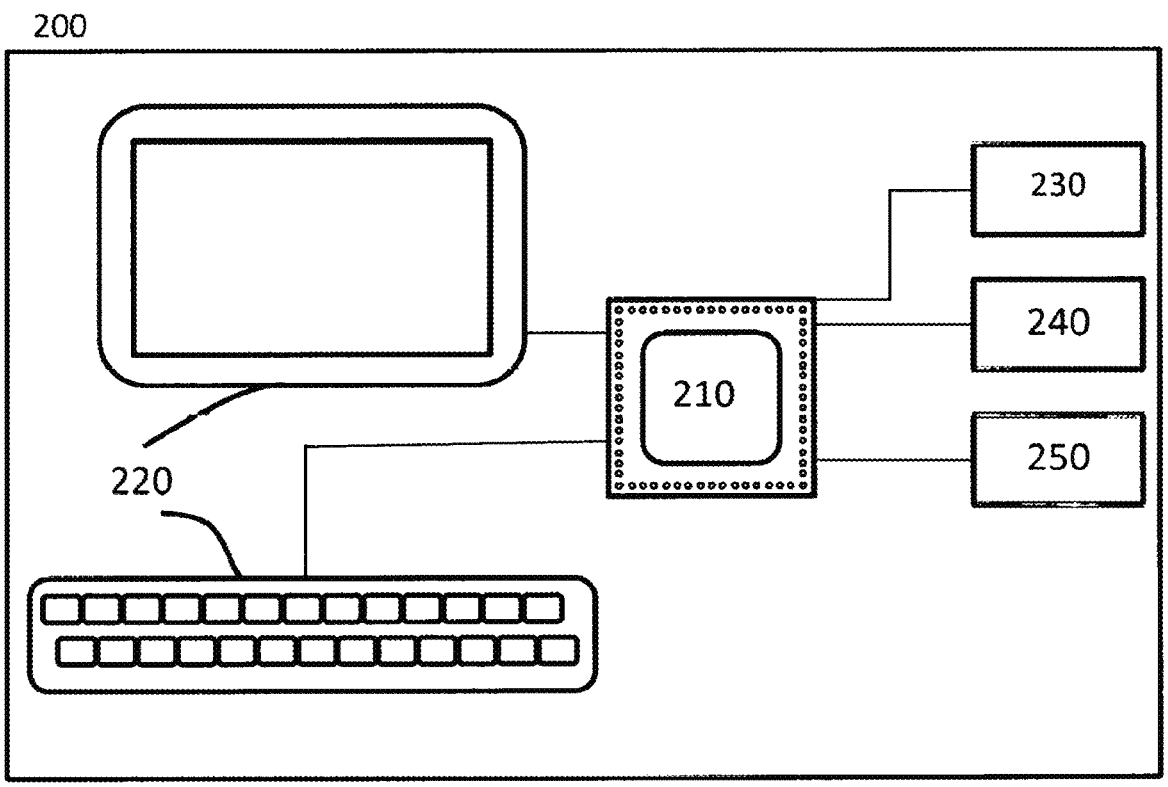
FIG. 2 shows an automated surface mount device (SMD) warehouse device.

FIG. 2 shows a schematic view of an automated Surface Mount Device (SMD) warehouse 200 adapted to obtain information related to upcoming SMT jobs, and store bins at predetermined positions within said automated Surface Mount Device (SMD) warehouse.

Referring to FIG. 2, the automated Surface Mount Device (SMD) warehouse comprises a processor/processing unit 210 provided with specifically designed programming or program code portions adapted to control the processing unit to perform the steps and functions of aspect of the technology disclosed of the inventive method described herein. The automated Surface Mount Device (SMD) warehouse further comprises at least one memory 230 configured to store data values or parameters received from a processor 210 or to retrieve and send data values or parameters to a processor 210. The automated Surface Mount Device (SMD) warehouse further comprises a communications interface 240 configured to send or receive data values or parameters to/from a processor 210 to/from external units via the communications interface 240. The automated Surface Mount Device (SMD) warehouse further comprises an actuator 250, such as a robot or robotic arm, adapted to retrieve/store bins, pallets and/or component tape reels from predetermined positions within the automated Surface Mount Device (SMD) warehouse based on control data received from the processor/processing unit 210.

The processor/processing unit 210 may be a specific or special purpose processor/processing unit (e.g., a microprocessor, microcontroller or other control logic) that comprises sections of code or code portions, stored on a (tangible or non-transitory) computer readable storage medium, such as a memory 230, that are fixed to perform certain tasks, but also other alterable sections of code, stored on a computer readable storage medium, that can be altered during use. Such alterable sections of code can comprise parameters that are to be used as input for the various tasks, such as displaying or processing HTML content or any other parameter related operations known to a person skilled in the art.

The processor/processing unit 210 may be configured to be communicatively coupled and communicate with a memory 230 where data and parameters are kept ready for use by the processing unit 210. The one or more memories 230 may comprise a selection of a hard random access memory (RAM), disk drive, a floppy disk drive, a magnetic tape drive, an optical disk drive, a CD or DVD drive (R or RW), flash memory, or other removable or fixed media drive.

When producing SMT production units in an SMT system, a SMT job associated with an SMT production unit is planned or predefined and stored in an SMT information database. Information relating to an SMT job might indicate the number of production units to be produced and component requirements to complete production of the SMT unit by an SMT pick and place machine. In conventional systems this involves retrieving individual component rolls carrying SMT components, transporting and inserting them in a component feeding position at the pick and place machine, where they can provide components to the pick and place machine robot. The invention reduces the complexity and error-prone previous process by providing pre-loaded bins, trays or accumulator devices that are automatically retrieved from the automated Surface Mount Device (SMD) warehouse and presented at a port, slit, outlet or access point to the operator of the pick and place machine, and can be inserted directly into the pick and place machine for the upcoming SMT job. As the bins have been pre-loaded with components required at the upcoming SMT job, less actions are required by the operator. Information relating to upcoming SMT jobs is obtained, for example, retrieved from memory, pushed or sent by the SMT information database over a communications network, retrieved over a communications network from the SMT information database and/or obtained from operator indications to an input/output device of the automated Surface Mount Device (SMD) warehouse. Examples of input data received by the automated Surface Mount Device (SMD) warehouse are SMT job ID, SMT job component requirements, bin ID, pallet ID, component tape reel ID or a parameter representing position in the automated Surface Mount Device (SMD) warehouse.

Figure 6:
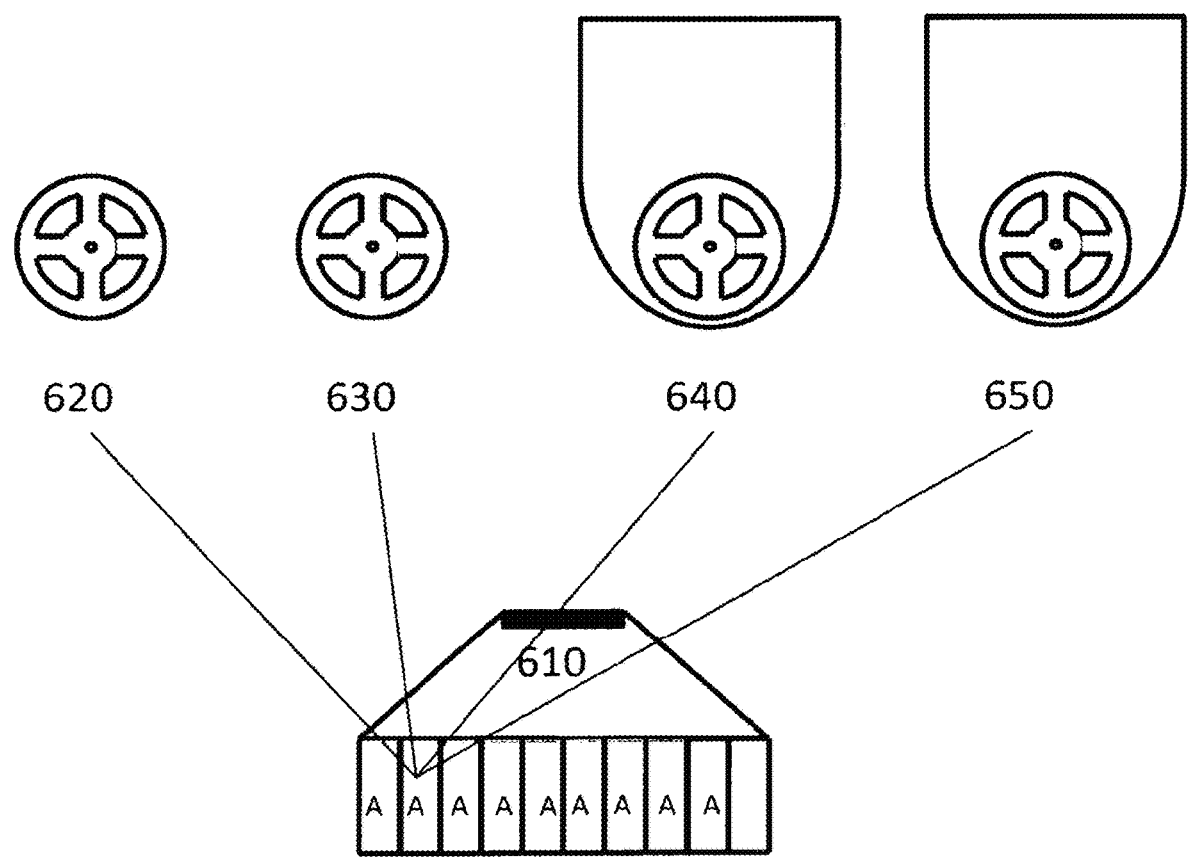
FIG. 6 shows various examples of bin load units, such as component tape reel, component tape reel with feeder, a pallet comprising a component tape reel and a pallet comprising a component tape reel and an SMT feeder.

FIG. 6 shows various examples of bin load units comprised in a bin 610, such as a component tape reel 620, a component tape reel with SMT feeder 630, a pallet comprising a component tape reel 640 and a pallet comprising a component tape reel and an SMT feeder 650. The bin 610 may comprise one or a plurality of compartments or slots adapted to comprise bin load units. The SMT feeder 650 may have a built-in tape advancing mechanism or utilize a tape advancing mechanism of the pick and place machine or the magazine, for example, a feeding wheel or a protrusion utilizing an internal or external drive such as a linear motor, in the pick-and-place machine or magazine, that protrudes through the tape guide into contact with the pre-threaded tape.

Figure 7A:
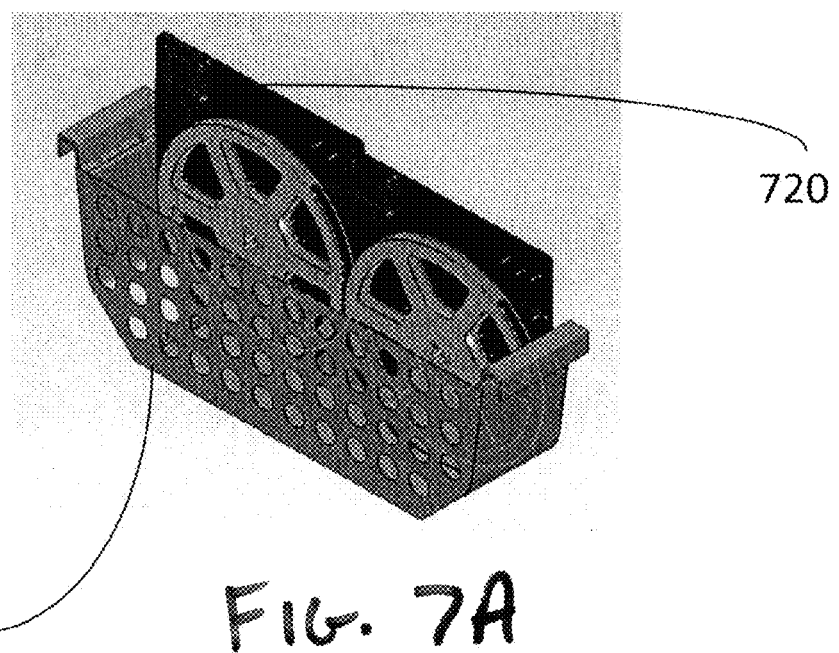
FIG. 7A shows an example of a bin comprising bin load units in the form of pallets comprising component tape reels.

FIG. 7a shows an example of a bin 710 comprising bin load units 720 in the form of pallets comprising component tape reels.

Figure 7B:
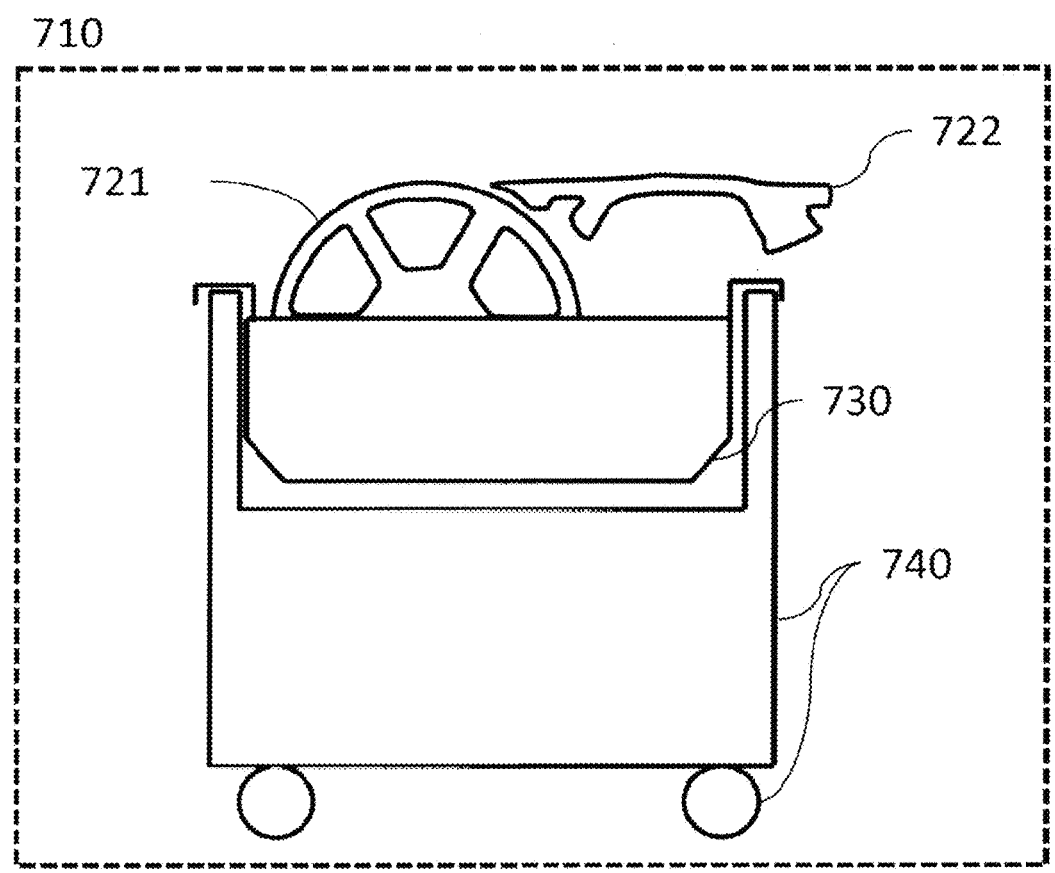
FIG. 7B shows an example of a bin configured as a trolley.

FIG. 7b shows an example of the bin 710 configured as a trolley.

Referring to FIGS. 7a and 7b, the bin 710 is loaded with a bin load unit consisting of a component tape reel 721 and a SMT feeder 722. In FIG. 7b, the bin 710 further comprises a first compartment section 730 including bin load units and a second chassis section 740 configured to roll on a supporting surface, such as a floor, such that the bin 710 can be moved back and forth between the SMD Warehouse and the pick-and-place machine, be retrieved/stored by an actuator in an automated SMD warehouse and to be inserted directly into the pick and place machine for producing the upcoming SMT job.

In one embodiment, the first compartment section 730 and the second chassis section 740 are configured as integral inseparable parts. In yet another embodiment, the first compartment section 730 and the second chassis section 740 is configured as separable parts such that the first compartment section 730 can be separated from the second chassis section 740 and stored separately in an automated SMD Warehouse or inserted separately in an SMT pick and place machine.

Figure 11:
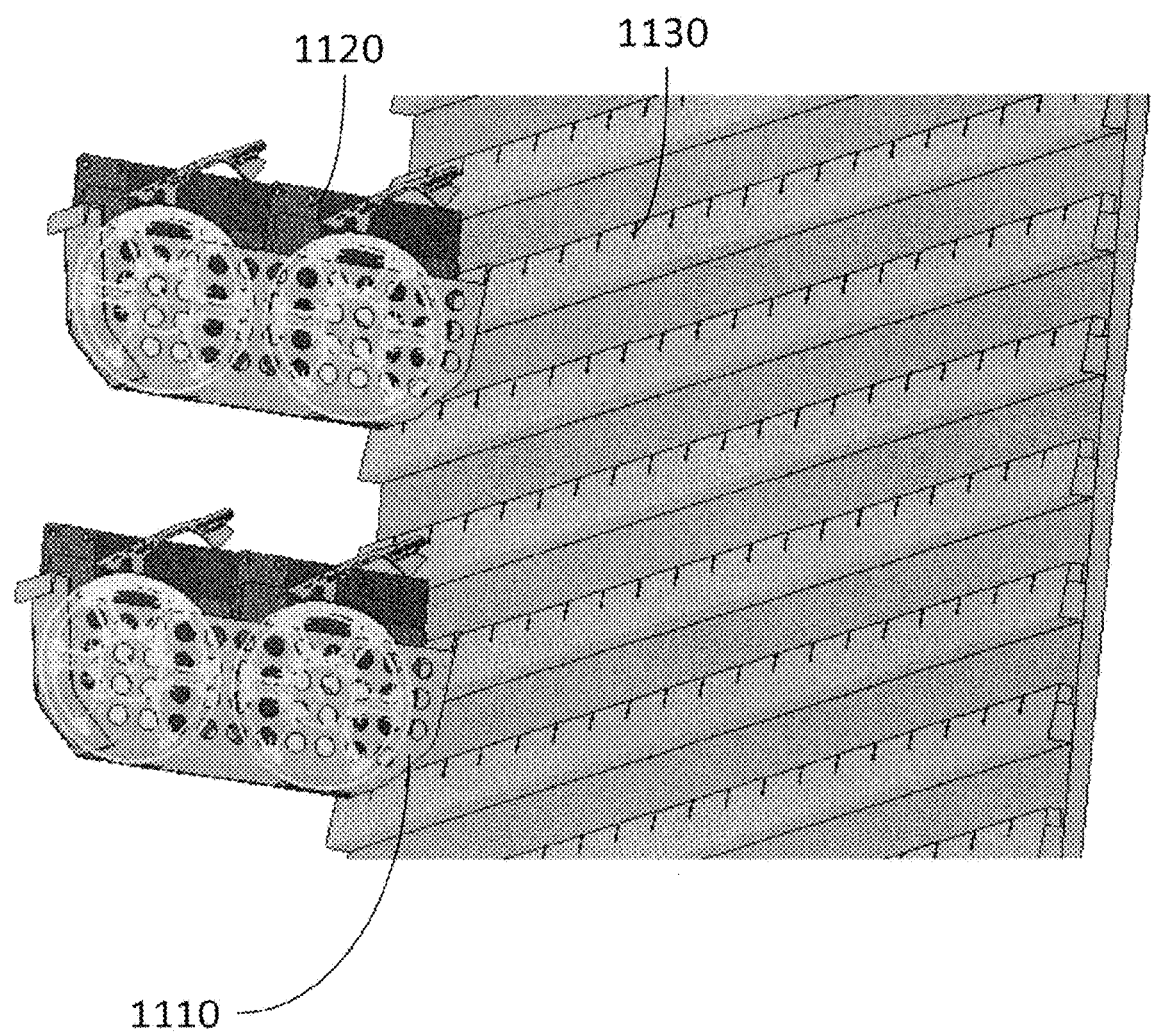
FIG. 11 shows an example of the technology disclosed where a first and a second bin are retrieved from, or stored in, predetermined storage positions in the automated Surface Mount Device (SMD) warehouse.

FIG. 11 shows an example of the technology disclosed where a first bin 1110 and a second bin 1120 are retrieved from, or stored in, predetermined storage positions 1130 in the automated Surface Mount Device (SMD) warehouse. The attachment of a bin to the storage position might be performed by a hook, an element protruding through a hole, by magnetic means or any other attachment means known to a skilled person.

Figure 15A:
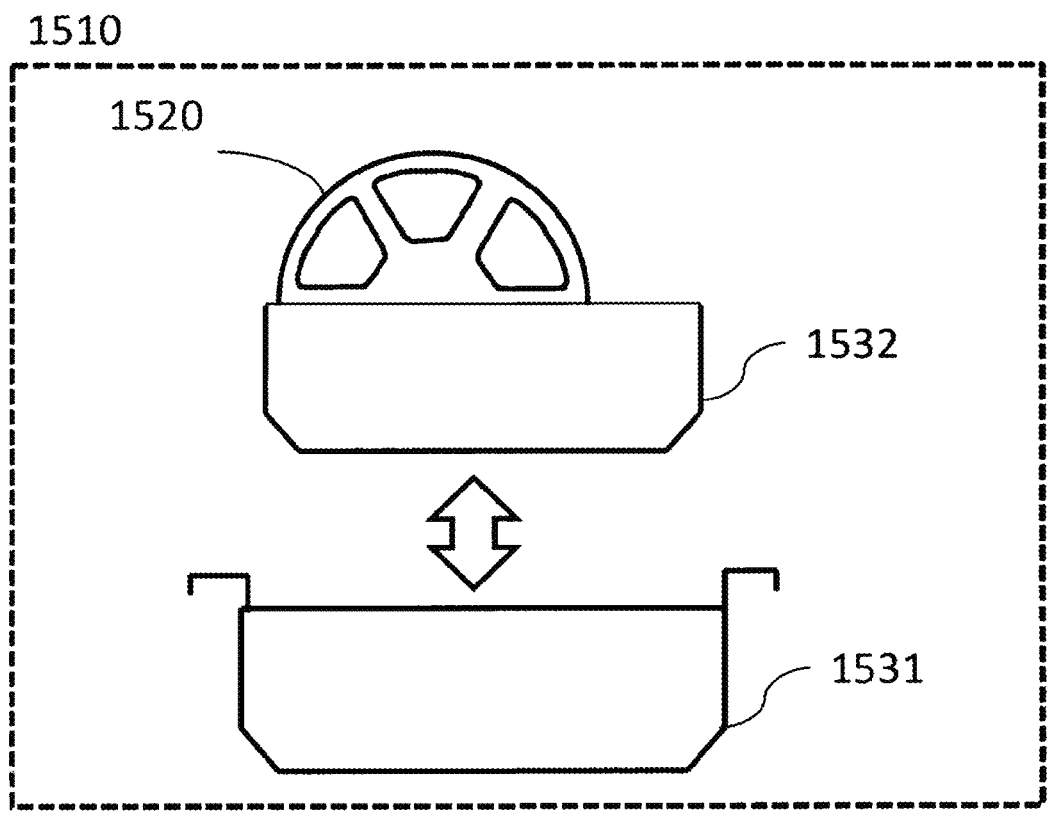
FIG. 15A and FIG. 15B show examples of a bin comprising a bin load unit compartment section and a receptacle compartment section.
Figure 15B:
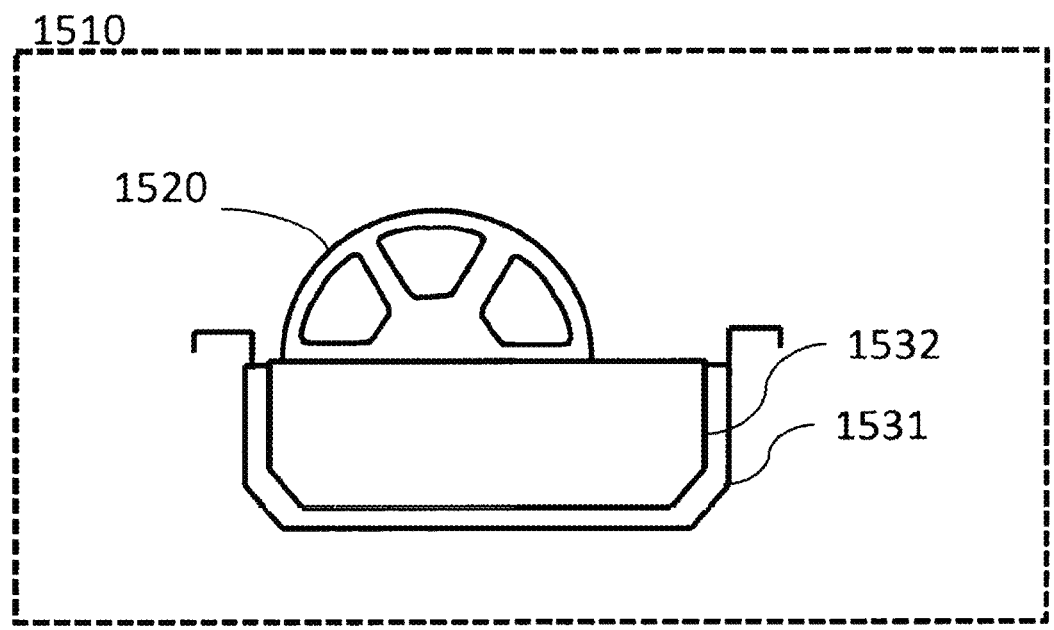

FIG. 15a and FIG. 15b show examples of a bin 1510 comprising bin load units 1520 in the form of component tape reels.

Referring to FIG. 15a and FIG. 15b, the bin 1510 comprises a third bin load unit compartment section 1532 comprising bin load units 1520 and a fourth receptacle compartment section 1531 comprising said third load unit compartment section 1532. The third bin load unit compartment section 1532 can be separated from the fourth receptacle compartment section 1531 and inserted back into the fourth receptacle compartment section 1531 at a later time. The bin 1510 comprising a third load unit compartment section 1532 inserted into the fourth receptacle compartment section 1531 can be inserted directly into the pick and place machine for producing the upcoming SMT job. By replacing the third load unit compartment section 1532 with a different one (e.g., a third load unit compartment section 1532 configured to receive component trays, component sticks or component tape reels), the bin can be more easily reconfigured to be loaded with different type of components depending on requirements of an SMT job. An advantage is that the delay when configuring a pick and place machine for an upcoming SMT job can be reduced. Yet another advantage is that the same fourth receptacle compartment section 1531 can be used for various components by changing the third load unit compartment section 1532

After finishing an SMT job, the operator unloads the bin from the pick and place machine and returns the bin to the port of the automated Surface Mount Device (SMD) warehouse, that in turn receives the bin and stores it at an available position or storage position within the automated Surface Mount Device (SMD) warehouse by the use of one or more actuators, such as a robot, robot arm or other actuator known to a skilled person.

In yet another example of the technology disclosed provides for a method in an automated Surface Mount Device (SMD) warehouse adapted to obtain information related to upcoming SMT jobs, to store bins at predetermined positions within said automated Surface Mount Device (SMD) warehouse, wherein said bins comprise bin load units, and wherein said bin load unit comprises at least a component tape reel, the method comprising: receiving a bin at a port, such as an opening, of said automated Surface Mount Device (SMD) warehouse; storing said bin at a position within said automated Surface Mount Device (SMD) warehouse; and storing said position at which the bin is stored.

In yet another example of the technology disclosed provides for a method in an automated Surface Mount Device (SMD) warehouse adapted to obtain information related to upcoming SMT jobs, to store bins at predetermined positions within said automated Surface Mount Device (SMD) warehouse, wherein said bins comprise bin load units, and wherein said bin load unit comprises at least a component tape reel, the method comprising: receiving a bin at an input port, such as an opening, of said automated Surface Mount Device (SMD) warehouse; determining tape reel identities of component tape reels comprised in said bin; and storing said bin at one of said plurality of positions within said automated Surface Mount Device (SMD) warehouse, wherein said bin comprises a plurality of bin load units, and wherein each of said plurality of bin load units comprises or constitutes a component tape reel.

In one example, an operator provides a bin comprising bin load units at the port of said automated Surface Mount Device (SMD) warehouse. The bin load units in the bin are identified, for example, by scanning an identity tag or retrieving associated bin load units from the SMT information database. The processor in the automated Surface Mount Device (SMD) warehouse identifies an available position within said automated Surface Mount Device (SMD) warehouse that could accommodate the bin and retrieves the corresponding parameter value from memory. The actuator then stores the received bin at the retrieved position within said automated Surface Mount Device (SMD) warehouse and stores the position within said automated Surface Mount Device (SMD) warehouse associated to the bin load unit ID's in the memory and/or the SMT information database. The bin load unit ID's may be, for example, component tape reel ID's or pallet ID's.

In yet another aspect of the technology disclosed, storing said bin further comprises determining tape reel identities of component tape reels in said bin.

In one example, determining the tape reel identities comprises scanning an identity tag of component tape reels comprised in said bin, wherein the identity tags are, for example, barcodes and/or RFID tags.

In yet another aspect of the technology disclosed, the determining tape reel identities of component tape reels in said bin comprises: scanning individual identity tags attached to component tape reels; and storing the identity (ID) of each component tape reel to a memory in said automated Surface Mount Device (SMD) warehouse.

In yet another aspect of the technology disclosed, the determining tape reel identities of component tape reels in said bin comprises: scanning individual identity tags attached to component tape reels; and storing the identity (ID) of each component tape reel scanned and the position of the stored bin to at least one of a memory in said automated Surface Mount Device (SMD) warehouse and/or in an SMT information database.

In one example, the scanning is performed at the input port of the SMD warehouse with the bin load units positioned in the bin.

In yet another aspect of the technology disclosed, the determining tape reel identities of component tape reels in said bin further comprises: gripping said bin load unit in said bin by an actuator in said automated Surface Mount Device (SMD) warehouse; moving said bin load to an intermediate position within said automated Surface Mount Device (SMD) warehouse; and replacing said bin load unit in said bin.

In one example, the actuator moves the bin load unit into a position where it can be scanned by a fixed identity tag scanner (e.g., a barcode scanner).

In yet another aspect of the technology disclosed, said individual identity tags are barcodes adapted to be scanned by a barcode scanner unit and through said scanning provide information to the barcode scanner unit of an associated identity.

In yet another aspect of the technology disclosed, the determining tape reel identities of component tape reels in said bin comprises: scanning individual identity tags attached to pallets comprising component tape reels to obtain bin ID's; and retrieving the ID of component tape reel ID associated to pallet ID from said SMT information database.

In yet another aspect of the technology disclosed, the determining tape reel identities of component tape reels in said bin comprises: scanning, or reading, individual identity tags attached to pallets comprising component tape reels, wherein individual pallet IDs are obtained from said scanning or reading of individual identity tags attached to pallets; and retrieving the ID of component tape reels associated with said obtained pallet ID's from said SMT information database.

In one example, the component tape ID's are associated with respective pallet ID's in the SMT information database, the pallet ID's are obtained by scanning identity tags attached to the pallets and the ID's of component tape reels associated to the scanned pallet ID from said SMT information database using database lookup, as would be understood by a person skilled in the art.

In yet another aspect of the technology disclosed, the determining tape reel identities of component tape reels in said bin comprises: scanning an identity tag attached to said bin to obtain bin ID's; and retrieving the ID's of component tape reel ID's associated to said bin ID's from said SMT information database.

In one example, the component tape ID's are associated with respective bin ID's in the SMT information database, the bin ID's are obtained by scanning identity tags attached to the bins and the ID's of component tape reels associated to the scanned bin ID from said SMT information database using database lookup, as would be understood by a person skilled in the art.

In yet another aspect of the technology disclosed, said identity tag is one of a EAN-13, EAN-8, UPC, Code 39, GS1-128, AI, Code 128, ITF-14, ITF-14, GS1 Datamatrix, GS1 Databar, Industrial 2 of 5, Industrial 2 of 5 Interleaved, 3-DI, ArrayTag, Aztec Code, Small Aztec Code, Codablock, Code 1, Code 16K, Code 49, ColorCode, Color Construct Code, Compact Matrix Code, CP Code, CyberCode, d-touch, DataGlyphs, Data Matrix, Datastrip Code, Dot Code A, EZcode, Grid Matrix Code, HD Barcode, High Capacity Color Barcode, HueCode, INTACTA.CODE, InterCode, JAGTAG, MaxiCode, mCode, MiniCode, MicroPDF417, MMCC, Nintendo e-Reader # Dot code, Optar, PaperDisk, PDF417, PDMark, QR Code, QuickMark Code, Secure Seal, SmartCode, Snowflake code, ShotCode, SPARQCode, SuperCode, Trillcode, UltraCode, UnisCode, VeriCode, VSCode, WaterCode and Radio Frequency Identification (RFID) tags.

In yet another aspect of the technology disclosed, said position is stored as a parameter representing a position within said automated Surface Mount Device (SMD) warehouse.

In one example, wherein said position is an X, Y, Z coordinate or a shelf identity.

SMD System

In yet another aspect of the technology disclosed, an automated Surface Mount Device (SMD) warehouse system comprises: a processor; an actuator communicatively coupled to said processor, such as a robot or robotic arm, adapted to retrieve or store bins, pallets or component tape reels at predetermined positions within the automated Surface Mount Device (SMD) warehouse based on control data received from a processor; and a memory. Said processor is adapted to: obtain information related to upcoming SMT jobs; and store bins at predetermined positions within said automated Surface Mount Device (SMD) warehouse by sending control data to said actuator. Said bins are adapted to comprise bin load units, and said bin load units comprise at least a component tape reel. Said processor in said automated Surface Mount Device (SMD) warehouse is further adapted to perform the steps of: receiving input data; retrieving a bin based on said input data and a parameter representing a position within said automated Surface Mount Device (SMD) warehouse by sending control data to said actuator, wherein said bin is adapted to comprise bin load units, wherein said bin load unit comprises at least a component tape reel; and presenting said retrieved bin by said actuator at a port of said automated Surface Mount Device (SMD) warehouse by sending control data to said actuator.

In yet another aspect of the technology disclosed, the system further comprises: an input/output interface, wherein said input data is received from said input/output interface based on an operator indication of an upcoming SMT job.

In yet another aspect of the technology disclosed, the system further comprises: a communications interface and said input data is received from said SMT information database via a communications network and said input data is associated with (indicating) an upcoming SMT job.

In yet another embodiment, an automated Surface Mount Device (SMD) warehouse comprises: a processor; and an actuator, such as a robot or robotic arm, communicatively coupled to said processor. Said processor is configured to: receive at least one of input data and a parameter representing a position within said automated Surface Mount Device (SMD) warehouse; and send control data to the actuator at least partly based on the obtained information and/or instructions. The actuator is configured to: retrieve a bin from said position within the automated Surface Mount Device (SMD) warehouse; and present said retrieved bin at, or close to, an output port, such as an opening, of said automated Surface Mount Device (SMD) warehouse based on control data received from said processor The automated SMD warehouse further comprises an input/output interface, and said processor is further configured to receive input data from said input/output interface based on an operator indication of an upcoming SMT job.

The automated SMD warehouse further comprises a communications interface configured to receive and/or retrieve input data from a SMT information database via a communications network, and said processor is further configured to receive input data from said communications network, wherein said input data is associated with, or is indicating, an upcoming SMT job.

In the automated SMD warehouse, said retrieved bin is loaded with a plurality of bin load units, and said bin load units each comprise or constitute a component tape reel.

In yet another aspect of the technology disclosed, an automated Surface Mount Device (SMD) warehouse system comprises: an actuator, such as a robot or robotic arm, adapted to retrieve or store bins, pallets or component tape reels from predetermined positions within the automated Surface Mount Device (SMD) warehouse based on control data received from a processor; a memory; and a processor. The processor is adapted to: obtain information related to upcoming SMT jobs; store bins at predetermined positions within said automated Surface Mount Device (SMD) warehouse by sending control data to said actuator, wherein said bins are comprise bin load units, and wherein said bin load unit comprises at least a component tape reel. Said processor in said automated Surface Mount Device (SMD) warehouse is adapted to perform the steps of: receiving a bin at a port of said automated Surface Mount Device (SMD) warehouse by controlling said actuator with control data; storing said bin at a position within said automated Surface Mount Device (SMD) warehouse by said actuator with control data; and storing said position.

In one or more embodiments, wherein said processor is further adapted to perform any of the steps of the methods described herein.

In yet another aspect of the technology disclosed, an automated Surface Mount Device (SMD) warehouse system comprises: an actuator, such as a robot or robotic arm, adapted to retrieve or store bins, pallets or component tape reels at predetermined positions within the automated Surface Mount Device (SMD) warehouse based on control data received from a processor; a memory; and a processor configured to obtain information related to upcoming SMT jobs. Said actuator is configured to store bins at predetermined positions within said automated Surface Mount Device (SMD) warehouse by receiving control data from said processor. Said bins are comprise bin load units, and said bin load unit comprises at least a component tape reel. Said processor of said automated Surface Mount Device (SMD) warehouse system is further configured to control the steps of: receiving a bin at a port of said automated Surface Mount Device (SMD) warehouse by providing said actuator with control data; and storing said bin at a position within said automated Surface Mount Device (SMD) warehouse by providing said actuator with said control data.

In yet another aspect of the technology disclosed, a computer program product comprising computer readable code is configured to, when executed in a processor, perform any or all of the method steps of the methods described herein.

In yet another aspect of the technology disclosed, a non-transitory computer readable memory on which is stored computer readable code is configured to, when executed in a processor, perform any or all of the method steps of the methods described herein.

In yet another aspect of the technology disclosed, a computer program product comprising computer readable code is configured to, when executed in a processor, perform any or all of the method steps of the methods described herein.

In yet another aspect of the technology disclosed, a non-transitory computer readable memory on which is stored computer readable code is configured to, when executed in a processor, perform any or all of the method steps of the methods described herein.

To operate the SMT system an operator responsible for monitoring the production of the SMT production units, to retrieve components from the SMD warehouse and to insert components in positions in the SMT pick and place machine. Today, these tasks are performed by manual methods such as printouts. There is a need to provide the operator with dynamic information including, for example, into which position a retrieved component should be inserted in the SMT pick and place machine and/or which components are about to run out when the SMT pick and place machine is in production of SMT production units. With improved information obtained by the operator, the risk of erroneous insertion in the SMT pick and place machine can be reduced, and the time required to stop the production to replace a component tape reel can be reduced.

In one or more embodiments, a method for providing operator information in an Surface Mount Technology (SMT) system comprising an SMT information database, a SMT pick and place machine where SMT production have been started and an identity tag scanner, wherein SMT production comprises at least feeding components from a bin load unit to the SMT pick and place machine, the method comprising: receiving a bin in said SMT pick and place machine, wherein said bin comprises vertically oriented bin load units, wherein said bin load unit has an bin load unit identity tag attached to the bin load unit upwards facing surface; and scanning individual identity tags attached to pallets comprising component tape reels to obtain pallet ID's.

In one or more aspect of the technology disclosed describes a method for providing operator information in a Surface Mount Technology (SMT) system comprising an SMT information database, a SMT pick and place machine and an identity tag scanner, the method comprising: receiving a bin in said SMT pick and place machine, wherein said bin comprises vertically oriented bin load units, wherein said bin load unit has an bin load unit identity tag attached to the bin load unit upwards facing surface; starting SMT production on said SMT pick and place machine; and scanning individual identity tags attached to bin load units comprising component tape reels to obtain bin load IDs.

In one or more embodiments, wherein said bin load units are comprised in pallets.

In one or more aspect of the technology disclosed describes a method for providing operator information in a Surface Mount Technology (SMT) system comprising an SMT information database, a SMT pick and place machine and an identity tag scanner, the method comprising: receiving a bin in said SMT pick and place machine, wherein said bin comprises vertically oriented pallets, wherein said pallet has an pallet identity tag attached to the pallets upwards facing surface; starting SMT production on said SMT pick and place machine; and scanning individual identity tags attached to pallets comprising component tape reels to obtain pallet ID's.

In one example, the bin load units are comprised in pallets. Individual identity tags attached to pallets are scanned to obtain pallet IDs. The pallet ID is associated to other identities, such as component IDs, bin IDs, component tape reel IDs, etc., in the SMT information database and the associated ID can be retrieved and presented to an operator on a display on the scanner or on the pick and place machine.

Yet another aspect of the technology disclosed provides a method for providing operator information in an Surface Mount Technology (SMT) system comprising an SMT information database and a SMT pick and place machine where SMT production have been started, wherein started SMT production comprises at least feeding components from a bin load unit to the SMT pick and place machine, the method comprising: receiving a bin in said SMT pick and place machine, wherein said bin comprises an alphanumerical display controller unit and an alphanumerical display; receiving display data relating to an SMT job via a communications network; and presenting said display data on said alphanumerical display.

Yet another aspect of the technology disclosed describes a method for providing operator information in a Surface Mount Technology (SMT) system comprising an SMT information database and a SMT pick and place machine, the method comprising: receiving a bin in said SMT pick and place machine, wherein said bin has a bin identity tag attached to the bins forward facing surface such that the surface is facing an operator, wherein said identity tag comprises an alphanumerical display controller unit and a alphanumerical display; starting SMT production on said SMT pick and place machine; receiving display data relating to an SMT job from said SMT information database; and presenting said display data on said alphanumerical display.

In one example, the bin load units are comprised in a bin configured with a bin identity tag attached to the bins forward facing surface such that the surface is facing an operator, wherein said identity tag comprises an alphanumerical display controller unit and an alphanumerical display. Data relating to the number of components remaining in a bin load unit, such as a component tape reel, is continuously sent from the pick and place machine to the SMT information database. A selection of the identity of the pick and place machine, the location into where the bin should be placed in the pick and place machine, the type of component and the number of remaining component is received as display data and presented on the alphanumerical display.

In one or more embodiments, said display data is received via a communications network.

In one or more embodiments, said communications network is a wireless communications network.

In one or more embodiments, said display data relates to an SMT job retrieved from said SMT information database In one or more embodiments, said bin has a bin identity tag in the form of a barcode attached to the bins forward facing surface such that the surface is facing an operator In one or more embodiments, said communications network is an infrared network or a wireless local area network (WLAN).

In one or more embodiments, the method further comprises sending said display information to an IR based system.

In one or more embodiments, said display data is pushed down from a separate system.

In one or more embodiments, the method step of receiving display data is preceded by scanning individual identity tags attached to bin load units, pallets, bins or pick and place machine magazines.

In one example, the display data is received only after an individual identity tag has been scanned by an operator.

Yet another aspect of the technology disclosed describes a Surface Mount Technology (SMT) system for providing operator information comprising: an SMT information database; a SMT pick and place machine; and an identity tag scanner. Said system is adapted to receive a bin in said SMT pick and place machine, wherein said bin comprises vertically oriented bin load units, and wherein said bin load units has an bin load units identity tag attached to the bin load units upwards facing surface.

In one or more embodiments, said bin load units are comprised in pallets.

Yet another aspect of the technology disclosed describes a bin in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, the bin comprising: an alphanumerical display controller unit and an alphanumerical display. Said controller is configured to: receive display data relating to an SMT job pushed down from a separate system via a communications network; and present said display data on said alphanumerical display.

In yet another aspect of the technology disclosed, said display data comprises a selection of SMT job ID, predetermined component feeder position in the SMT pick and place machine, component type and remaining number of components on a component tape reel comprised in said bin.

In yet another aspect of the technology disclosed, a Surface Mount Technology (SMT) system for providing operator information comprises: an SMT information database; a SMT pick and place machine; and an identity tag scanner. Said system is adapted to receive a bin in said SMT pick and place machine, wherein said bin is adapted to comprise vertically oriented pallets, and wherein said pallet has an pallet identity tag attached to the pallets upwards facing surface, In yet another aspect of the technology disclosed, a bin in a Surface Mount Technology (SMT) system is used for providing operator information, wherein said bin is adapted to be received in a SMT pick and place machine, and wherein said bin has a bin identity tag attached to the forward facing surface of the bin such that the surface faces an operator, and wherein said identity tag may also, or alternatively, comprise an alphanumerical display controller unit and a alphanumerical display.

In order to reduce retrieval time in an automated Surface Mount Device (SMD) warehouse and speed up preparation of the SMT pick and place machine with components required to start production there is a need to improve and/or optimize the configuration of stored units in the automated Surface Mount Device (SMD) warehouse. Idle time (e.g., when no storage or retrieval is performed by the automated Surface Mount Device (SMD) warehouse) may be used to: pre-load bins with components required in an upcoming SMT job; rearrange and optimize storage space within the automated Surface Mount Device (SMD) warehouse; and/or place stored units, such as bins or pallets, that are expected to be used within a foreseeable future, close to the port of the automated Surface Mount Device (SMD) warehouse. The bin load units are provided with identity tags that might be scanned individually and the identity of the tag together with the storage position of the bin is stored in memory coupled to the processor of the automated Surface Mount Device (SMD) warehouse In one or more aspect of the technology disclosed, a method is described for improving and/or optimizing presentation of bin load units at a port in an automated Surface Mount Device (SMD) warehouse adapted to obtain information related to upcoming SMT jobs, the method comprising: automatically redistributing stored bin load units based on predetermined rules to optimize presentation of bin load units at a port of said automated Surface Mount Device (SMD) warehouse based on information relating to upcoming SMT jobs.

In one or more embodiments, said bin load units are in said automated Surface Mount Device (SMD) warehouse, and the redistributing is further based on SMT job related information received or retrieved from said SMT database.

In one example, a data structure indicating required components or bills-of-material for upcoming SMT jobs is received from the SMT information database. Bin load units corresponding to upcoming SMT jobs are loaded into bins and the bins are redistributed or moved based on predetermined rules to improve and/or optimize presentation of bin load units at a port of said automated Surface Mount Device (SMD) warehouse.

In yet another aspect of the technology disclosed, said stored bin load units are comprised in individual stored pallets.

In one example a component tape reel and/or a SMT feeder is comprised in a pallet and the pallet is loaded into a bin.

In yet another aspect of the technology disclosed, said stored bin load units are comprised in one or inure stored bins.

In one example a component tape reel and/or a SMT feeder is loaded into a bin.

In yet another aspect of the technology disclosed, said predetermined rules are based on information on component requirements of upcoming SMT jobs.

In yet another aspect of the technology disclosed, wherein at least one of said predetermined rules and said SMT job related information received or retrieved from said SMT database are based on, or provide, information on component requirements of upcoming SMT jobs.

In one example, information relating to upcoming SMT jobs SMT1, SMT2 and SMT3 is received, where the information comprises at least the required components or bills-of-material for upcoming SMT jobs SMT1, SMT2 and SMT3 and the sequential order they are planned to be executed or produced in the pick and place machine. The predetermined rule is dependent on the sequential order SMT1, SMT2 and SMT3, and thus, bin load units comprising required components in SMT1 would be loaded into bins an placed or located closest to the port of the automated Surface Mount Device (SMD) warehouse. Bin load units comprising required components in SMT2 would further be loaded into bins a placed or located second closest to the port of the automated Surface Mount Device (SMD) warehouse and so forth. Redistribution based on information on component requirements of upcoming SMT jobs is further described in relation to FIG. 14.

In yet another aspect of the technology disclosed, at least one of said predetermined rules and said SMT job related information received or retrieved from said SMT database are based on, or provides, information on frequency of component use in previous SMT jobs.

In one example, the predetermined rule is dependent on frequency of use. Statistical information relating to component requirements of previously executed SMT jobs is retrieved from a memory in the automated Surface Mount Device (SMD) warehouse or from the SMT information database. An example of statistical information indicating a high frequency of use is the total number of components used or total number of components used per time unit. Bin load units comprising components with associated statistical information indicating the highest frequency of use would be loaded into bins an placed or located closest to the port of the automated Surface Mount Device (SMD) warehouse. Bin load units comprising components with associated statistical information indicating the second highest frequency of use would be loaded into bins placed or located second closest to the port of the automated Surface Mount Device (SMD) warehouse and so forth.

In yet another aspect of the technology disclosed, wherein at least one of said predetermined rules and said SMT job related information received or retrieved from said SMT database are based on, or provide, user indication data from received user indications.

In one example, the predetermined rule is dependent on user indication data. Received user indication data indicates an operator's preferred order of components. Bin load units comprising components indicated in the user indication data would be loaded into bins a placed or located closest to the port of the automated Surface Mount Device (SMD) warehouse in the order indicated in the user indication data.

In yet another aspect of the technology disclosed, said predetermined rules are based on information on frequency of component use in previous SMT jobs.

In yet another aspect of the technology disclosed, said predetermined rules are based on user indication data from received user indications The automated Surface Mount Device (SMD) warehouse may be configured in different manners to redistribute bin load units and bins within the automated Surface Mount Device (SMD) warehouse. In one embodiment, the automated Surface Mount Device (SMD) warehouse is configured with a first and a second actuator that cooperate when redistributing bin load units.

In yet another aspect of the technology disclosed, the method of automatically redistributing bin load units further comprises: removing a first bin load unit comprised in a first stored bin by a first actuator in said automated Surface Mount Device (SMD) warehouse; moving said first actuator to a position of a second stored bin within said automated Surface Mount Device (SMD) warehouse; removing a second bin load unit comprised in a second stored bin by a second actuator in said automated Surface Mount Device (SMD) warehouse; and inserting said first bin load unit in said second stored bin by said first actuator.

Bin load units loaded in the same bin may be redistributed within the same bin, for example, to improve and/or optimize the utilization of a bin.

In yet another aspect of the technology disclosed, said first stored bin and said second stored bin are the same bin.

Sometimes the redistribution of bin load units might involve shifting a first bin load unit to a bin already loaded with a second bin load unit, and further shifting said second bin load unit to a third bin.

When an operator is returning a bin to the automated Surface Mount Device (SMD) warehouse there is a need to determine the bin load units comprised in a bin by scanning a bin ID and retrieving the associated bin load units ID, such as pallet ID, component tape reel ID and SMT feeder ID, from an SMT information database.

When an operator is retrieving a bin from the automated Surface Mount Device (SMD) warehouse there is a need to associate a bin ID with the bin load units ID's, such as pallet ID, component tape reel ID and SMT feeder ID, by scanning a bin ID and storing the associated bin load units ID's, such as pallet ID, component tape reel ID and SMT feeder ID, to an SMT information database.

One or more aspect of the technology disclosed provides a method in an automated Surface Mount Device (SMD) warehouse configured to store bins at predetermined positions within said automated Surface Mount Device (SMD) warehouse, the method comprising: receiving a bin at a port of said automated Surface Mount Device (SMD) warehouse; and scanning an identity tag attached to said bin to obtain a bin ID.

In one or more aspect of the technology disclosed, the method further comprises storing said bin at a position within said automated Surface Mount Device (SMD) warehouse In one or more aspect of the technology disclosed, the method further comprises storing said position and said bin ID in a memory of said automated Surface Mount Device (SMD) warehouse.

One or more aspect of the technology disclosed describes a method in an automated Surface Mount Device (SMD) warehouse adapted to obtain information related to upcoming SMT jobs, to store bins at predetermined positions within said automated Surface Mount Device (SMD) warehouse, the method comprising: receiving a bin at a port of said automated Surface Mount Device (SMD) warehouse; scanning an identity tag attached to said bin to obtain a bin ID; storing said bin at a position within said automated Surface Mount Device (SMD) warehouse; and storing said position and said bin ID.

In yet another aspect of the technology disclosed, the method further comprises presenting said retrieved bin at a port of said automated Surface Mount Device (SMD) warehouse.

In yet another aspect of the technology disclosed, said bins are adapted to comprise bin load units, wherein said bin load unit comprises at least a component tape reel.

In yet another aspect of the technology disclosed, storing said position and said bin ID further comprises storing said position and said bin ID represented as parameters, such as a table, in a memory of said automated Surface Mount Device (SMD) warehouse.

In yet another aspect of the technology disclosed, storing said position and said bin ID further comprises storing said position and said bin ID represented as parameters in an SMT information database via a communications network.

Yet another aspect of the technology disclosed describes a method in an automated Surface Mount Device (SMD) warehouse adapted to obtain information related to upcoming SMT jobs, to retrieve bins at predetermined positions within said automated Surface Mount Device (SMD) warehouse, the method comprising: retrieving said bin at a position within said automated Surface Mount Device (SMD) warehouse; scanning an identity tag attached to said bin to obtain a bin ID; presenting said retrieved bin at a port of said automated Surface Mount Device (SMD) warehouse; and storing said position and said bin ID.

In yet another aspect of the technology disclosed, wherein storing is performed to a memory of said automated Surface Mount Device (SMD) warehouse.

In yet another aspect of the technology disclosed, said bins are adapted to comprise bin load units, wherein said bin load unit comprises at least a component tape reel.

In yet another aspect of the technology disclosed, storing said position and said bin ID further comprises storing said position and said bin ID represented as parameters in a memory of said automated Surface Mount Device (SMD) warehouse.

In yet another aspect of the technology disclosed, storing said position and said bin ID further comprises storing said position and said bin ID represented as parameters in an SMT information database via a communications network.

In yet another aspect of the technology disclosed, a bin in a SMT system is adapted to be stored in an automated Surface Mount Device (SMD) warehouse system, said bin comprising: an identity tag attached to said bin in a predetermined position thereby enabling an actuator comprised in said surface Mount Device (SMD) warehouse to scan said identity tag.

In yet another aspect of the technology disclosed, an automated Surface Mount Device (SMD) warehouse system comprises: an actuator, such as a robot or robotic arm, adapted to retrieve or store bins, pallets or component tape reels at predetermined positions within the automated Surface Mount Device (SMD) warehouse based on control data received from a processor; a memory; and a processor. The processor is adapted to obtain information related to upcoming SMT jobs. Said processor in said automated Surface Mount Device (SMD) warehouse is adapted to perform the method steps described herein.

In yet another aspect of the technology disclosed, an automated Surface Mount Device (SMD) warehouse system comprises: an actuator, such as a robot or robotic arm, adapted to retrieve or store bins, pallets or component tape reels at predetermined positions within the automated Surface Mount Device (SMD) warehouse based on control data received from a processor; a memory; and a processor. The processor is adapted to obtain information related to upcoming SMT jobs. Said processor in said automated Surface Mount Device (SMD) warehouse is adapted to perform the method steps described herein.

In yet another aspect of the technology disclosed, a computer program product comprising computer readable code configured to, when executed in a processor, perform any or all of the method steps described herein.

In yet another aspect of the technology disclosed, a non-transitory computer readable memory on which is stored computer readable code configured to, when executed in a processor, perform any or all of the method steps described herein.

In yet another aspect of the technology disclosed, a computer program product comprising computer readable code configured to, when executed in a processor, perform any or all of the method steps discussed herein.

In yet another aspect of the technology disclosed, a non-transitory computer readable memory on which is stored computer readable code configured to, when executed in a processor, perform any or all of the method steps described herein.

Pallets in an SMT System

When handling pallets in an SMT system there is a need to ensure that a component tape reel comprised in a pallet does not fall out at the same time as an identity tag attached to the component tape reel is scanned by an operator or actuator in automated Surface Mount Device (SMD) warehouse. In order for the processor in the automated Surface Mount Device (SMD) warehouse to maintain knowledge of the contents of stored bins, the identities of component tape reels comprised in the bins are determined.

One or more aspect of the technology discloses a method in a Surface Mount Technology (SMT) system for a pallet, wherein said pallet is configured with an attached identity tag in a predetermined position, wherein said pallet is adapted to comprise a component tape reel, the method comprising: gripping said bin load unit comprised in a bin; and scanning said identity tag.

In yet another aspect of the technology disclosed, gripping and scanning is performed by an actuator comprised in an automated Surface Mount Device (SMD) warehouse.

In yet another aspect of the technology disclosed, gripping and scanning is performed by an operator of the SMT system.

A problem when handling component tape reels in an automated Surface Mount Device (SMD) warehouse and in a pick and place machine is that the component tape reels vary in size and therefore require different receptacle arrangements for different reel sizes. This may be solved by using a pallet configured to handle varying component tape reel sizes.

Yet another problem is that the identity label of a component tape reel comprised in a pallet may be difficult or even impossible to scan.

Yet another problem identified by the inventors is to retain or comprise a component tape reel in a pallet, while the reel is able to rotate freely.

Yet another aspect of the technology discloses a pallet for use in a Surface Mount Technology (SMT) system, said pallet comprises a backplane structure adapted to provide support to a component tape reel, said pallet is further adapted to hold or carry a component tape reel by providing a component tape reel retainer structure for keeping or retaining the component tape reel attached to, or contained in, the pallet, said pallet is further configured to provide an opening for enabling the scanning of a barcode on a component tape reel that is attached to, or contained in, the pallet.

A component tape reel is used together with an SMT feeder, when used in operation or production of an SMT pick and place machine. In the present invention, the component tape on a component tape reel is typically threaded in an SMT feeder and the component tape reel identity is associated to the SMT feeder identity in the SMT information database. Handling of components in an SMT system can therefore be improved by storing the component tape reel together with the SMT feeder in automated Surface Mount Device (SMD) warehouse, in particular handling of both in pallets in an SMT system.

In yet another aspect of the technology disclosed, said pallet is further adapted to comprise an SMT feeder for guiding the component tape of a component tape reel attached to, or contained in said pallet to the picking position of a SMT pick-and-place machine.

As an identity tag attached to the component tape reel can be scanned, a retaining arrangement is required.

In yet another aspect of the technology disclosed, said component tape reel structure is further configured to provide retaining support in a Z axis (normal) direction on at least one of a peripheral or close to the center of a component tape reel, and wherein said opening is an opening in said component tape reel retainer structure that is adapted to allow the scanning of an identity tag (arbitrarily placed) barcode on the side of a component tape reel attached to, or contained in, the pallet without blocking the scanning light beam of an pallet-external barcode scanner.

In yet another aspect of the technology disclosed, said component tape reel retainer structure is configured to provide support to a component tape reel contained in the pallet in a Z axis direction opposite the backplane, thereby enabling the pallet to retain a component tape reel attached to, or contained in, the pallet without pallet-external support to the reel when the pallet is positioned in a vertical upright position or upside down with the backside of the backplane facing up.

In yet another aspect of the technology disclosed, said component tape reel retainer structure provides a structure configured to allow a component tape reel to (freely) rotate while being attached to, or contained in, said pallet.

When handling the component tape reel, a common problem is to avoid unwinding of the component tape from the component tape reel, which leads to unwanted delays in the production of SMT production units in the SMT pick and place machine.

In yet another aspect of the technology disclosed, said component tape reel retainer structure further provides a structure for retaining a component tape reel in a radial direction and within an essentially fixed volume within said pallet when the component tape reel is rotating while being contained in said pallet.

In yet another aspect of the technology disclosed, said component tape reel retainer structure comprises at least one of a nave and a reel-peripheral support structure oriented to provide support to a component tape reel at, or close to, the periphery of a component taper reel attached to, or contained in, said pallet, and wherein said at least one of a nave and a reel-peripheral support structure is configured to provide retaining support for holding a component taper reel while not blocking the scanning of a barcode on the component tape reel attached to, or contained in, said pallet.

In yet another aspect of the technology disclosed, said at least one of nave and reel-peripheral support structure is adapted to retain a component tape reel in at least one of a Z axis (normal) or radial direction.

In yet another aspect of the technology disclosed, the pallet is adapted to suppress and/or prevent radial movement of a component taper reel attached to, or contained in, the pallet by providing holding support for keeping the center point of the component tape reel that is rotating within said pallet at a fixed, or essentially fixed, position also when the component tape reel is rotating within said pallet.

In yet another aspect of the technology disclosed, the pallet provides a component tape reel structure comprising an X axis component tape reel retainer, a Y axis component tape reel retainer and a Z axis component tape reel retainer, wherein said X, Y, Z axis retainers are adapted to allow said component tape reel to rotate freely within said pallet.

In one or more aspects of the technology disclosed, a Surface Mount Technology (SMT) system for a pallet, wherein said pallet is configured with an attached identity tag in a predetermined position, wherein said pallet is adapted to comprise a component tape reel, and the system adapted to perform the method steps described herein.

In yet another aspect of the technology disclosed, a computer program product comprising computer readable code is configured to, when executed in a processor, perform any or all of the method steps described herein In yet another aspect of the technology disclosed, a non-transitory computer readable memory on which is stored computer readable code is configured to, when executed in a processor, perform any or all of the method steps described herein There is a need to be able to scan identity tags of pallets comprised in a bin in an automated Surface Mount Device (SMD) warehouse as well as when inserted in an SMT pick and place machine. This enables automatic scanning of a plurality of pallets comprised in a bin when returning the bin to an automated Surface Mount Device (SMD) warehouse. This also enables manual operator scanning of a plurality of pallets in a bin inserted in an SMT pick and place machine.

One or more aspect of the technology disclosed provides a method in a Surface Mount Technology (SMT) system for scanning of a plurality of pallets comprising an identity tag scanner and an SMT information database, wherein said pallet is comprised in and vertically oriented in a bin, and wherein said pallet has an pallet identity tag attached to the pallets upwards facing surface. In this example, the system is configured to scan individual identity tags attached to pallets comprised in said bin to obtain pallet ID's.

In yet another aspect of the technology disclosed, a pallet of said pallets comprise at least a component tape reel.

In yet another aspect of the technology disclosed, scanning is performed by an actuator in an automated Surface Mount Device (SMD) warehouse.

Yet another aspect of the technology disclosed provides a method in a Surface Mount Technology (SMT) system for scanning of a plurality of pallets comprising an identity tag scanner and an SMT information database, wherein said pallet is comprised in and vertically oriented in a bin, and wherein said pallet has an pallet identity tag attached to the pallets upwards facing surface. In this example, the system is configured to scan individual identity tags attached to pallets comprised in said bin to obtain pallet ID's.

In yet another aspect of the technology disclosed, a pallet of said pallets comprise at least a component tape reel.

In yet another aspect of the technology disclosed, scanning is performed by an operator of the SMT system.

Yet another aspect of the technology disclosed provides a pallet for use in a Surface Mount Technology (SMT) system, said pallet comprising a backplane structure adapted to provide support to a component tape reel attached to, or contained in, said pallet, wherein said pallet is further adapted to hold or carry a component tape reel by providing a component tape reel retainer structure for keeping or retaining the component tape reel attached to, or contained in, the pallet, wherein said pallet is configured with an attached identity tag (in form of a barcode) associating said pallet with an identity, wherein said pallet is adapted to comprise a component tape reel.

In yet another aspect of the technology disclosed, said pallet identity tag is attached to the pallets upwards facing surface when the said pallet is comprised in and vertically oriented in a bin.

In yet another aspect of the technology disclosed, a Pallet-ID is a tag in a predetermined (well-defined) position known to a barcode scanner/reading unit.

In yet another aspect of the technology disclosed, a Pallet-ID is a tag configured to be scanned from above, known to a barcode scanner and/or robot in a SMT Warehouse.

In yet another aspect of the technology disclosed, a Pallet-ID is a tag that may be easily scanned by an operator when placed in a pick and place machine.

In yet another aspect of the technology disclosed, wherein said pallet is further configured to provide an opening for enabling the scanning of a barcode on a component tape reel that is attached to, or contained in, the pallet.

In yet another aspect of the technology disclosed, said pallet is further adapted to comprise an SMT feeder for guiding the component tape of a component tape reel attached to, or contained in, said pallet to the picking position of a SMT pick-and-place machine.

Yet another aspect of the technology disclosed provides a computer program product comprising computer readable code configured to, when executed in a processor, perform any or all of the method steps described herein.

Yet another aspect of the technology disclosed provides a non-transitory computer readable memory on which is stored computer readable code configured to, when executed in a processor, perform any or all of the method steps described herein.

Yet another aspect of the technology disclosed provides a computer program product comprising computer readable code configured to, when executed in a processor, perform any or all of the method steps described herein.

Yet another aspect of the technology disclosed provides a non-transitory computer readable memory on which is stored computer readable code configured to, when executed in a processor, perform any or all of the method steps described herein.

Figure 4:
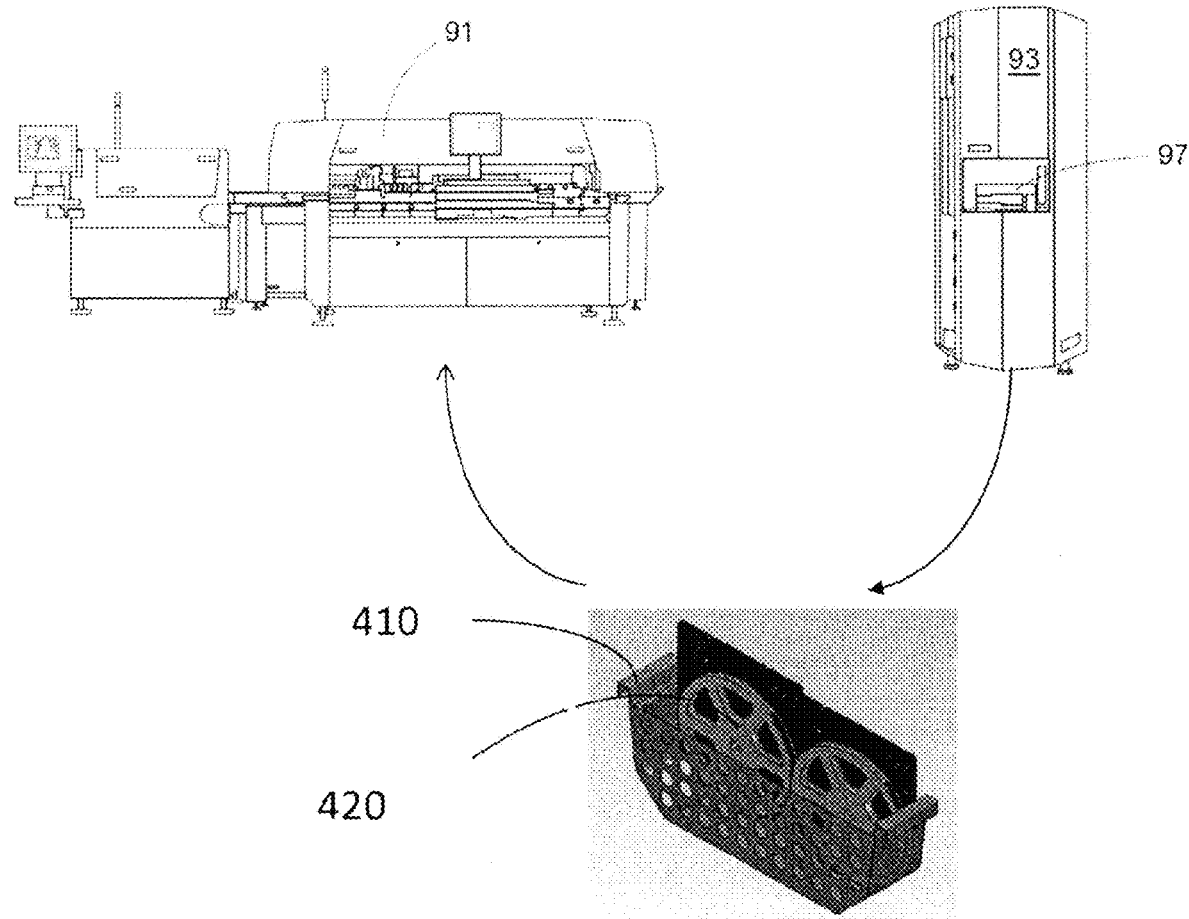
FIG. 4 shows an example of the technology disclosed where bins, which are pre-loaded based on upcoming SMT jobs are retrieved at an automated surface mount device (SMD) warehouse and inserted into a component feeding position of the SMT pick and place machine.

FIG. 4 shows illustrates an example embodiment of a method in a Surface Mount Technology (SMT) system comprising an automated Surface Mount Device (SMD) warehouse 93, an SMT information database and a SMT pick and place machine 91. In this example, the method comprises: receiving input data; retrieving a bin 410 based on said input data and a parameter representing a position within said automated Surface Mount Device (SMD) warehouse, wherein said bin 410 is adapted to comprise bin load units 420, wherein said bin load unit 420 comprises at least a component tape reel; presenting said retrieved bin 410 at a port 97 of said automated Surface Mount Device (SMD) warehouse; and loading said bin 410 in said SMT pick and place machine 91.

Figure 5:
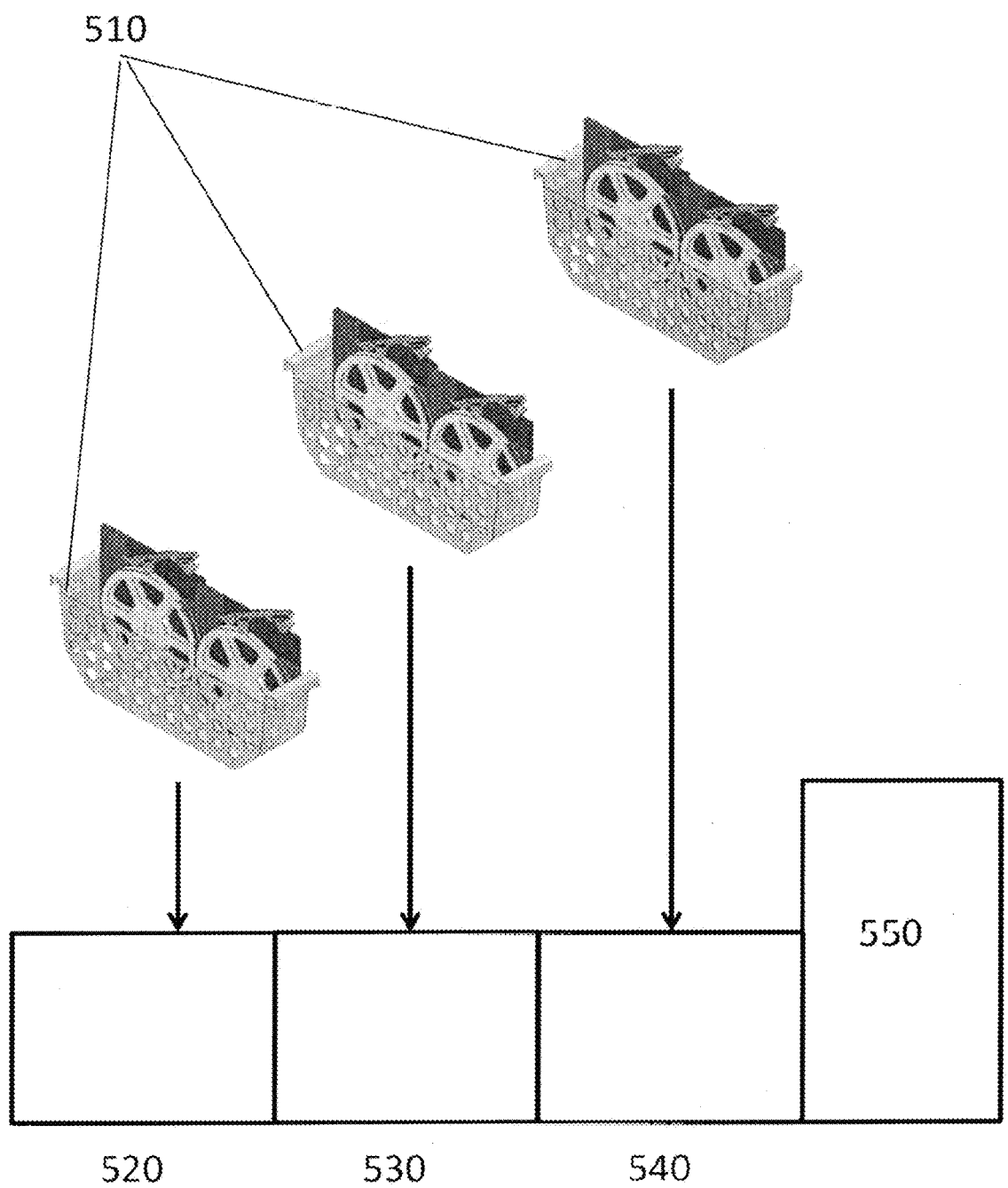
FIG. 5 shows an example where bins that are pre-loaded based on upcoming SMT jobs are inserted into a component feeding position of the SMT pick and place machine.

FIG. 5 shows a schematic view of pre-loaded bins 510 (e.g., pre-loaded based on component requirements of an upcoming SMT job) being inserted or loaded into component feeding positions 520, 530 and 540 of the pick and place machine 550.

To pre-load the bins to improve, optimize or prepare for presentation at a port of the automated Surface Mount Device (SMD) warehouse based on upcoming SMT jobs, thereby ensuring that the components required for production of an SMT production unit are present when the bin is presented, the bin load units are redistributed within the same bin or between two or more different bins. The advantage is that bins can be pre-loaded for upcoming SMT jobs, and the retrieval time in the tower can be reduced by placing bins required for the next upcoming SMT job close to the port and certain components can be distributed in different automated Surface Mount Device (SMD) warehouses.

In some embodiments, the bins might comprise pallets that in turn comprise component tape reels and optionally a matching SMT feeder.

In some aspect of the technology disclosed, the bin might be adapted with an alphanumerical display controller that is adapted to receive display data by wired or wireless communication, wherein the data might be relating to an upcoming SMT job and displayed to the operator. The data may include: the position at the pick and place machine where the bin should be inserted; time or date; the number of remaining components remaining in the bin; an alert to replace the bin or manually refill the bin with bin load units; or other alarm conditions relating to production of SMT production units.

The information (e.g., component requirements) used to pre-load bins and present bins at a port of the automated Surface Mount Device (SMD) warehouse might be entered by the operator via a input/output device comprised in the automated Surface Mount Device (SMD) warehouse or obtained from the SMT information database, either actively retrieved by request/reply or pushed from the SMT information database or other node connected to the communication network.

When the automated Surface Mount Device (SMD) warehouse receives a bin, the processor comprised in the automated Surface Mount Device (SMD) warehouse stores, in a memory, the position at which the bin is stored to a memory (e.g., in automated Surface Mount Device (SMD) warehouse).

The automated Surface Mount Device (SMD) warehouse comprises one or several actuators, such as a robot, robot arm or other actuator, as would be understood by a person skilled in the art. The actuators are able to redistribute bins or bin load units within the automated Surface Mount Device (SMD) warehouse or between connected automated Surface Mount Device (SMD) warehouses.

In some aspect of the technology, disclosed bins might be brought to a designated intermediate redistribution area where bin load units might be redistributed within or between two or more bins.

In some aspect of the technology disclosed, more than one actuator might be comprised in the automated Surface Mount Device (SMD) warehouse, thereby enabling insertion in fully loaded bins, for example, by first removing a first bin load unit with a first actuator and filling the empty position in the same bin with another bin unit by a second actuator, similar to how a human being would redistribute bin load units between bins. Obviously, the process might involve one two or several bins until the redistribution is complete.

Figure 8A:
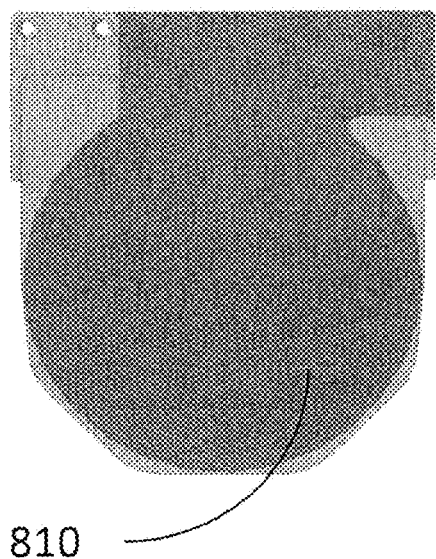
FIG. 8A shows an example of a pallet.

FIG. 8a shows an example of a pallet 810.

Figure 8B:
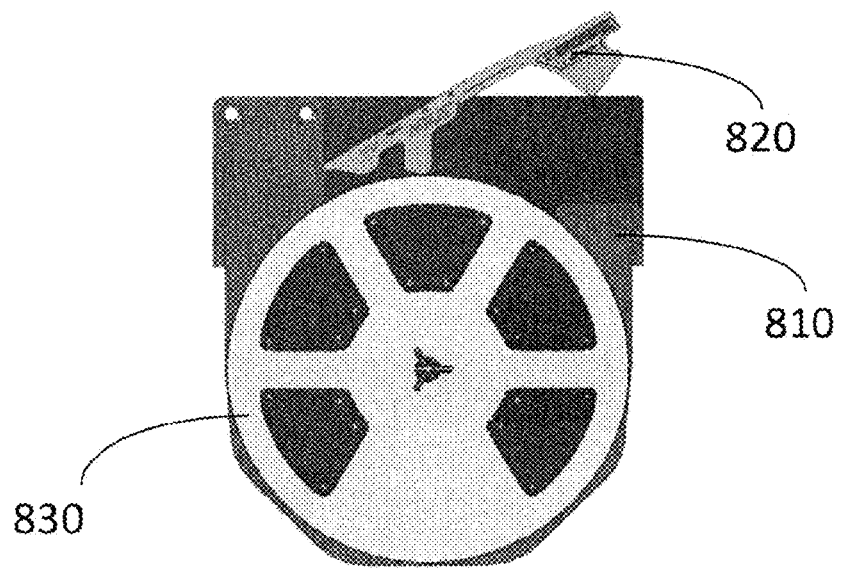
FIG. 8B shows an example of a pallet comprising a component tape reel and an SMT feeder.

FIG. 8b shows an example of a pallet 810 comprising a component tape reel 830 and an SMT feeder 820.

Figure 9:
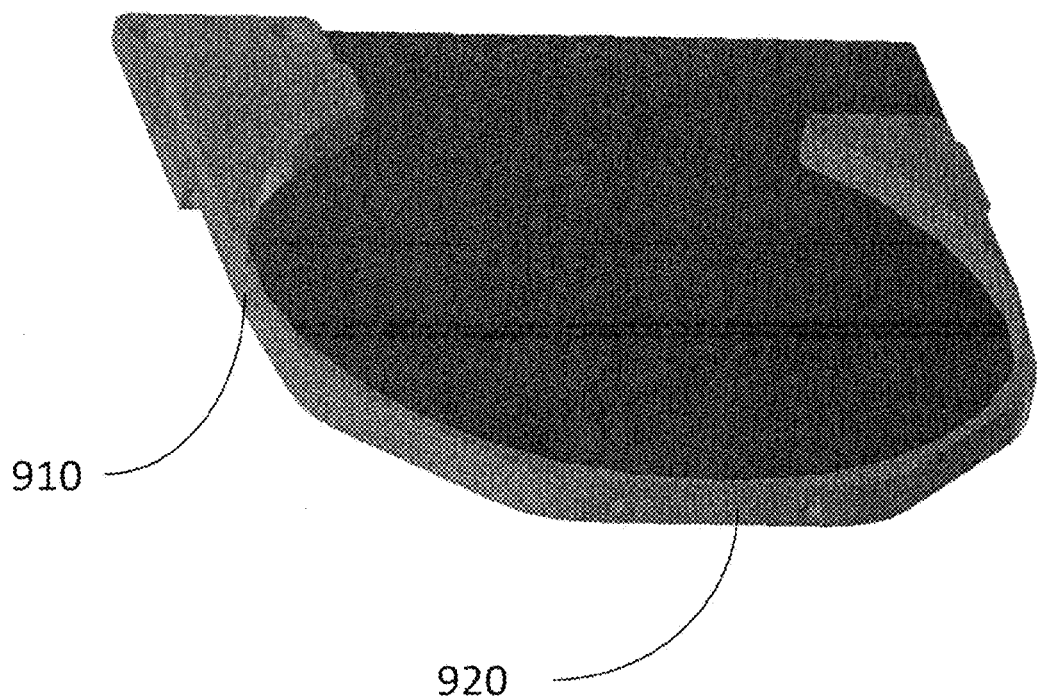
FIG. 9 shows an example of a pallet adapted with an X axis component tape reel retainer and a Y axis component tape reel retainer, wherein said X, Y, Z axis retainers are adapted to allow said component tape reel rotate.

FIG. 9 shows an example of a pallet, wherein said pallet is adapted to comprise a backplane, an X axis component tape reel retainer 910, and a Y axis component tape reel retainer 920. The X and Y axis retainers 910 and 920 are adapted to allow said component tape reel to rotate. The retainers 910 and 920 restrict movement of a component tape reel along the X axis and Y axis.

Figure 10A:
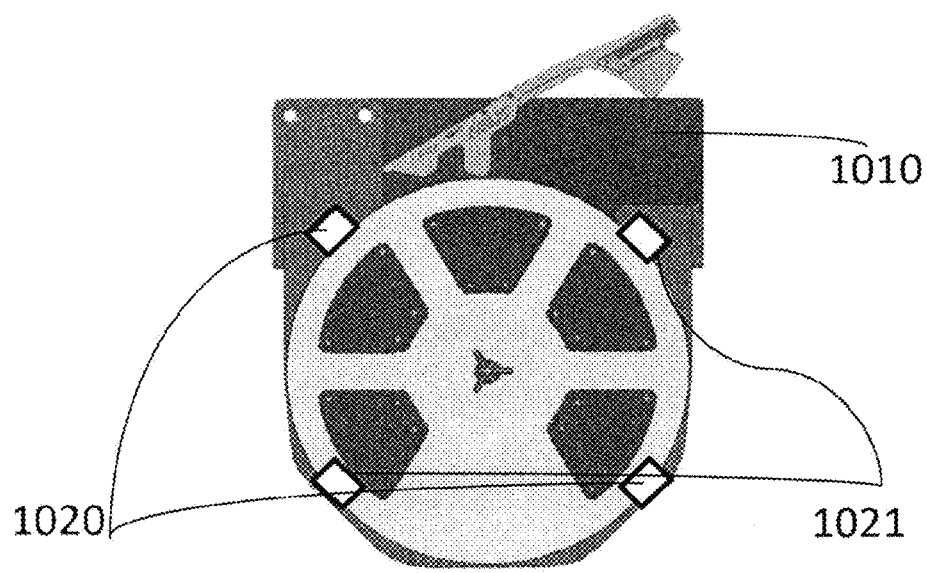
FIG. 10A shows an example of a pallet adapted with a Z-axis component tape reel retainer, wherein the Z-axis component tape reel retainer comprises a backplane and a peripheral Z-axis component tape reel retainer.

FIG. 10a shows an example of a pallet, wherein said pallet is adapted to comprise a backplane 1010, a combined reel-peripheral support structure in the form of an X axis component tape reel retainer, a Y axis component tape reel retainer 1 and a Z axis component tape reel retainer 1020/1021, wherein said X, Y, Z axis retainers are adapted to allow said component tape reel rotate. The retainers restrict movement of a comprised component tape reel along the X-axis, Y-axis and Z-axis.

Figure 10B:
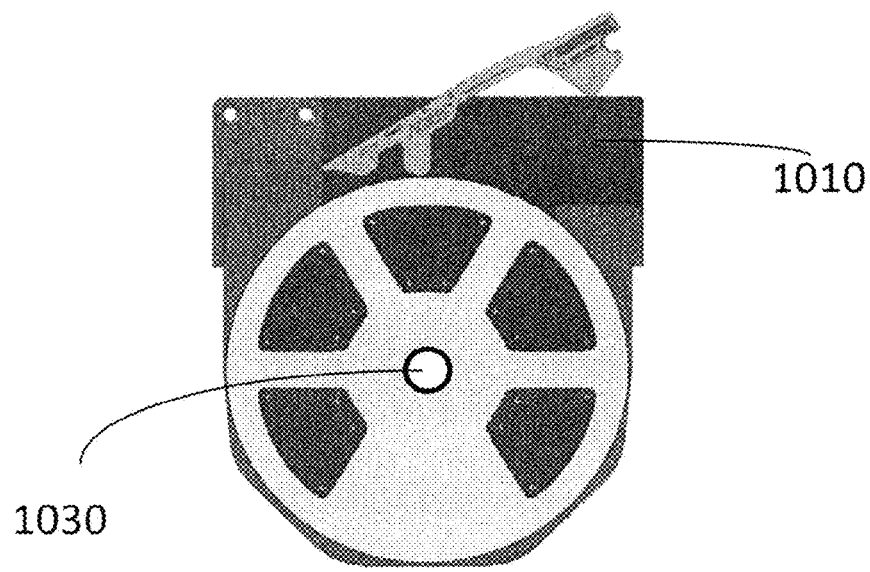
FIG. 10B shows an example of a pallet adapted with a Z-axis component tape reel retainer, wherein the Z-axis component tape reel retainer comprises a backplane and a central Z-axis component tape reel retainer.

FIG. 10b shows yet an example embodiment of the invention, wherein said Z-axis component tape reel retainer comprises a backplane and a nave or central Z-axis component tape reel retainer 1030. In yet another aspect of the technology disclosed said Z-axis component tape reel retainer comprises a backplane and a central Z-axis component tape reel retainer.

Figure 12A:
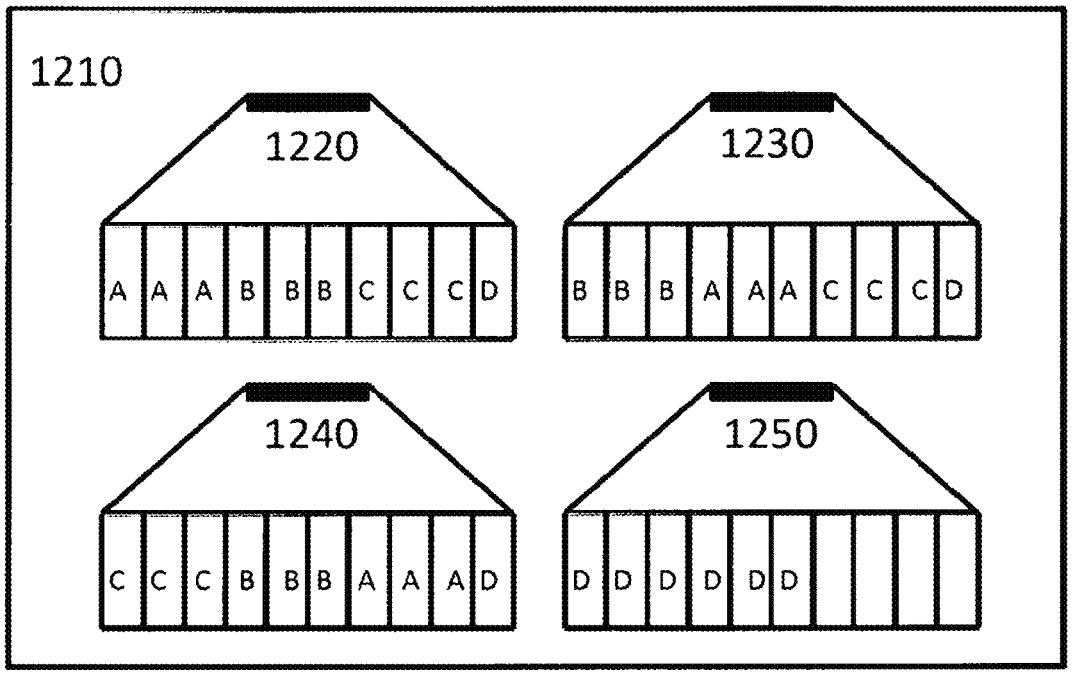
FIG. 12A and FIG. 12B shows schematically how bin loading units are redistributed between two or more stored bins in the automated Surface Mount Device (SMD) warehouse (e.g., based on component requirements of upcoming SMT jobs).
Figure 12B:
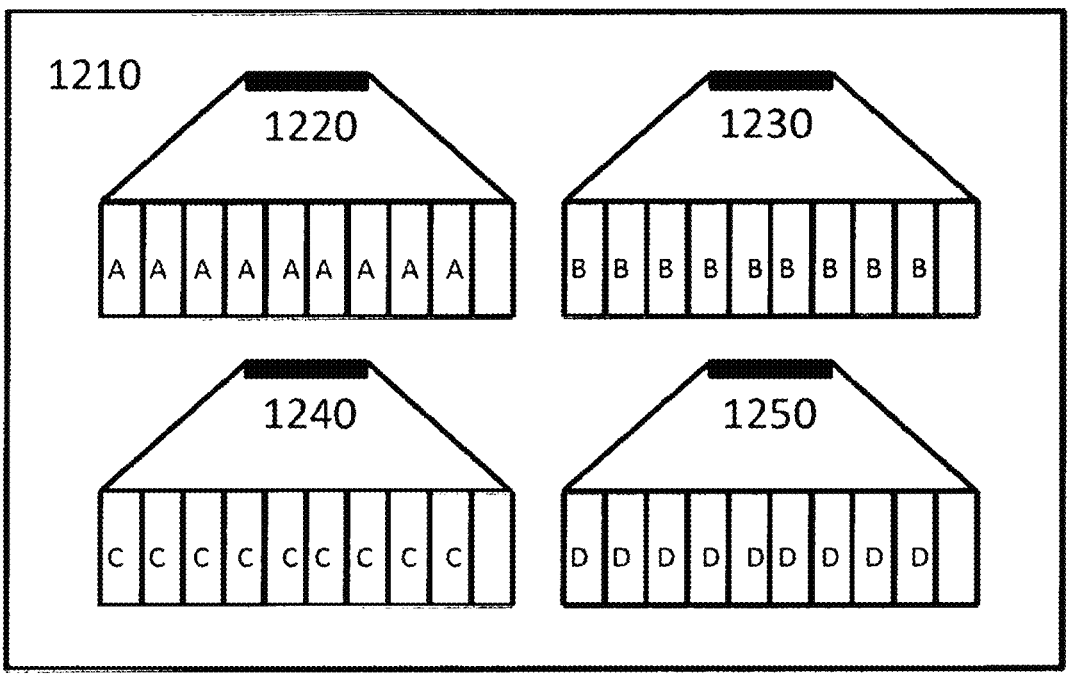

FIGS. 12a and 12b shows schematically how in an embodiment, bin loading units, denoted by letters A-D in FIGS. 12a and 12b, are redistributed among two or more stored bins in the automated Surface Mount Device (SMD) warehouse based on, for example, component requirements of upcoming SMT jobs.

In this example, FIG. 12b illustrates how bins 1220-1250 are pre-loaded based on the component requirements of upcoming SMT jobs (e.g., job A, job B, job C and job D), and FIG. 12a illustrates the bin loading units after being redistributed among the two or more stored bins in the automated SMD warehouse according to the upcoming SMT jobs.

FIG. 13 shows an example of how bin loading units may be redistributed between two or more stored bins in the automated Surface Mount Device (SMD) warehouse (e.g., by being brought to a designated intermediate redistribution area where bin load units might be redistributed).

Referring to FIG. 13, the actuator or robotic arm 13104 of the automated Surface Mount Device (SMD) warehouse grips a load unit 13103 in a first bin 13101 and moves the load unit 13103 to a compartment in a second bin 13102 as illustrated by image sequence 1310 through 1370 in FIG. 13.

Figure 14A:
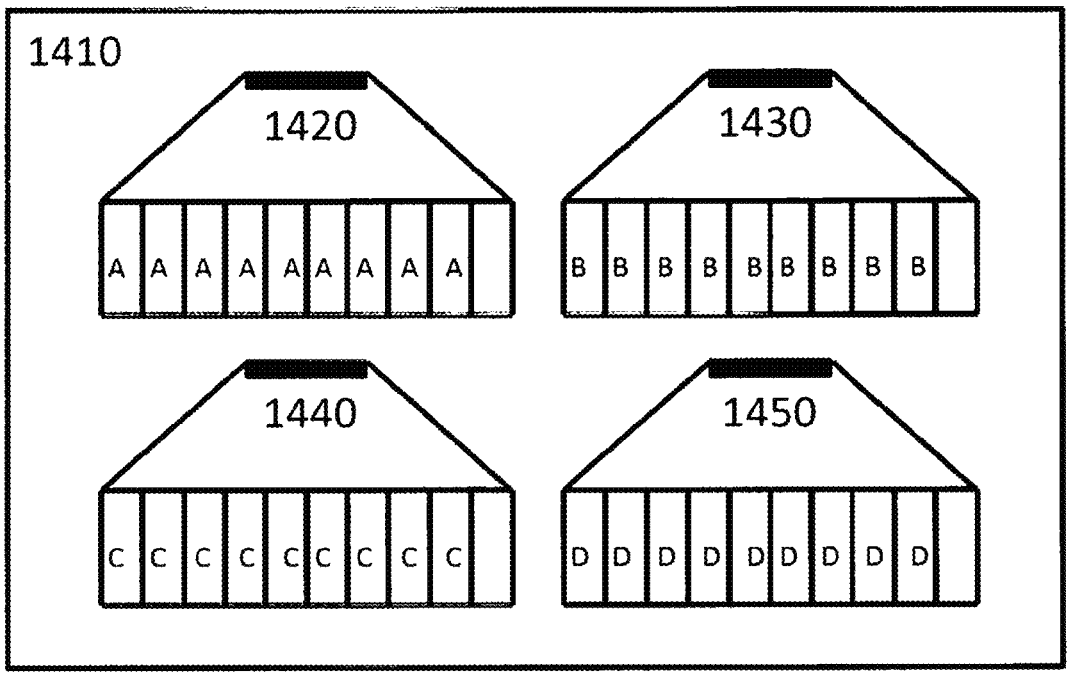
FIGS. 14A and 14B shows schematically how bins are redistributed between positions in the automated Surface Mount Device (SMD) warehouse (e.g., based on component requirements of upcoming SMT jobs).
Figure 14B:
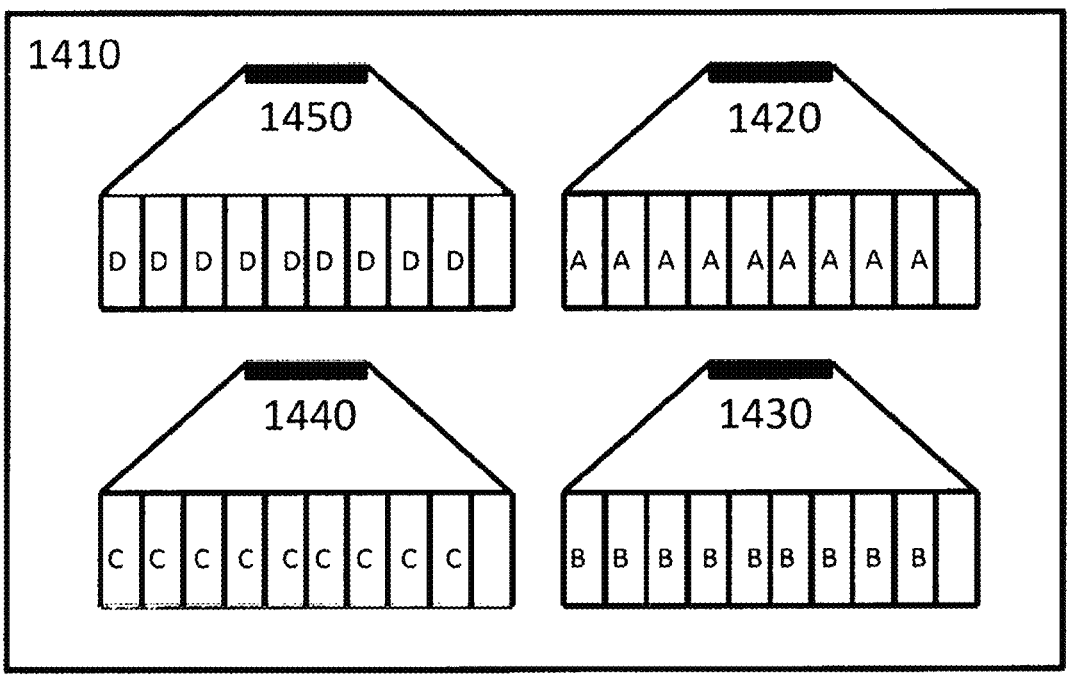

FIGS. 14a and 14b shows an example of how bins may be redistributed between positions in the automated Surface Mount Device (SMD) warehouse based on component requirements of upcoming SMT jobs. In one example, a SMT job list or sequence of job D, job A, job C and job B are to be performed. By redistributing the bins from the arrangement shown in FIG. 14a to the arrangement shown in FIG. 14b, the retrieval time for the bin pre-loaded for SMT job D can be reduced as the distance to the port is reduced.

Figure 16:
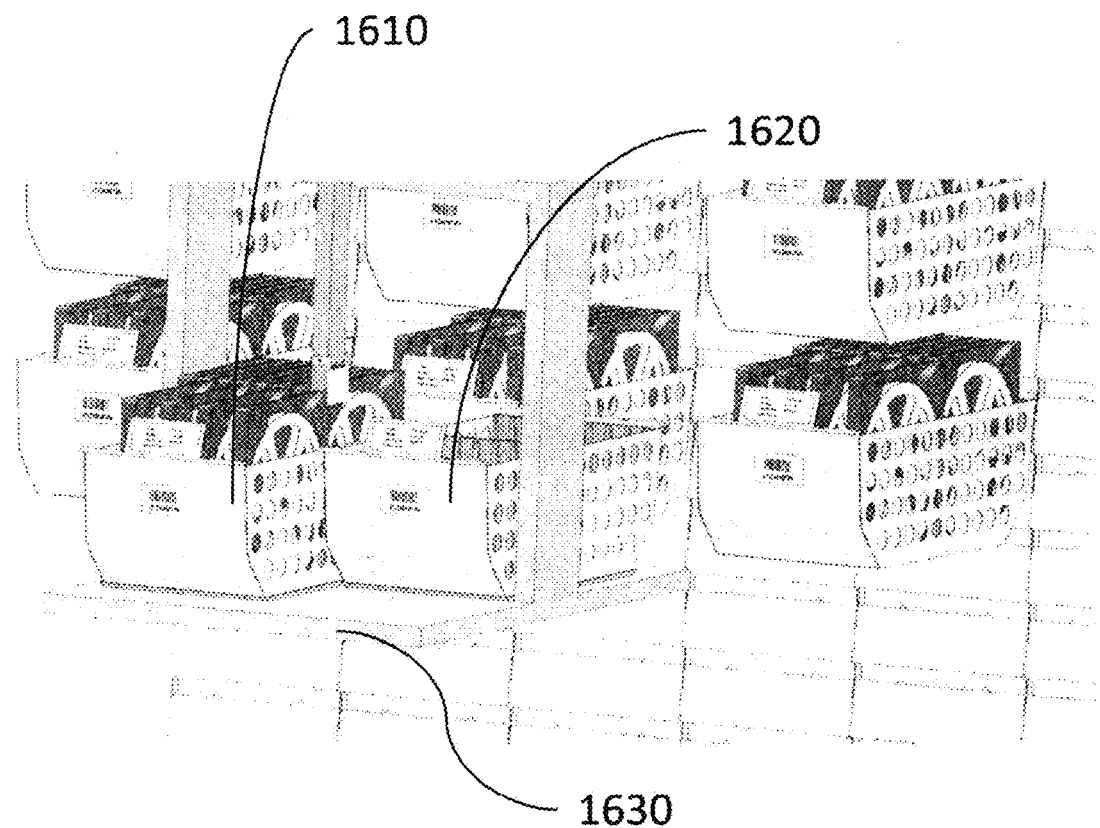
FIG. 16 shows schematically how bin load units are automatically redistributed between positions in the automated Surface Mount Device (SMD) warehouse using a table.

FIG. 16 shows an example of how bin load units are automatically redistributed between positions in the automated Surface Mount Device (SMD) warehouse using a table 1630.

Referring to FIG. 16, a first stored bin 1610 is retrieved to the table 1630 attached to an actuator in said automated Surface Mount Device (SMD) warehouse, and said actuator is moved to a position of a second stored bin 1620 within said automated Surface Mount Device (SMD) warehouse.

The second bin 1620 is retrieved to the table 1630, and the bin load units are automatically redistributed between positions in the automated Surface Mount Device (SMD) warehouse using a table by redistributing bin load units from said first bin 1610 to said second bin 1620.

Figure 17A:
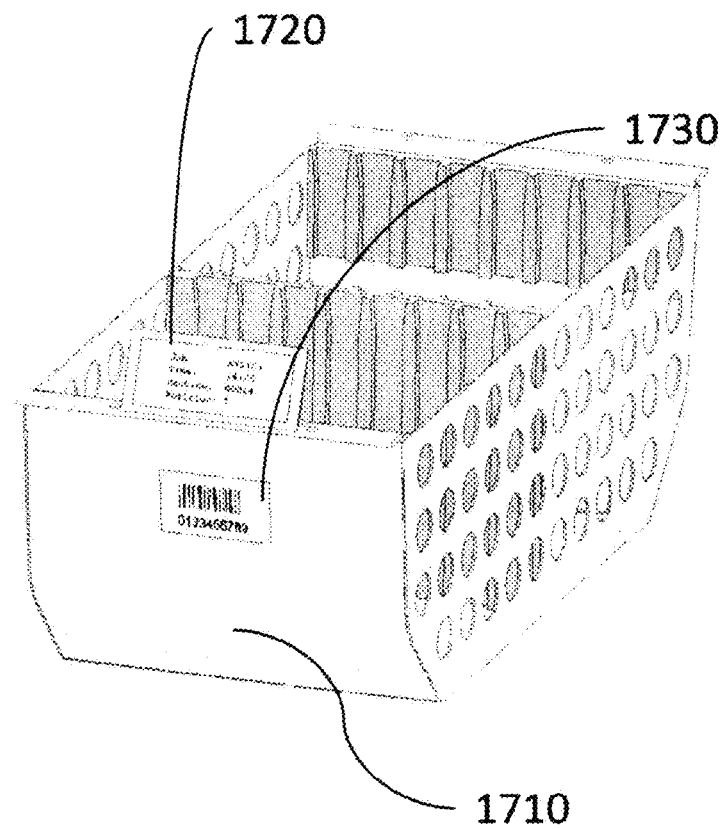
FIG. 17A shows an embodiment of the invention, wherein a bin is configured with an alphanumerical display with an integrated alphanumerical display controller and an identity tag attached to said bin such that a bin ID can be obtained.

FIG. 17*a* shows an embodiment of the invention, wherein a bin 1710 is configured with an alphanumerical display 1720 with an integrated alphanumerical display controller, and an identity tag 1730 attached to the bin 1710 such that a bin ID can be obtained. In one example, this identity tag 1730 is a barcode.

Figure 17B:
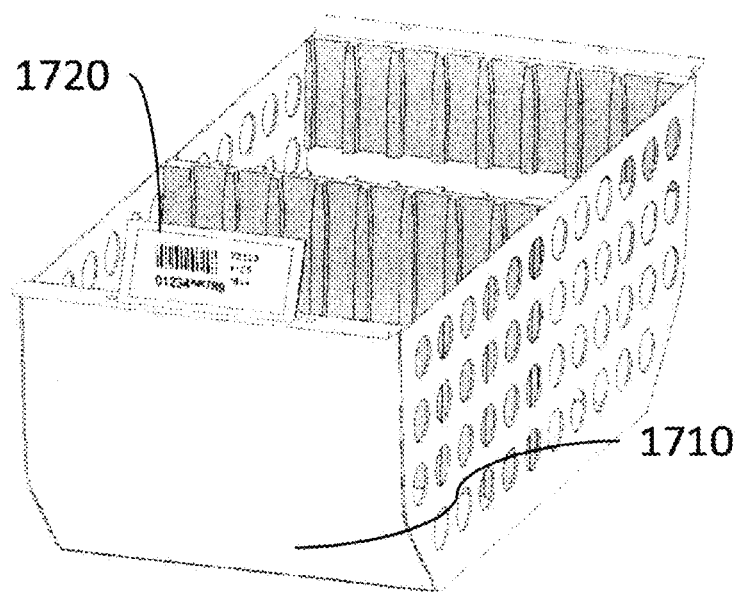
FIG. 17B shows yet an embodiment of the invention, wherein a bin is configured with an alphanumerical display with an integrated alphanumerical display controller, wherein display data comprises a bin ID.

FIG. 17*b* shows an embodiment of the invention, wherein a bin 1710 is configured with an alphanumerical display 1720 with an integrated alphanumerical display controller, wherein display data on the alphanumerical display comprises a bin ID, wherein said bin ID is presented as a barcode, QR code or the like. Thus, the alphanumerical display 1720 also functions as an identity tag of the bin. In one or more embodiment, the communications network ID of the alphanumerical display 1720, used to send data to and receive data from the alphanumerical display controller, is identical to the bin ID.

Figure 18:
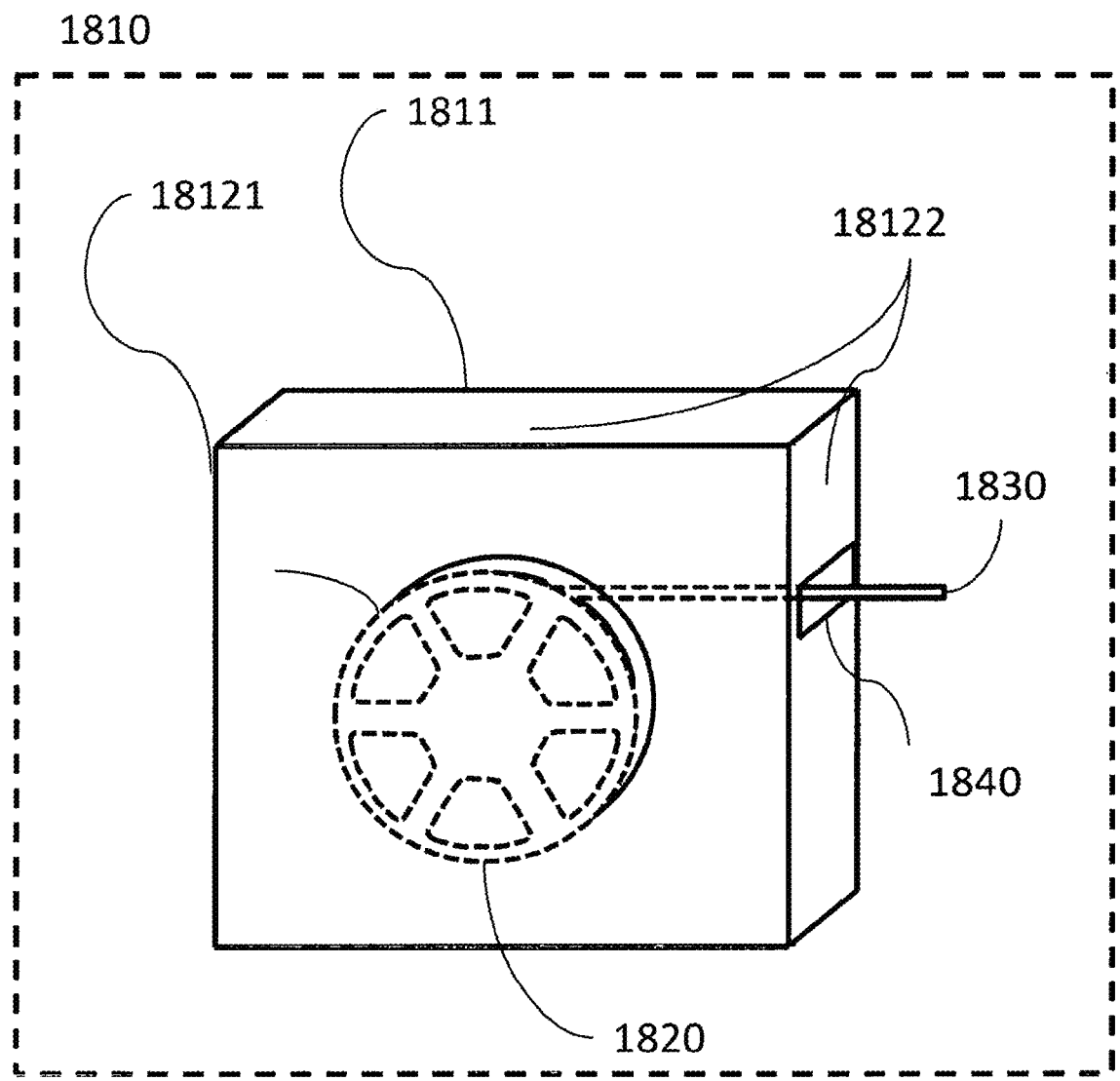
FIG. 18 shows an embodiment of a pallet, wherein the pallet comprises a backplane and a component tape reel retainer structure in the shape of a box.

FIG. 18 shows an embodiment of a pallet 1810.

Referring to FIG. 18, the pallet 1810 comprises a backplane 1811 and a component tape reel retainer structure in the shape of a box. The box is configured with a bottom 18121, four side walls 18122 and a slit 1840 configured to allow a component tape 1830 on a component tape reel 1820 protrude through the slit 1840. In one or more embodiments, the pallet 1810 further comprises a friction break (not shown) configured to engage upon removal of said palette from said SMT pick and place machine, hereby suppressing and/or preventing unwinding of the tape when the reel is no longer feeding components to a pick-and-place machine.

The inventors have realized that with the rising complexity of SMT production comes a greater need for quality data. High part number count, a wide variety of boards, and an ever-changing production schedule are constant challenges that require improved system support and control of information handling. Through embodiments presented herein, there is achieved efficiency and service level from a customer or operator point of view, in the performing any or all of the steps of planning, associating, loading, replenishing and/or unloading as part of an SMT production process.

FIGS. 19*a*-19*d* show schematically how planning, associating, loading, replenishment and unloading may be performed in accordance with a use case example of a typical workflow in a SMT system.

Referring to FIGS. 19*a*-19*d*, a planning user starts the workflow by planning an SMT job to be executed, and stores said SMT job in an SMT information database. In a use case example referring to FIG. 19*a*, a planning operator uses an SMT planning tool, for example, a graphical user interface of a computer program that is adapted to help the user optimize the job sequence and changeover strategy for incoming orders to plan an SMT job. The outcome of the planning is typically a bill of materials 1910 (also referred to herein as SMT job data). The bill of material/SMT job data is sent to the automated SMD warehouse 1912 (e.g., corresponding to the SMD warehouse 93 discussed herein).

In response to receiving the bill of materials/SMT job data, the automated SMD warehouse 1912 automatically delivers bin load units 1914 (e.g., in the form of any of the bin load units 420, 620, 630, 640, 650, 720 described herein). In this use case example, the bin load units 1914 are in the form of component tape reels. Typically, the bin load units delivered from the automated SMD warehouse are already in the correct order for loading into bins. An SMT operator (e.g., a human being or alternatively a robot) then retrieves the bin load units that are delivered from said automated Surface Mount Device (SMD) warehouse, and possibly also substrates from separate storage or from said automated Surface Mount Device (SMD) warehouse. In the use case example, the SMT operator retrieves component tape reels from the automated SMD warehouse 1912, and prepares the component tape reels for loading into the pick and place machine 1924. In order to be able to trace the component tape reels, the preparations include a step of associating the ID of each component tape reel with the ID of a feeder 1919. The SMT operator performs this association by scanning each component tape reel and a corresponding feeder using an identity tag scanner 1918. Through scanning of the unique IDs, the SMT system records the movement of the scanned components. Accordingly, components are automatically traced.

When the bin load units have been associated with the feeders, the SMT operator places the one or more associated component pairs into a bin 1920. The bin may, for example, correspond to any of the bins 410, 510, 610 or 710 discussed herein. When a bin is ready, the SMT operator places/loads the bin in the pick and place machine 1924. The pick and place machine may correspond to any of the pick and place machines (e.g., 91, 550) discussed herein.

Figure 19A:
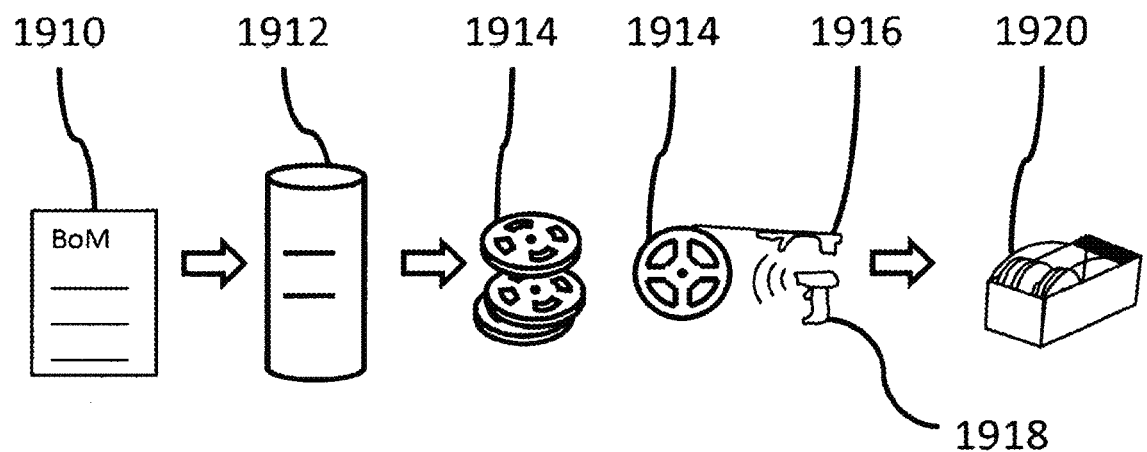
FIGS. 19A-19D show schematically how planning, associating, loading, replenishment and unloading may be performed in accordance with a use case example of a typical workflow in a SMT system.
Figure 19B:
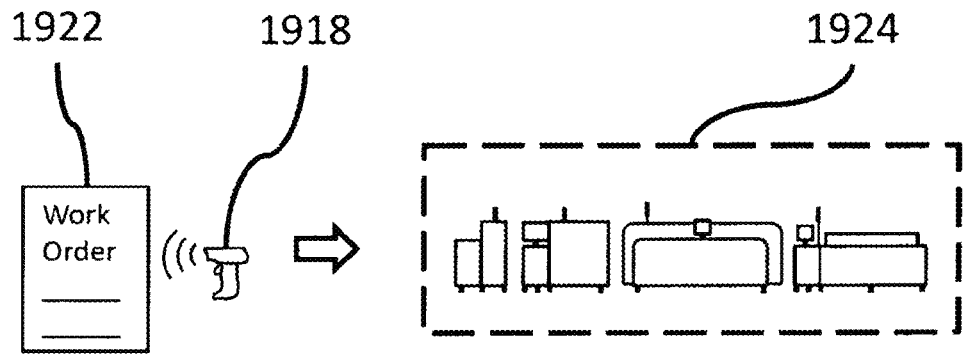

In order for the pick and place machine to know which settings are to be used, SMT job data from the planning step is provided to the pick and place machine, either directly from the planning tool or by the SMT operator scanning the barcode of a work order 1922, using a scanner 1918, comprising the required information/SMT job data. This is illustrated in FIG. 19*b*.

Based on the input SMT job data, machine programs are selected automatically, as are conveyor width and loader/unloader settings. In other words, loading into the pick and place machine is fast and easy for the SMT operator as it requires no manual data entry—just one or two scans of barcodes or other identifiers. As soon as the line is up and running, the SMT operator is free to start preparing the next SMT job. Also, as all bins and feeders are given a unique ID, the SMT operator can check quantity, location, MSD data and batch codes, for a single component or a complete component list for an SMT job, at any point during production.

Figure 19C:
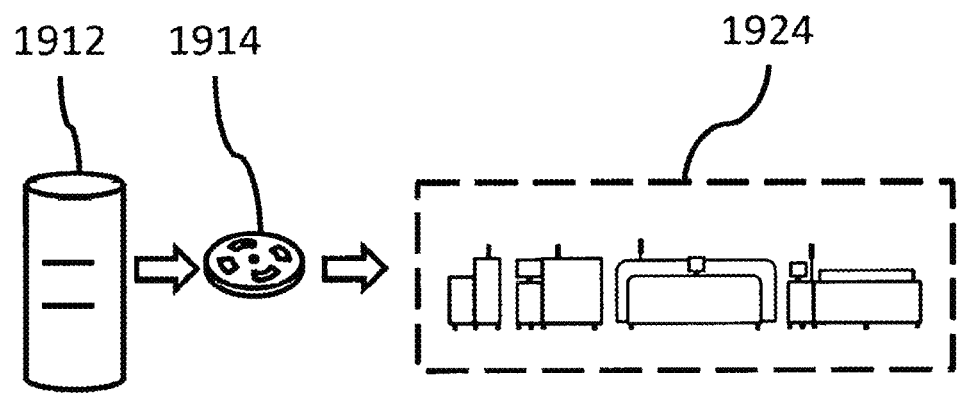

If, at any time, components are about to run out, the machine alerts the operator, re-optimizes and continues mounting other components. The SMT operator that notices such an alert may, for example, press a "provide" button or the like, whereby the SMD warehouse 1912 immediately delivers the requested component/components 1914 for the SMT operator to retrieve, associate and load into the pick and place machine 1924 to replenish the machine. This is illustrated in FIG. 19*c*. Advanced SMT system of today, such as the system embodiments described herein, may also have a plug-and-play simplicity, which means that the SMT operator can load and unload bins in seconds, saving countless hours of operator time. Specially designed software automatically recognizes the presence, absence and location of components, which means that there is no need to program pick positions and production does not stop if a bin runs out of parts.

Figure 19D:
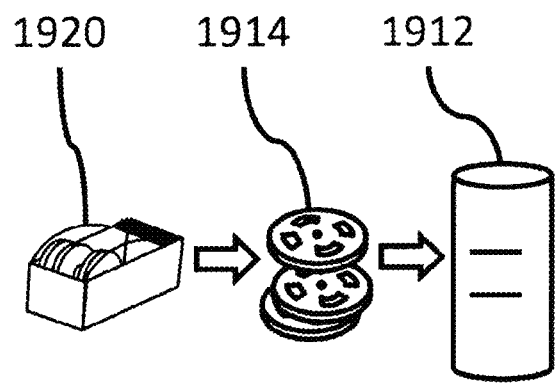

As illustrated in FIG. 19*d*, when an SMT job is done, or when the work day ends, the SMT operator unloads the bins 1920 from the pick and place machine, removes the component tape reels 1914 from the bin and places them back into an SMD warehouse 1912, which can be the same as the one from where the components where retrieved or a different one. As each component has an identifier, the system keeps track of the components and mix-ups are avoided.

Embodiments of the invention may improve parts or all of the SMT production workflow, as further described herein.

Figure 3:
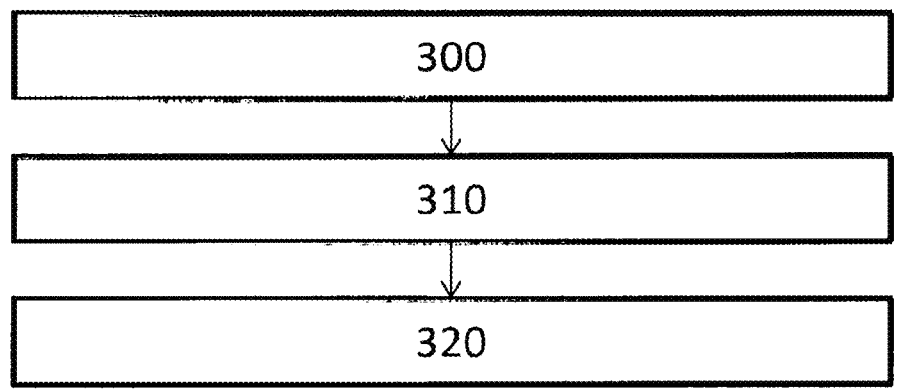
FIG. 3 shows a method in an SMT system for presenting a retrieved bin at a port of an automated Surface Mount Device (SMD) warehouse.

FIG. 3 shows a method for presenting a retrieved bin at a port of an automated Surface Mount Device (SMD) warehouse in Surface-mount technology (SMT) system. In more detail, FIG. 3 shows an example of the technology disclosed in the form of a method in an automated Surface Mount Device (SMD) warehouse adapted to obtain information related to upcoming SMT jobs, to store bins at predetermined positions within said automated Surface Mount Device (SMD) warehouse and to retrieve bins at predetermined positions within said automated Surface Mount Device (SMD) warehouse, wherein said bins are adapted to comprise bin load units, wherein said bin load unit comprises at least a component tape reel.

Referring to FIG. 3, at 300 the automated Surface Mount Device (SMD) warehouse receives input data. At 310, the automated Surface Mount Device (SMD) warehouse retrieves a bin based on said input data and a parameter representing a position within said automated Surface Mount Device (SMD) warehouse. In at least this example, said bin is adapted to comprise bin load units, wherein said bin load unit comprises at least a component tape reel. At 320, the automated Surface Mount Device (SMD) warehouse presents said retrieved bin at a port of said automated Surface Mount Device (SMD) warehouse.

In one non-limiting example, the input data received at 300 may be descriptive of one or more sets of components, component 1, component 2, . . . component P. A bin is retrieved based on said input data and a parameter representing a position within said automated Surface Mount Device (SMD) warehouse. In one example, the parameter may be comprised in a data structure stored in the SMD warehouse, such as a table, descriptive of a component tape identity, bin identity or pallet ID and a position within said SMD. Example parameters are shown below in Table 1.

TABLE 1

| Identity | X-position | Y-position | Z-Position |
|---|---|---|---|
| Component tape Identity 1 | X1 | Y1 | Z1 |
| Component tape Identity 2 | X2 | Y2 | Z2 |
| Component tape Identity 3 | X3 | Y3 | Z3 |
| Component tape Identity 4 | X4 | Y4 | Z4 |

In another example, the parameter may be comprised in a data structure, such as a table, descriptive of a component tape identity, bin identity, pallet ID, and/or a position within said SMD. An example in which the parameter includes a shelf ID is shown below in Table 2.

TABLE 2

| Identity | Shelf ID |
|---|---|
| Component tape Identity 1 | S1 |
| Component tape Identity 2 | S2 |
| Component tape Identity 3 | S3 |
| Component tape Identity 4 | S4 |

The X, Y, Z position or the shelf ID of the component tape may be obtained by performing a look-up in the parameter table based on the input data to obtain the position within said automated SMD warehouse (e.g., (X1,Y1,Z1), (Shelf 34), etc.). The bin or bins located at the obtained position within said automated SMD warehouse are then retrieved and presented at a port of said automated Surface Mount Device (SMD) warehouse.

The automated Surface Mount Device (SMD) warehouse may further comprise an input/output interface and said input data is received from said input/output interface based on an operator indication of an upcoming SMT job.

In one example, an operator enters the identity of an upcoming SMT job, and the automated Surface Mount Device (SMD) warehouse retrieves or receives the identities of components associated with, comprised in or required in the upcoming SMT job from said SMT information database, such as component tape reel identity or pallet identity. The X, Y, Z position or the shelf ID may be obtained by performing a look-up in the parameter table based on the retrieved or received identities of components to obtain the position within said automated SMD warehouse, (e.g., (X1,Y1,Z1), (Shelf 34), etc.). The bin or bins located at the obtained position within said automated SMD warehouse are then retrieved and presented at a port of said automated Surface Mount Device (SMD) warehouse.

In one or more examples of the technology disclosed, said input data is received or retrieved from an SMT information database and said input data is associated with or included in an upcoming SMT job.

In one example, the input data descriptive of an upcoming SMT job is pushed by or received from the SMT information database via the communications network, the automated Surface Mount Device (SMD) warehouse retrieves or receives the identities of components associated with, comprised in or required in, the upcoming SMT job from said SMT information database, such as component tape reel identity or pallet identity. The X, Y, Z position or the shelf ID is obtained by performing a look-up in the parameter table based on the retrieved or received identities of components to obtain the position within said automated SMD warehouse (e.g., (X1,Y1,Z1), (Shelf 34), etc.). The bin or bins located at the obtained position within said automated SMD warehouse is then retrieved and presented at a port of said automated Surface Mount Device (SMD) warehouse.

In one or more examples of the technology disclosed, said parameter represents a position within said automated Surface Mount Device (SMD) warehouse, and is retrieved from a memory in said automated Surface Mount Device (SMD) warehouse.

In one example the parameter representing a position within said automated Surface Mount Device (SMD) warehouse is an X, Y, Z position and/or the shelf ID, and is obtained or retrieved by performing a look-up in a parameter table based on the retrieved and/or received identities of components to obtain the position within said automated SMD warehouse (e.g., (X1,Y1,Z1), (Shelf 34), etc.).

In yet another embodiment, there is provided a method in an automated Surface Mount Device (SMD) warehouse adapted to obtain information related to upcoming SMT jobs, to store bins at predetermined positions within said automated Surface Mount Device (SMD) warehouse and to retrieve bins at predetermined positions within said automated Surface Mount Device (SMD) warehouse. Said bins are adapted to comprise bin load units, and said bin load units comprise at least a component tape reel. The method comprises: receiving at least one of input data and a parameter representing a position within said automated Surface Mount Device (SMD) warehouse; retrieving a bin loaded with a plurality of bin load units from said position within said automated SMD warehouse at least partly based on said at least one of input data and/or a parameter representing said position within said automated Surface Mount Device (SMD) warehouse; and presenting said retrieved bin at, or close to, an output port, such as an opening, of said automated Surface Mount Device (SMD) warehouse.

Figure 20:
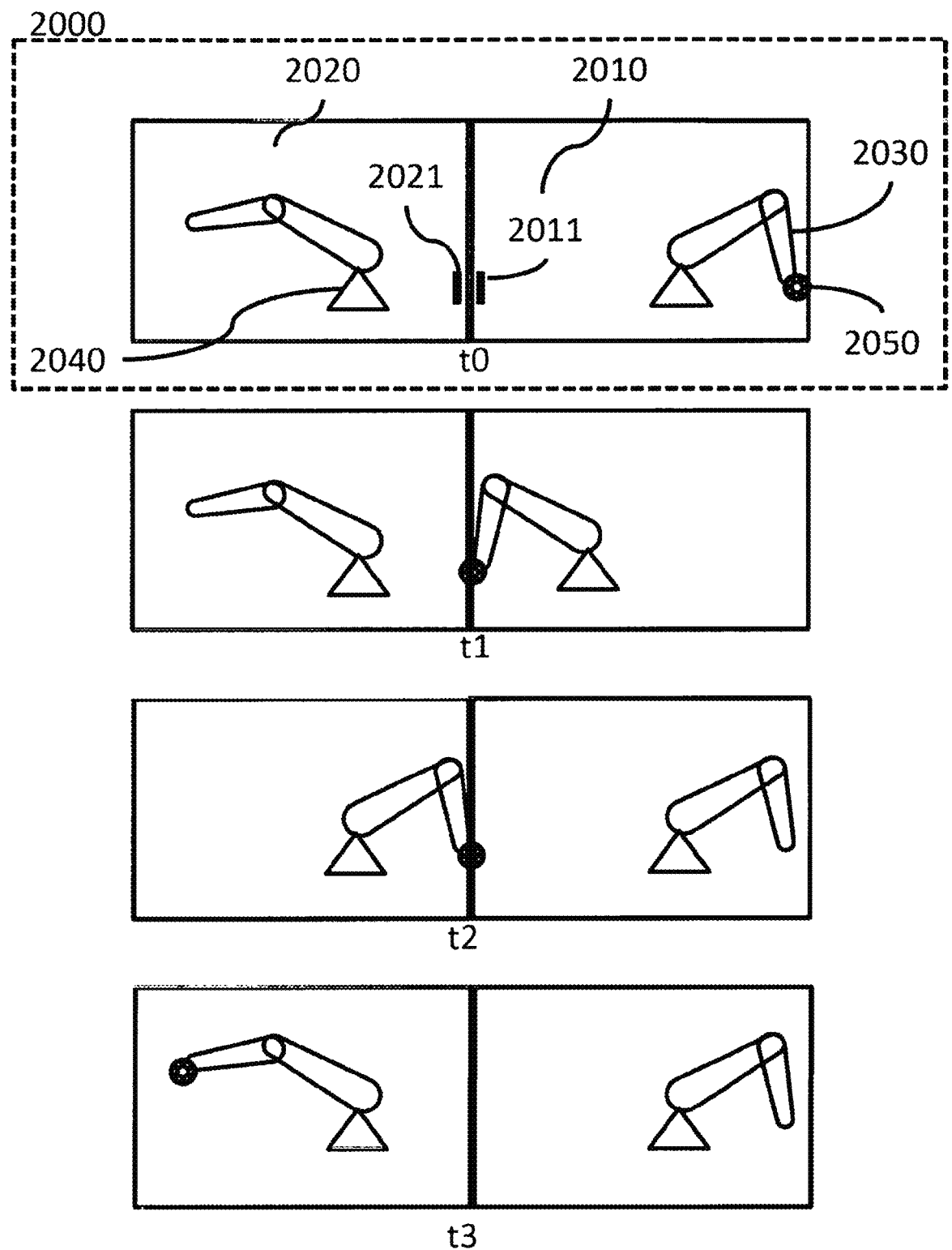
FIG. 20 illustrates an example of a time sequence of how bin load units may be redistributed between a first and a second automated Surface Mount Device (SMD) warehouse in an integrated automated Surface Mount Device (SMD) warehouse cluster.

FIG. 20 illustrates an example of a time sequence on how bin load units may be redistributed between a first and a second automated Surface Mount Device (SMD) warehouse in an integrated automated Surface Mount Device (SMD) warehouse cluster.

Referring to FIG. 20, a first Surface Mount Device (SMD) warehouse 2010 and a second Surface Mount Device (SMD) warehouse 2020 are configured to form an integrated automated Surface Mount Device (SMD) warehouse cluster 2000. The first Surface Mount Device (SMD) warehouse 2010 is configured with a first opening 2011 aligned with a second opening 2021 in the second Surface Mount Device (SMD) warehouse 2020, such that bin load units may be redistributed between the first 2010 and the second automated Surface Mount Device (SMD) warehouse 2020 via the first opening 2011 in the first automated Surface Mount Device (SMD) warehouse 2010 and the second opening 2021 in the second automated Surface Mount Device (SMD) warehouse 2020.

At time t0, a first actuator 2030 in the first automated Surface Mount Device (SMD) warehouse 2010 grips a bin or bin load unit 2050 stored in the first automated Surface Mount Device (SMD) warehouse.

At time t1, the first actuator 2030 transports said bin or bin load unit 2050 to said first opening 2011. Further, said first actuator 2030 releases the grip of the bin or bin load 2050 unit in a position where said bin or bin load unit protrudes into said second opening 2021 in said second Surface Mount Device (SMD) warehouse 2020. Alternatively, the first actuator 2030 in the first automated Surface Mount Device (SMD) warehouse releases the grip of the bin or bin load unit 2050 in the first opening 2011.

At time t2, a second actuator 2040 in the second automated Surface Mount Device (SMD) warehouse 2020 is configured to grip the bin load unit 2050 protruding into said second opening 2021 in said second Surface Mount Device (SMD) warehouse 2020. Alternatively, the second actuator 2040 in the second automated Surface Mount Device (SMD) warehouse 2020 is configured to grip the bin or bin load unit 2050 in the first opening 2011 such that bins or bin load units can be redistributed from said first Surface Mount Device (SMD) warehouse 2010 and said second Surface Mount Device (SMD) warehouse 2020.

Still referring to FIG. 20, at time t3 the second actuator 2040 in the second automated Surface Mount Device (SMD) warehouse 2020 releases the grip and stores the bin or bin load unit 2050 in the second automated Surface Mount Device (SMD) warehouse 2020.

Although not shown in FIG. 20, the method of automatically redistributing bin load units may further comprise: removing a first bin load unit from a first stored bin by a first actuator in said automated Surface Mount Device (SMD) warehouse; moving said first actuator to a position of a second stored bin within said automated Surface Mount Device (SMD) warehouse; removing a second bin load unit in a second stored bin by a second actuator in said automated Surface Mount Device (SMD) warehouse; and inserting said first bin load unit in said second stored bin by said first actuator. Bin load units loaded in the same bin may be redistributed within the same bin (e.g., to optimize the utilization of a bin).

In yet another aspect of the technology disclosed, said first stored bin and said second stored bin are the same bin.

Sometimes the redistribution of bin load units might involve shifting a first bin load unit to a bin already loaded with a second bin load unit and further shifting said second bin load unit to a third bin.

Although not shown in FIG. 20, the method of automatically redistributing bin load units may further comprises: moving said second actuator to a position of a third stored bin within said automated Surface Mount Device (SMD) warehouse; and inserting said second bin load unit in said third stored bin by said second actuator.

In one embodiment of the invention, the automated Surface Mount Device (SMD) warehouse comprises a dedicated redistribution area, where bin load units can be redistributed between at least two bins.

Although not shown in FIG. 20, the method of automatically redistributing bin load units may further comprise: retrieving and moving a first stored bin to a redistribution area within said automated Surface Mount Device (SMD) warehouse; and retrieving and moving a second stored bin to said redistribution area within said automated Surface Mount Device (SMD) warehouse.

In one embodiment of the invention, the automated Surface Mount Device (SMD) warehouse comprises a table attached to a first or second actuator, where bin load units can be redistributed between at least two bins. Typically, two bins would be placed on the table and bin load units would be redistributed from the first bin to the second bin and vice versa.

Although not shown in FIG. 20, the method of automatically redistributing bin load units may further comprise: retrieving and placing a first stored bin on a table attached to an actuator in said automated Surface Mount Device (SMD) warehouse; and moving said actuator to a position of a second stored bin within said automated Surface Mount Device (SMD) warehouse.

To allow more flexible scaling of the automated Surface Mount Device (SMD) warehouse, several SMD warehouse units can be coupled together, so that bins can be passed from a first SMD warehouse to a second SMD warehouse, and bin load units can be passed from a first SMD warehouse to a second SMD warehouse. Thus, redistribution of bin load units can be obtained between a plurality of automated Surface Mount Device (SMD) warehouses.

In yet another aspect of the technology disclosed, bin load units and/or bins in a plurality of automated Surface Mount Device (SMD) warehouses may be redistributed.

To further enhance the operation of actuators in the automated SMD warehouse, a bin can be configured with a predetermined gripping area for the actuator to grip. The bin can further be configured with guide rails for each compartment in the bin, wherein each compartment is adapted to receive a pallet.

In yet another aspect of the technology disclosed, said bin is adapted with a predetermined gi loping area for the actuator to grip and guide rails, wherein said guide rails are adapted to receive a pallet To further enhance the operation of actuators in the automated SMD warehouse, the pallet can be configured with a predetermined gripping area for the actuator to grip. The pallet can be further configured with guide rails for each compartment in the bin, wherein each compartment is adapted to receive a pallet protrusion disposed on an outer surface of said pallet to engage said guide rail of said bin. The retaining precision of bin load units loaded in the bin (e.g., when feeding components into a pick and place machine) can be improved by the protrusions.

In yet another aspect of the technology disclosed, said bin load units further comprise a pallet adapted to comprise a component tape reel, wherein said pallet is adapted with a predetermined gripping area for the actuator to grip and a protrusion disposed on an outer surface of said pallet to engage said guide rail of said bin.

In yet another aspect of the technology disclosed, said bins are adapted to comprise bin load units, wherein said bin load unit comprises at least a component tape reel.

In yet another aspect of the technology disclosed, redistributing may be performed during idle periods, wherein the idle periods are periods in which the automated Surface Mount Device (SMD) warehouse is not occupied with storing or retrieving bins or bin load units.

Yet another aspect of the technology disclosed provides an automated Surface Mount Device (SMD) warehouse system for improving and/or optimizing presentation of bin load units at a port. The system comprises: an actuator, such as a robot or robotic arm, adapted to retrieve or store bins, pallets or component tape reels at predetermined positions within the automated Surface Mount Device (SMD) warehouse based on control data received from a processor; a memory; and a processor. The processor is adapted to: obtain information related to upcoming SMT jobs; and store or retrieve bin load units at predetermined positions within said automated Surface Mount Device (SMD) warehouse by sending control data to said actuator.

The processor is further adapted to: automatically redistribute stored bin load units by sending control data to said actuator based on predetermined rules to optimize presentation of bin load units at a port of said automated Surface Mount Device (SMD) warehouse based on information relating to upcoming SMT jobs.

In yet another aspect of the technology disclosed, an automated Surface Mount Device (SMD) warehouse for redistributing bin load units in an automated Surface Mount Device (SMD) warehouse, where said automated SMD warehouse is configured to obtain information related to upcoming SMT jobs from an SMT database, comprises: a first actuator, such as a robot or robotic arm, configured to automatically redistribute stored bin load units in said automated Surface Mount Device (SMD) warehouse based on at least one of SMT job related information obtained from said SMT database and predetermined rules for improving and/or optimizing presentation of bin load units at a port of said automated Surface Mount Device (SMD) warehouse, wherein said SMT job related information is received or retrieved by a processor and stored to a memory comprised in said Surface Mount Device (SMD) warehouse.

In yet another aspect of the technology disclosed, the automated Surface Mount Device (SMD) warehouse, further comprises a second actuator, such as a robot or robotic arm, configured to automatically redistribute stored bin load units in said automated Surface Mount Device (SMD) warehouse based on at least one of said SMT job related information and said predetermined rules.

In yet another aspect of the technology disclosed, the automated Surface Mount Device (SMD) warehouse, further comprises a redistribution area within said automated Surface Mount Device (SMD) warehouse.

In yet another aspect of the technology disclosed, the automated Surface Mount Device (SMD) warehouse, further comprises a table attached to said first actuator or a second actuator in said automated Surface Mount Device (SMD) warehouse.

In yet another aspect of the technology disclosed, said first or second actuator is configured to receive control data based on at least one of said predetermined rules to improve and/or optimize presentation of bin load units at a port of said automated Surface Mount Device (SMD) warehouse and said information obtained from an SMT database.

In yet another aspect of the technology disclosed, said stored bin load units are comprised in individual stored pallets.

In yet another aspect of the technology disclosed, said stored bin load units are comprised in one or more stored bins.

Yet another aspect of the technology disclosed an automated Surface Mount Device (SMD) warehouse system for improving and/or optimizing presentation of bin load units at a port comprising: an actuator, such as a robot or robotic arm, configured to retrieve or store bins, pallets or component tape reels at predetermined positions within the automated Surface Mount Device (SMD) warehouse based on control data received from a processor; a memory; and a processor. The processor is adapted to: obtain information related to upcoming SMT jobs; and store or retrieve bin load units at predetermined positions within said automated Surface Mount Device (SMD) warehouse by sending control data to said actuator. The processor is further adapted to control the steps of: automatically redistributing stored bin load units by sending control data to said actuator based on at least one of predetermined rules to improve and/or optimize presentation of bin load units at a port of said automated Surface Mount Device (SMD) warehouse and information received or retrieved from an SMT database.

In yet another aspect of the technology disclosed, said processor in said automated Surface Mount Device (SMD) warehouse is further adapted to perform the method steps of described herein.

In yet another aspect of the technology disclosed, a computer program product is provided for improving and/or optimizing presentation of bin load units at a port comprising computer readable code configured to, when executed in a processor, perform any or all of the method steps described herein.

In yet another aspect of the technology disclosed, a non-transitory computer readable memory is provided on which is stored computer readable code configured to improve and/or optimize presentation of bin load units at a port and to, when executed in a processor, perform any or all of the method steps described herein.

Identifying a Bin in an SMT System

When an operator is returning a bin to the automated Surface Mount Device (SMD) warehouse, there is a need to determine the bin load units in the bin by scanning a bin ID and retrieving the associated bin load units ID, such as pallet ID, component tape reel ID and SMT feeder ID, from an SMT information database.

When an operator is retrieving a bin from the automated Surface Mount Device (SMD) warehouse, there is a need to associate a bin ID with the bin load units ID's, such as pallet ID, component tape reel ID and SMT feeder ID, by scanning a bin ID and storing the associated bin load units ID's, such as pallet ID, component tape reel ID and SMT feeder ID, to an SMT information database.

One or more aspect of the technology disclosed provides a method in an automated Surface Mount Device (SMD) warehouse configured to store bins at predetermined positions within said automated Surface Mount Device (SMD) warehouse, the method comprising: receiving a bin at a port of said automated Surface Mount Device (SMD) warehouse; and scanning an identity tag (e.g., in form of an electronic display) attached to said bin to obtain a bin ID.

In one or more aspect of the technology disclosed, the method further comprises: storing said bin at a position within said automated Surface Mount Device (SMD) warehouse.

In one or more aspect of the technology disclosed, the method further comprises: storing said position and said bin ID in a memory of said automated Surface Mount Device (SMD) warehouse.

One or more aspect of the technology disclosed describes a method in an automated Surface Mount Device (SMD) warehouse adapted to obtain information related to upcoming SMT jobs, to store bins at predetermined positions within said automated Surface Mount Device (SMD) warehouse, the method comprising: receiving a bin at a port of said automated Surface Mount Device (SMD) warehouse; scanning an identity tag attached to said bin to obtain a bin ID; storing said bin at a position within said automated Surface Mount Device (SMD) warehouse; and storing said position and said bin ID.

In yet another aspect of the technology disclosed, the method further comprises: presenting said retrieved bin at a port of said automated Surface Mount Device (SMD) warehouse.

In yet another aspect of the technology disclosed, said bins are adapted to comprise bin load units, wherein said bin load unit comprises at least a component tape reel.

In yet another aspect of the technology disclosed, storing said position and said bin ID further comprises storing said position and said bin ID represented as parameters, such as a table, in a memory of said automated Surface Mount Device (SMD) warehouse.

In yet another aspect of the technology disclosed, storing said position and said bin ID further comprises storing said position and said bin ID represented as parameters in an SMT information database via a communications network.

In one or more embodiments, a bin is configured with an electronic display such as alphanumerical display, with an integrated display controller, and a printed identity tag attached to said bin such that information relating to an SMT job is displayed and a bin ID can be obtained by scanning (e.g., optically scanning a barcode) the printed identity tag.

In one or more embodiments, a bin is configured with an electronic display such as an alphanumerical display with an integrated alphanumerical display controller, display data may comprise information about the reels carried by said bin and/or a bin ID, and said bin ID is presented as an optically scannable code such as a barcode, QR code or the like.

In one or more embodiments, an alphanumerical display functions as an identity tag of the bin. In one or more embodiments, the communications network ID of the electronic display, used to send data to and receive data from the electronic display controller, such as an electronic alphanumerical display, is identical to the bin ID.

In one or more embodiments, scanning comprises scanning an optically scannable code such as a barcode, QR code or the like, and the optically scannable code is presented on a printed label or an electronic display such as an electronic alphanumerical display.

In one example, the electronic display (e.g., an electronic alphanumerical display) is attached to a bin and displays an electronic barcode representing a unique bin ID of the bin and/or that the electronic display is further representing and showing SMT job related information to the operator (e.g., information about each of the individual bin load units, such as component tape reels) stored in one of the compartments of the bin.

Conventional electronic shop/shelf label (ESL) systems are configured based on an infrared (IR) scheme, low frequency band communication, or radio frequency (RF) band communication. Such conventional ESL systems may have a degraded accuracy when reading or updating information of a plurality of ESL tags based on an environment of the store, for example, an obstacle within the store, and may increase complexity and/or costs for facility infrastructure.

More specifically, to update ESL tag information within the store (e.g., to update details), conventional ESL systems may use between one reader (or antenna) to tens of readers (or antennas) based on a radio communication scheme or a frequency difference. Also, when conventional ESL systems employ an IR scheme, a relatively large number of readers may be required, thereby increasing a facility costs and an area where reception is impossible may occur depending on the store environment.

When the conventional ESL systems employ an RF scheme (e.g., at 2.4 GHz), reception may be impossible in certain areas depending on the store environment. In addition, due to a short battery lifespan, battery replacement costs may also be incurred.

At least one example embodiment provides an electronic shelf label (ESL) system using radio frequency identification (RFID) that may store, in an ESL tag attached to a shelf, SMT job information received from an ESL server, thereby readily updating the details included in the ESL tag/display, and an operation method of the ESL system.

At least one other example embodiment provides an ESL system using RFID that may obtain identification information of a bin load unit, such as a component tape or component tape reel positioned on a shelf, from a component tape recognition tag attached to the component tape, and provide the obtained identification information to an ESL server, thereby enabling a manager to readily plan and manage SMT-related jobs/actions involving the stored component tape (e.g., replenishment work, loading a bin with reels in the compartments of the bin, preparing for a SMT pick-and-place Job) and to effectively manage and provide instructions related to the component tape and decrease a cost used for managing human resources, and an operation method of the ESL system.

An ESL system using RFID, may include: an ESL tag to be attached to a shelf; and a radio tag reader to store, in the ESL tag, details received from an ESL server (e.g., originating from the SMT information database), in response to an SMT information update request from the ESL server (or SMT information database via a separate ESL system to the shelf tags/displays).

An operation method of an ESL system using RFID may include: receiving details regarding an SMT job from an ESL server together with an SMT job information update request from the ESL server; storing the received details in an ESL tag attached to a shelf; and displaying the received details.

An ESL tag according to one or more example embodiments may include, or be associated with, one or more pressure sensitive buttons to enable an operator to change the information displayed on the ESL tag and dynamically update SMT-job related information, which frequently varies.

The pressure sensitive buttons may be used to confirm actions, trigger actions, and/or modify the content of the display itself. Pressing of the pressure sensitive buttons may send an immediate trigger to an external system, or store information to be sent at a next scheduled communication event (e.g., a periodic communication event). The action may also be local and change between predefined information sets.

In more detail, for example, an operator may use the pressure sensitive buttons to confirm an action related to the display (e.g., component picked from a shelf location) without using a barcode scanner (having both hands free for picking the related object). In another example, the operator may use the pressure sensitive buttons to change the displayed content immediately, for example, from component name to component quantity or next action for the object.

According to one or more example embodiments, the pressure sensitive buttons may include one or several buttons, and may be mechanical, optical, electrical, touch screen, etc.

In response to pressing of the pressure sensitive buttons, the ESL tag may inform a controlling system (e.g., base station and related software that a button on the ESL tag has been pressed) save the button pressed information to be available at the next scheduled communication event, and/or directly trigger a change in the display on the ESL tag between predefined messages.

An ESL tag attached to a shelf may store details (e.g., SMT job related information) received from an ESL server, thereby readily updating the details included in and/or displayed on the ESL tag.

FIGS. 26a through 26f illustrate various ESL tags according to example embodiments. As shown in FIGS. 26a through 26f, the ESL tags may include pick and place information, such as one or more of slot, kit name, location, bin name, bin barcode, component name, etc. The pick and place information may be arranged as desired on the ESL tag.

According to one or more example embodiments, the ESL tags may be arranged on component shelves, bins, trolleys, bin load units, pallets, SMT pick and place machines, etc.

FIG. 27 illustrates a component shelf 2700 along with an ESL tag 2702 arranged thereon. As shown, the ESL tag 2702 may include a component name, component type, quantity of components on the shelf, a container name associated with the component, and a barcode. The information provided to the ESL tag 2702 by an operator may be sent to the ESL server wirelessly.

Figure 24:
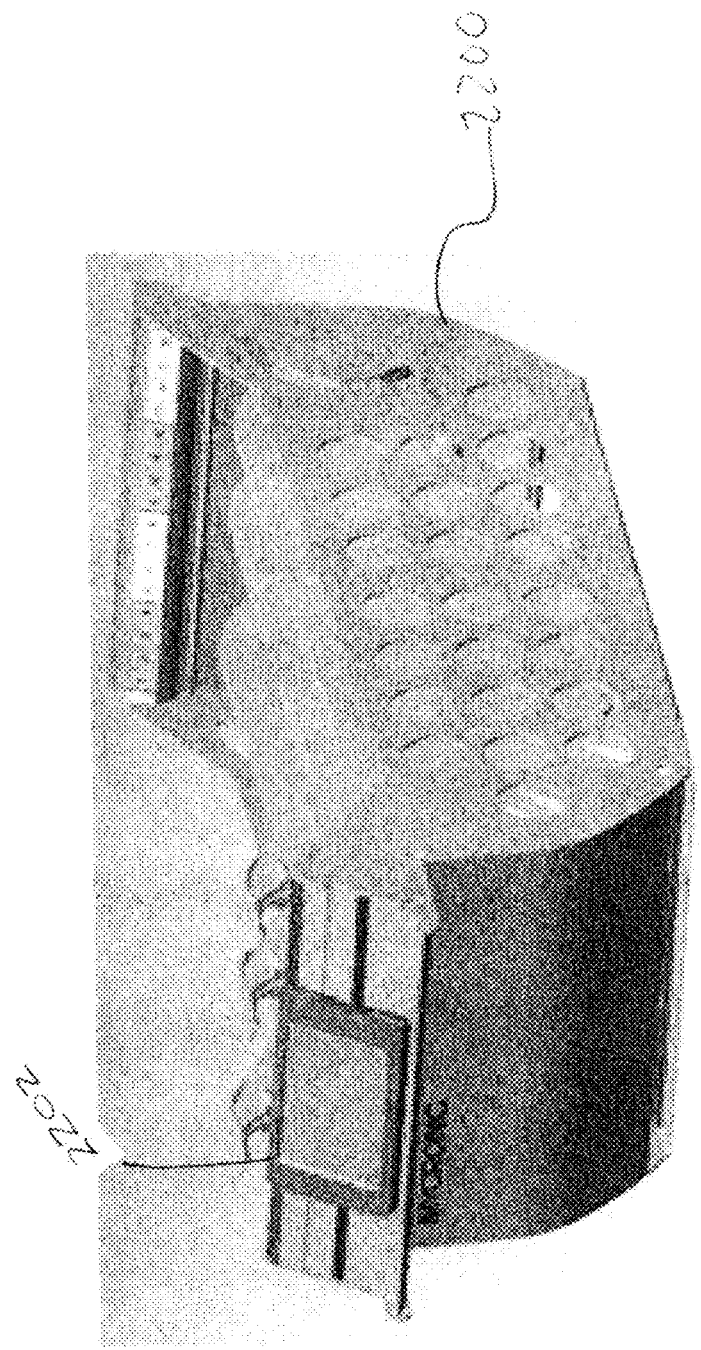
FIG. 24 is a perspective view of a bin having an ESL tag arranged thereon.

FIG. 24 is a perspective view of a bin 2200 having an ESL tag 2202 arranged thereon.

Figure 22:
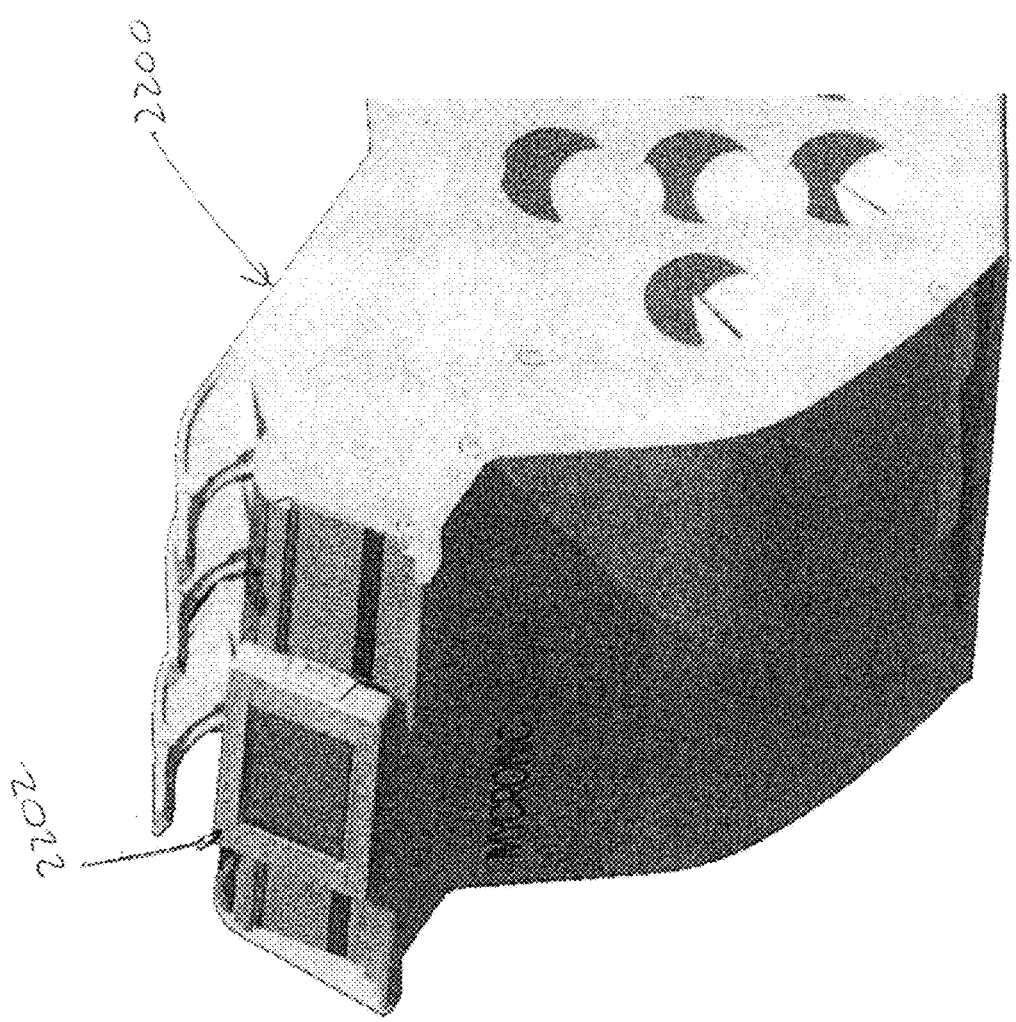
FIG. 22 is a perspective view of a portion of the bin shown in FIG. 24 with an ESL tag arranged thereon.

FIG. 22 is a perspective view of a portion of the bin 2200 shown in FIG. 24 with the ESL tag 2202 arranged thereon.

Figure 23:
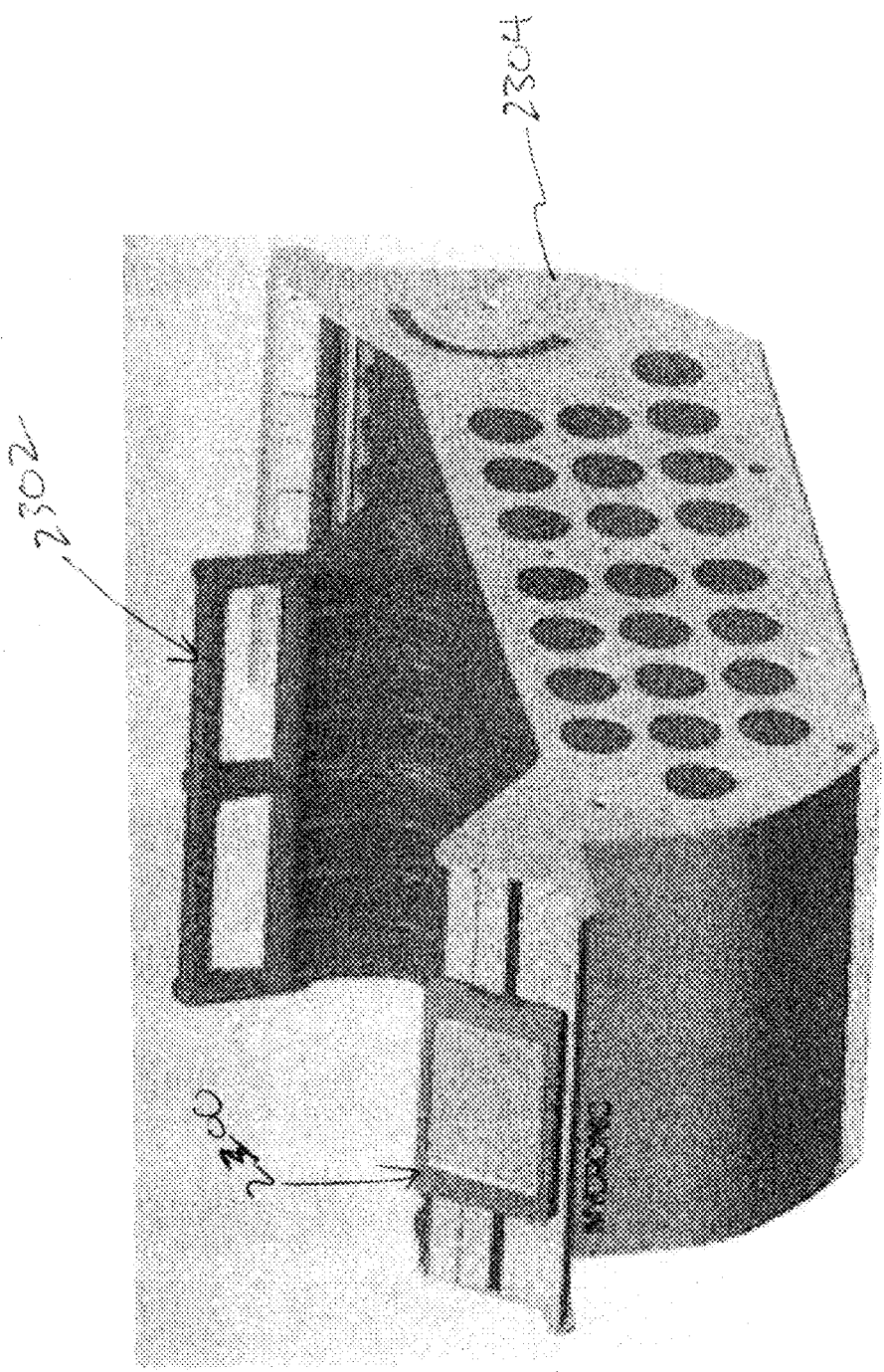
FIG. 23 is a perspective view of a bin including a magazine for holding component reels.

FIG. 23 is a perspective view of a bin 2304 including a magazine 2302 for holding component reels. As shown in FIG. 23, an ESL tag 2300 is arranged on the bin 2304.

Figure 25:
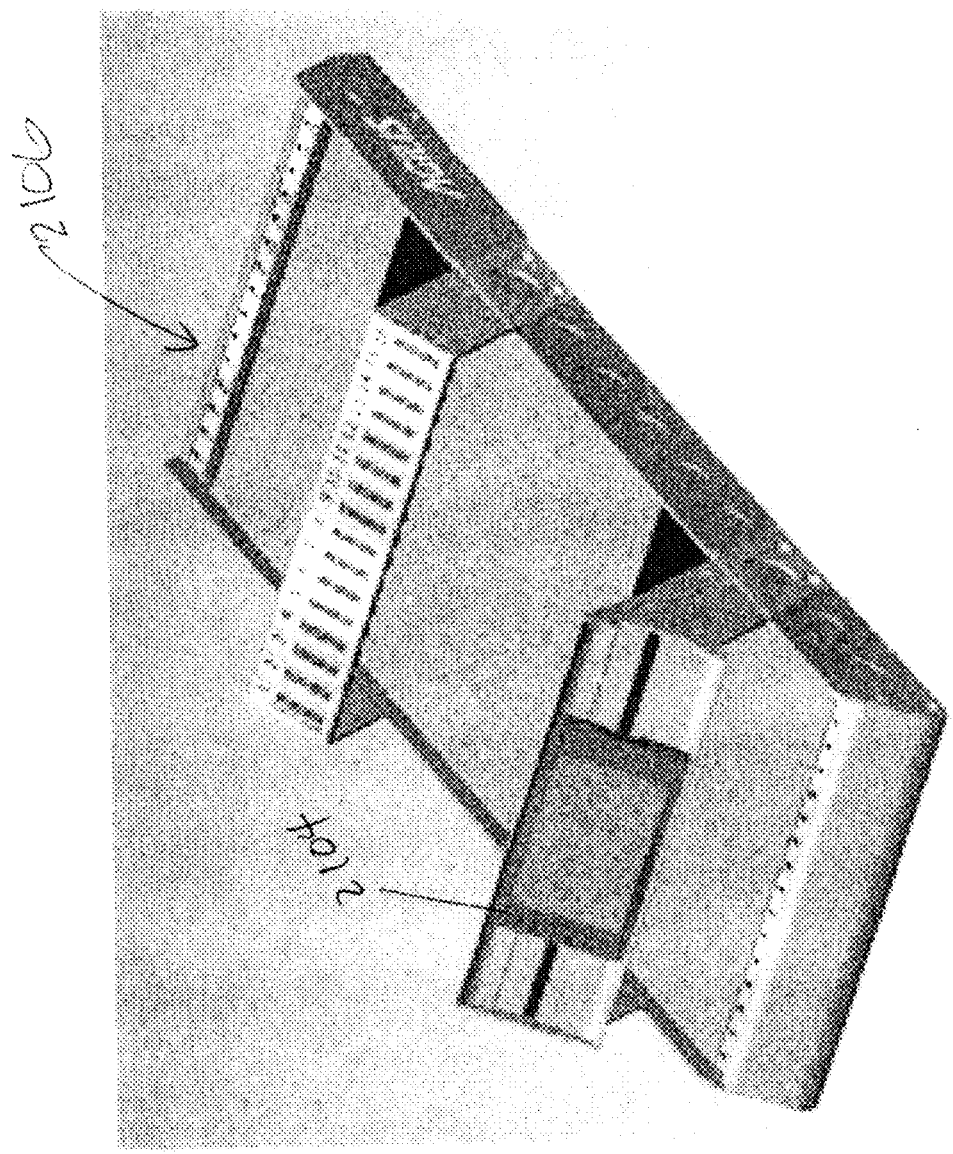
FIG. 25 is d perspective view of a stick magazine including an ESL tag arranged thereon.

FIG. 25 is a perspective view of a stick magazine 2106 including an ESL tag 2104 arranged thereon.

Figure 21:
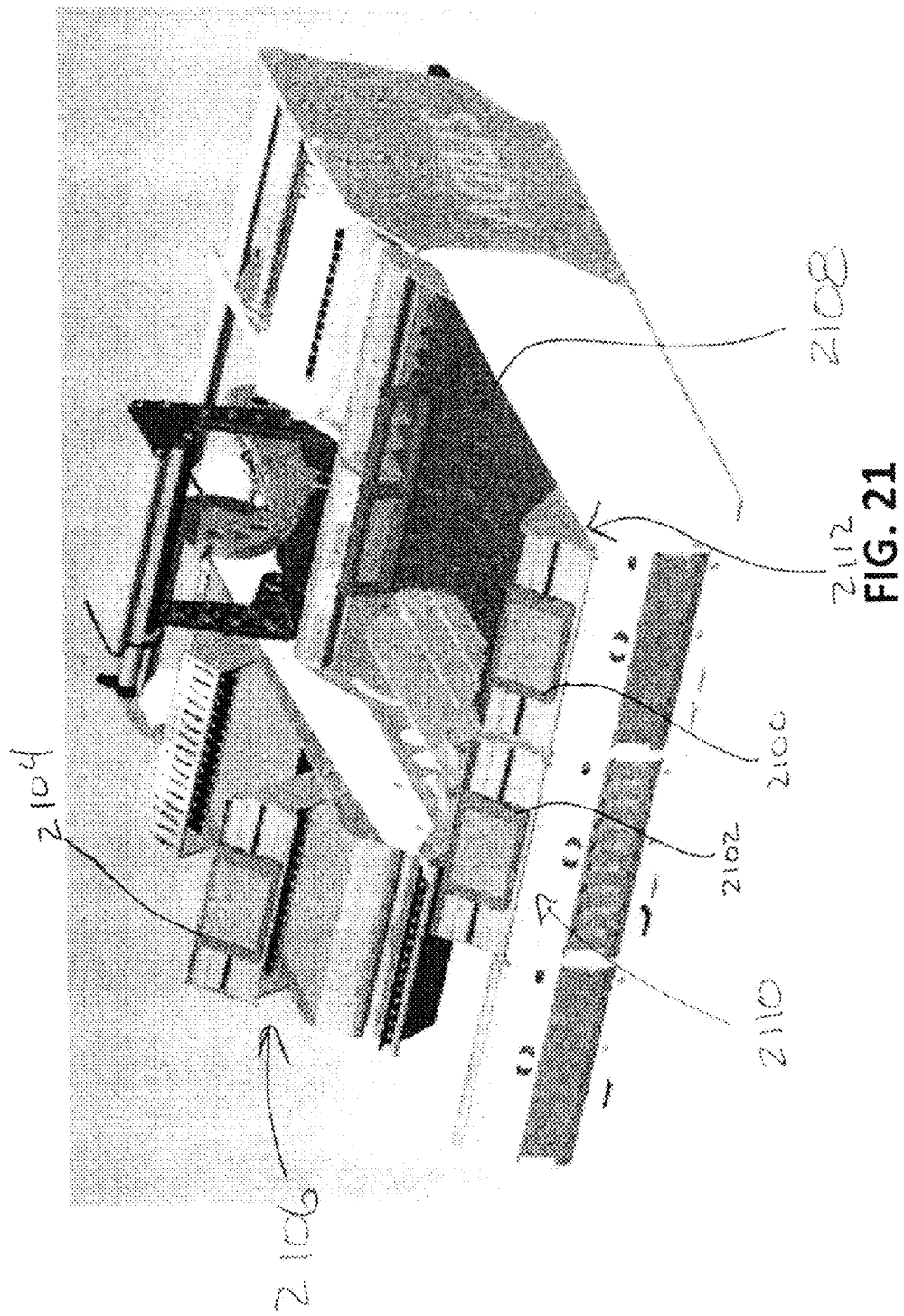
FIG. 21 illustrates a portion of a pick and place machine including two bins and a stick magazine.

FIG. 21 illustrates a portion of a pick and place machine including two bins 2110 and 2112 and a stick magazine 2106. As shown in FIG. 21, the bin 2110 has an ESL tag 2102 arranged thereon. The bin 2112 includes a magazine 2108, and has an ESL tag 2100 arranged thereon. The stick magazine 2106 has an ESL tag 2104 arranged thereon.

Figure 29:
FIG. 29 illustrates a dry storage unit including ESL tags for each location on each shelf of the unit.

FIG. 29 illustrates a dry storage unit including ESL tags for each location on each shelf of the unit. The ESL tag may display the shelf location content and be configured to change appearance as discussed herein.

According to one or more example embodiments, identification information of a component tape reel positioned on a shelf may be obtained from a component tape ESL tag attached to the shelf edge. The obtained identification information may be provided to an ESL server, thereby enabling the ESL system (IR-based or RFID-based) to readily perform inventory of component tape reels stored at storage positions/shelves, push down to the ESL tags (e.g., a display touch screen an electronic dynamic label) on the shelf edges associated with a stored component tape reel and (dynamically through event-triggered automatic pushed down instructions) change SMT job related information on the displays. Therefore, it is possible to effectively manage and trace component tape reels and thereby decrease costs for managing human resources.

E-label tags/electronic displays, according to one or more example embodiments, display shelf location content in form of SMT job related information similar to smart labels on shelves for easy component tape fetching. An IR-based or RFID-based Electronic Shop/Shelf Label (ESL) system may be used to provide (e.g., dynamically/automatically changing) the SMT job related information (from the SMT information database) on the displays (e.g., during a kitting process, a replenishment process, when loading a bin with component tape reels in preparation of a pick-and-place job).

The above ESL, where the SMT operator preparing SMT pick-and-place jobs have an input possibility on (or associated with) an external display unit, where the input mechanism may be one or several buttons (mechanical, optical) or a touch screen on the display itself, and where the internal action of the operator may be at least one of: direct sending a button pressed message to a controlling system (base station and related software, the SMT information database via an IR and/or RFID-based ESL system); saving the button pressed message to be available at the next scheduled communication event; and directly triggering a display content change (e.g., between predefined messages).

The e-labels may be configured to (dynamically/automatically) change their appearance to clearly indicate to the SMT job operator where to pick the needed components for an upcoming SMT pick-and-place job (e.g., based on pushed down instructions from the SMT information database using or via a separate ESL system or the operator's pushing of a button), the electronic displays will dynamically change from dark to bright, change its color, indicate in which order the component tapes (bin load units) shall optimally fetched by the operator from the shelves or stored in compartments of a bin (for storing component tape reels).

FIGS. 28a through 28d illustrate examples of four e-labels. As shown, the e-label in FIG. 28b is an example in which e-label has dynamically changed from bright to dark based on pushed down instructions from the SMT information database using or via a separate ESL system or the operator's pushing of a button.

The shelves for storing component tapes (e.g., component tape reels, or "bin load units" in form of packets comprising a reel with a component tape pre-threaded into a tape guide/SMT component feeder), where at least one electronic label/tag is attached to a shelf edge for each storage location on each shelf.

In certain aspects the invention, the technology disclosed allows for the use of at least one sensor/detector for detecting/indicating when/whether a component tape reel is fetched from (or stored at) the storage location on the shelf (by the operator or a robot) and send uplink information to the ESL system (to be forwarded to SMT information database system), or send it directly to the conventional SMT information database system.

This revolutionary Mycronic enhancement to the material handling process will significantly reduce the effort of bringing and keeping track of components (improved traceability) during kitting and replenishment process.

By using modern E-paper labels information about the various phases during materiel handling will be displayed just in front of the operator when he needs the information With the Smart e-labels it is possible to show operator what to do independently if the bin is in the machine or in the kitting area.

The e-labels can also be used to show what you have on your shelves and guide you collecting those components.

At least one other example embodiment provides a smart barcode scanner display configured to display SMT job related information (e.g., direct instructions to the operator) when scanning a barcode (e.g., on a component tape reel, a pallet for carrying a component tape reel or an electronic shelf label/display) during, for example, a kitting process, a replenishment process, when loading a bin with component tape reels in preparation of a pick-and-place job, etc.

FIG. 30a is a perspective view of a barcode scanner according to an example embodiment.

Referring to FIG. 30a, the barcode scanner 3000 includes a handle 3100, a trigger 3060, a scanner input device 3040, a display 3020, and input buttons 3080. The barcode scanner 3000 may also include a memory, a processor, and a wireless transceiver to communicate wirelessly with a ESL system.

The smart barcode scanner 3000 with the display 3020 may be used to display SMT job related information to the SMT operator in order to guide the operator on what to do with an object (e.g., a component tape reel) corresponding to the scanned barcode. This enhancement to the material handling process by the provision of guidance to the operator (e.g., sequentially provided and/or event-based triggered guidance SMT job related information) provides improved traceability and/or less error-prone kitting and replenishment processes.

An IR-based or RFID-based ESL system may be used for providing (e.g., dynamically/automatically changing) the SMT job related information from the SMT information database on the barcode scanner display 3020.

When preparing for upcoming SMT pick-and-place jobs, the SMT operator handling the barcode scanner 3000 with the display 3020 may also have an input possibility on (or associated with) a barcode or an external display unit, where the input mechanism may be the scanning of a barcode (e.g., a conventional barcode on a component tape reel or on (or associated with) an ESL display itself) by the scanner device 3040, and where the barcode scanning action of the operator may be sending data (e.g., through IR or RFID data) to a controller unit associated with the barcode or an external display unit. The controller unit may trigger: sending direct uplink SMT job related information to a controlling system (e.g., a base station and related software, the SMT information database via an IR and/or RFID-based ESL system); saving SMT job related information to be available at the next scheduled communication event; or directly triggering the display content on the barcode scanner display to change (e.g., between predefined messages).

The trigger 3060 may be used to activate the scanner device 3040 to perform a scanning operation. The buttons 3080 may be used to modify/update information on the display 3020, and transmit the updated information to the ESL system to update the ESL database.

The barcode scanner display 3020 may be configured to change its appearance to more clearly indicate to the SMT job operator where to pick the next component tape reel (or SMT packet) for an upcoming SMT pick-and-place job. In one example, the barcode scanner display 3020 may change its appearance in response to the scanning of a barcode by the operator or pushed down instructions from the SMT information database using or via a separate ESL system or the operator's pushing of a button. The barcode scanner display 3020 may automatically/dynamically change from dark to bright and/or change its color to indicate to the operator in which order the component tapes (bin load units) should be at least one of: loaded into a bin; fetched by the operator from storage shelves in a kitting or replenishment process; or stored in an automatic SMD component warehouse including a robot.

The ESLs discussed herein may be e-paper labels.

The barcode scanner display 3020 may show an operator what to do independently if the bin is in the machine or in the kitting area (e.g., during a replenishment process or kitting process). The barcode scanner display may also be used to directly show what the operator has on the shelves, and sequentially guide the operator in collecting the component tape reels.

One or more example embodiments may enhance the material handling process to reduce the effort of bringing and tracking components during kitting and replenishment processes (e.g., improved traceability and more efficient and less error prone SMT job related actions performed by the operator).

FIGS. 30*b* through 30*d* illustrate example displays output on the display of the barcode reader. In more detail, FIG. 30*b* illustrates example content displayed when scanning a carrier for loading into a pick and place machine. FIG. 30*c* illustrates example content displayed when scanning a feeder for loading. FIG. 30*d* illustrates example content when scanning an action barcode.

Creating the Intelligent Factory

Enhance Your Productivity

Certain aspects of the technology disclosed offer the richest software suite in the industry, with integrated applications covering the entire chain of a SMT assembly. This is accomplished by providing software tools that increase utilization, boost efficiency, improve the service level to your customers, and impact your bottom-line.

Master Complexity

In certain aspects of the technology disclosed, a software suite that is intuitive and easy to use is provided. The software suite is tailored for the most complex manufacturing environment. High part number count, a wide variety of boards, and an ever-changing production schedule are challenges our customers are overcoming daily.

Connectivity is Key

Information handling is the new bottleneck in SMT production. Therefore, it's vital that data generated in one step of the process immediately becomes available to all other assembly functions. By providing an integrated system for planning, kitting, production and storage, the technology disclosed can ensure not only leaner manufacturing, but also leaner information handling.

Rely on a Proven Solution

The software of the technology disclosed has a proven track record of unparalleled stability, data integrity and user friendliness. The proposed system of the technology disclosed is designed to support integration, multiple users and parallel processes, using open interfaces and state-of-the-art software technology.

Prepare Your Data Quickly and Correctly—Every Time

The technology disclosed may be used to convert all types of CAD and Bill-of-Materials information into ready-to-run pick & place programs within seconds. After being imported, the graphical rendering of the CAD image is checked for errors and can be edited as required.

Visual Documentation

The technology disclosed offers the fastest, easiest, and most comprehensive visual documentation system for electronic assembly and related processes. It also enables instant engineering change implementation across the entire document set.

Totally Off-Line

Library data and programs can be created for one or multiple pick-and-place machines, as well as other SMT equipment, totally off-line. Verified and up to date information can then be sent over the factory network in time for production start.

Efficient Handling of any Batch Size

The Technology Disclosed as a Planning Tool—Some Benefits

Example embodiments provide:
   Optimized sequences and changeover strategies for any group of jobs;
   Use of current kitting and part commonality to minimize feeder loading;
   Comprehensive kitting instructions—printed or paperless;
   Supports pre-loading of feeders while the line is running; and
   Maximizes overall production efficiency.

Optimize Productivity According to Your Goals

The technology disclosed, working as a planning tool, lets the operator easily perform job scheduling, feeder optimization and line balancing for the entire facility. The operator can prioritize minimal changeover time, maximize throughput, or a balance between the two and the planning tool quickly calculates and predicts the assembly time, kitting and changeover procedures.

Integrated Material Tracking

The planning tool of the technology disclosed can help to increase actual throughput by selecting the best changeover strategy based on part commonality and batch size. The planning tool may also be integrated with other software tools for generating display data on display units or electronic labels, for full visibility of material status in order to avoid running out of or missing components.

Paperless Guidance

After optimization, the planning tool of the technology disclosed generates a comprehensive set of kitting instructions that provide operators with simple, step-by-step tasks to keep production running efficiently. The operator can also send the result electronically to the SMD Warehouse or request information about stored or delivered component tape reels from the SMD Warehouse, for automatic component delivery and paperless guidance.

Management Data Tailored to the Operator's Needs

The planning tool of the technology disclosed is integrated with software reporting tools for easy performance tracking. The operator can generate customized reports on machine speed, production runs, error identification and utilization.

Using electronic tags or labels comprising electronic barcodes to track bins, trolleys and the components carried by, contained in or associated with, the bins, trolleys or containers, and display SMT job related information related to said bins, trolleys and associated components, the system of the technology disclosed reduces the risk of error and speeds up setup and changeover times. It keeps track of quantity, batch code, current location and floor life for each and every component.

Providing Display Information and Guidance to the SMT Operator

In certain aspects, the technology disclosed and related software tools are used to inform and give guidance to the operator by providing, for the operator to view, display data from the factory floor on displays or electronic labels during production, and integrate it with a factory-wide tracking system or export display data for further processing. The displays or electronic labels may be associated with and/or may be attached to a carrier (e.g., a bin, a movable trolley or a container adapted for carrying at least one plastic bag with components), a shelf for storing components or a table for performing replenishment work or kitting work.

In certain aspects of the technology disclosed, the display or electronic label is provided with an electronic barcode that can be scanned by the operator using a barcode reader in order to display information to the operator related to the preparation for an ongoing or upcoming pick-and-place job (e.g., replenishment work, kitting work or during loading of a component tape magazine or trolley, e.g. with feeders with pre-threaded component tape reels or bins carrying reels pre-threaded into tape guides/feeders).

In certain aspects of the technology disclosed, the displays or electronic labels are provided with at least one electronic barcode that can be scanned by the operator using a barcode reader in order to automatically (e.g., via a software tool and/or network of the SMT system) initiate an update of SMT job information in the SMT information database, where the updated SMT job information can subsequently be retrieved by the pick-and-place machine, the SMD warehouse or other units of the SMT system, retrieved by the action (e.g., scanning of a barcode, such as an electronic barcode) or other request of the operator or automatically pushed down (e.g., using software creating, such as a bitmap image, provided to the control unit of a separate communications network and system, such as an ESL system discussed above) that pushes down display data to the displays or electronic labels) to guide the operator in preparation of an ongoing or upcoming pick-and-place job (e.g., replenishment work, kitting work or during loading of a component tape magazine or trolley, e.g., with feeders with pre-threaded component tape reels or bins carrying reels pre-threaded into tape guides/feeders).

In certain aspects of the technology disclosed, the display or electronic label of the carrier, table or shelf is further is associated with or provided with an input device that can be activated or pushed by the operator in order to display information to the operator related to the preparation for an ongoing or upcoming pick-and-place job (e.g., replenishment work, kitting work or during loading of a component tape magazine or trolley, e.g., with feeders with pre-threaded component tape reels or bins carrying reels pre-threaded into tape guides/feeders).

In certain aspects of the technology disclosed, the display or electronic label of the carrier, table or shelf is provided with an input device that can be used, activated or pushed by the operator to provide input (e.g., event-based input) to the control unit of the display/electronic label in order for the control unit of the display/electronic label to provide display information to the operator related to the preparation for an ongoing or upcoming pick-and-place job (e.g., replenishment work, kitting work or during loading of a component tape magazine or trolley, e.g., with feeders with pre-threaded component tape reels or bins carrying reels pre-threaded into tape guides/feeders).

In certain aspects of the technology disclosed, the display or electronic label is provided with an input device that can be used, activated or pushed by the operator to provide input (e.g., event-based input) to the control unit of the display/electronic label in order for the control unit of the display/electronic label to automatically (e.g., via a software tool and/or network of the SMT system) initiate an update of SMT job information in the SMT information database, where the updated SMT job information can subsequently be automatically retrieved by the pick-and-place machine, the SMD warehouse or other units of the SMT system, retrieved by a request of the operator or automatically pushed down (e.g., via a software tool and control unit creating image data, e.g., bitmap image data, that is sent to the a separate communications network and system, e.g., ESL system that pushes down display data to the displays/electronic labels) to guide the operator in preparation of an ongoing or upcoming pick-and-place job (e.g., replenishment work, kitting work or during loading of a component tape magazine or trolley, e.g., with feeders with pre-threaded component tape reels or bins carrying reels pre-threaded into tape guides/feeders).

The invention claimed is:

1. A method for changing operator information in a Surface Mount Technology (SMT) system comprising an SMT information database and a SMT pick and place machine, the method comprising:
   providing a carrier, the carrier being a bin, basket, or trolley configured to carry a plurality of bin load units or component tape reels, wherein said carrier includes a display device, the display device configured to dynamically change information displayed by the display device;
   receiving, at the carrier via a network, input data related to said carrier and an ongoing and upcoming SMT job;
   displaying display data on said display device based on said received input data; and
   activating at least one input device to cause a change of the display data displayed on said display device, wherein
      the at least one input device is a pressure-sensitive button that is comprised in the carrier, or
      the at least one input device is part of the display device, and is further configured to respond to external pressure applied to a surface of the display device.

2. The method of claim 1, wherein said input data is retrieved and/or received at the display device from the network that also provides the SMT pick and place machine with information from the SMT information database.

3. The method of claim 1, wherein said input data is received at the display device via a radio-based or light-based communications network, the communications network being separate from the network providing the SMT pick and place machine with information from the SMT information database.

4. The method of claim 1, wherein said input data is related to the ongoing and upcoming SMT job and is triggered by an event related to said SMT job, and/or is retrieved from said SMT information database in response to a request sent by an operator, said input data being associated with a certain changeover process, replenishment work or kitting work.

5. The method of claim 1, wherein said carrier has a identity tag in a form of a barcode attached to a surface of the carrier.

6. The method of claim 1, wherein said carrier has an electronic identity tag in a form of an electronic barcode constituting at least a portion of the display data displayed on said display device.

7. The method of claim 6, wherein at least one of said electronic identity tag in the form of the electronic barcode and said display device is configured to be at least one of logically and electronically connected with each other.

8. The method of claim 6, wherein at least one of said electronic identity tag in the form of the electronic barcode and said display device is configured with means for enabling one-way or two-way wireless communication with at least one of a radio-based and/or light-based communications network.

9. The method of claim 1, wherein said display device is attached to a surface of the carrier.

10. The method of claim 1, wherein said input data is received at the display device via a communications network, which is separate from the system and network that is also providing the SMT pick and place machine with information from the SMT information database, and wherein said separate communications network is a radio-based or a light-based network.

11. The method of claim 1, wherein at least one of said receiving, said displaying, and said activating is performed when SMT production has started and simultaneously or concurrently with feeding of components from at least one bin load unit or component tape reel comprised in said carrier, to a pick-up position/area of said SMT pick and place machine.

12. The method of claim 1, wherein said activating the at least one input device triggers an automatic sending of uplink data from said display device to the SMT information database.

13. The method of claim 12, wherein said uplink data is based on said change of display data displayed on said display device.

14. The method of claim 1, wherein the activating the at least one input device further triggers an automatic sending of uplink data from said display device to said SMT information database via a same network that is also providing the SMT pick and place machine with information from the SMT information database.

15. The method of claim 1, wherein said display data presented on said display device comprises at least one of a selection of SMT job ID, a predetermined component feeder position in the SMT pick and place machine, a component type and a remaining number of components on a component tape reel comprised in said carrier.

16. The method of claim 1, wherein said received input data is retrieved or pushed down from said SMT information database, via the network associated with said SMT information database, to said display device.

17. The method of claim 16, wherein said received input data is retrieved or pushed down from a separate system to said display device via a radio-based or light-based network, the radio-based or light-based network being separate from the network providing the SMT pick and place machine with information from said SMT information database.

18. The method of claim 1, wherein said received input data is retrieved or pushed down from a separate communications network in response to input data received by a node of said communications network from certain software adapted to retrieve SMT job related information from said SMT information database.

* * * * *